(12) United States Patent
Mukherjee et al.

(10) Patent No.: US 8,418,007 B2
(45) Date of Patent: Apr. 9, 2013

(54) ON-CHIP COMPARISON AND RESPONSE COLLECTION TOOLS AND TECHNIQUES

(75) Inventors: Nilanjan Mukherjee, Wilsonville, OR (US); Janusz Rajski, West Linn, OR (US); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/053,188

(22) Filed: Mar. 21, 2011

(65) Prior Publication Data

US 2011/0231722 A1    Sep. 22, 2011

Related U.S. Application Data

(63) Continuation of application No. 11/709,079, filed on Feb. 20, 2007, now Pat. No. 7,913,137.

(60) Provisional application No. 60/774,431, filed on Feb. 17, 2006, provisional application No. 60/832,466, filed on Jul. 22, 2006, provisional application No. 60/853,055, filed on Oct. 20, 2006.

(51) Int. Cl.
*G01R 31/28*    (2006.01)

(52) U.S. Cl.
USPC ........... 714/729; 714/732; 714/735; 714/736; 714/742

(58) Field of Classification Search .................. None
See application file for complete search history.

(56) References Cited

U.S. PATENT DOCUMENTS

| | | | |
|---|---|---|---|
| 4,320,509 A | 3/1982 | Davidson | |
| 4,503,537 A | 3/1985 | McAnney | |
| 4,513,418 A * | 4/1985 | Bardell et al. | 714/726 |
| 4,687,988 A | 8/1987 | Eichelberger et al. | |
| 4,754,215 A | 6/1988 | Kawai | |
| 4,801,870 A | 1/1989 | Eichelberger et al. | |
| 5,072,178 A | 12/1991 | Matsumoto | |

(Continued)

FOREIGN PATENT DOCUMENTS

| | | |
|---|---|---|
| EP | 0 438 322 | 7/1991 |
| EP | 0 549 949 | 3/1998 |

(Continued)

OTHER PUBLICATIONS

Aitken et al., "A Diagnosis Method Using Pseudo-Random Vectors Without Intermediate Signatures," *Proc. ICCAD*, pp. 574-577 (1989).

(Continued)

*Primary Examiner* — Guerrier Merant
(74) *Attorney, Agent, or Firm* — Klarquist Sparkman, LLP

(57) ABSTRACT

Disclosed herein are exemplary embodiments of a so-called "X-press" test response compactor. Certain embodiments of the disclosed compactor comprise an overdrive section and scan chain selection logic. Certain embodiments of the disclosed technology offer compaction ratios on the order of 1000x. Exemplary embodiments of the disclosed compactor can maintain about the same coverage and about the same diagnostic resolution as that of conventional scan-based test scenarios. Some embodiments of a scan chain selection scheme can significantly reduce or entirely eliminate unknown states occurring in test responses that enter the compactor. Also disclosed herein are embodiments of on-chip comparator circuits and methods for generating control circuitry for masking selection circuits.

12 Claims, 33 Drawing Sheets

U.S. PATENT DOCUMENTS

| | | | |
|---|---|---|---|
| 5,173,906 | A | 12/1992 | Dreibelbis et al. |
| 5,301,199 | A | 4/1994 | Ikenaga et al. |
| 5,369,648 | A | 11/1994 | Nelson |
| 5,574,733 | A | 11/1996 | Kim |
| 5,612,963 | A | 3/1997 | Koenemann et al. |
| 5,631,913 | A | 5/1997 | Maeda |
| 5,642,362 | A | 6/1997 | Savir |
| 5,680,543 | A | 10/1997 | Bhawmik |
| 5,694,402 | A | 12/1997 | Butler et al. |
| 5,790,562 | A | 8/1998 | Murray et al. |
| 5,831,992 | A | 11/1998 | Wu |
| 5,968,194 | A | 10/1999 | Wu et al. |
| 5,991,898 | A | 11/1999 | Rajski et al. |
| 5,991,909 | A | 11/1999 | Rajski et al. |
| 6,041,429 | A | 3/2000 | Koenemann |
| 6,052,245 | A | 4/2000 | Sugawara et al. |
| 6,256,759 | B1 | 7/2001 | Bhawmik et al. |
| 6,272,653 | B1 | 8/2001 | Amstutz |
| 6,286,119 | B1 | 9/2001 | Wu et al. |
| 6,308,290 | B1 | 10/2001 | Forlenza et al. |
| 6,327,687 | B1 | 12/2001 | Rajski et al. |
| 6,353,842 | B1 | 3/2002 | Rajski et al. |
| 6,421,794 | B1* | 7/2002 | Chen et al. .................. 714/42 |
| 6,463,560 | B1 | 10/2002 | Bhawmik et al. |
| 6,467,058 | B1 | 10/2002 | Chakradhar et al. |
| 6,510,398 | B1 | 1/2003 | Kundu et al. |
| 6,539,409 | B2 | 3/2003 | Rajski et al. |
| 6,543,020 | B2 | 4/2003 | Rajski et al. |
| 6,557,129 | B1 | 4/2003 | Rajski et al. |
| 6,590,929 | B1 | 7/2003 | Williams |
| 6,611,933 | B1 | 8/2003 | Koenemann et al. |
| 6,671,839 | B1* | 12/2003 | Cote et al. .................. 714/726 |
| 6,684,358 | B1 | 1/2004 | Rajski et al. |
| 6,708,192 | B2 | 3/2004 | Rajski et al. |
| 6,745,359 | B2 | 6/2004 | Nadeau-Dostie |
| 6,763,488 | B2 | 7/2004 | Whetsel |
| 6,829,740 | B2* | 12/2004 | Rajski et al. .................. 714/729 |
| 6,874,109 | B1 | 3/2005 | Rajski et al. |
| 7,058,869 | B2 | 6/2006 | Abdel-Hafez et al. |
| 7,093,175 | B2 | 8/2006 | Rajski et al. |
| 7,111,209 | B2 | 9/2006 | Rajski et al. |
| 7,185,253 | B2 | 2/2007 | Mitra et al. |
| 7,260,591 | B2 | 8/2007 | Rajski et al. |
| 7,263,641 | B2 | 8/2007 | Rajski et al. |
| 7,302,624 | B2 | 11/2007 | Rajski et al. |
| 7,370,254 | B2 | 5/2008 | Rajski et al. |
| 7,404,126 | B2* | 7/2008 | Jain et al. .................. 714/726 |
| 7,478,296 | B2 | 1/2009 | Rajski et al. |
| 7,500,163 | B2 | 3/2009 | Rajski et al. |
| 7,506,232 | B2 | 3/2009 | Rajski et al. |
| 7,509,546 | B2 | 3/2009 | Rajski et al. |
| 7,523,372 | B2 | 4/2009 | Rajski et al. |
| 7,805,649 | B2 | 9/2010 | Rajski et al. |
| 7,818,644 | B2 | 10/2010 | Rajski et al. |
| 7,913,137 | B2 | 3/2011 | Mukherjee et al. |
| 2002/0112199 | A1 | 8/2002 | Whetsel |
| 2002/0124217 | A1 | 9/2002 | Hiraide et al. |
| 2003/0009715 | A1* | 1/2003 | Ricchetti et al. ............ 714/727 |
| 2003/0115521 | A1* | 6/2003 | Rajski et al. ............... 714/724 |
| 2003/0115525 | A1* | 6/2003 | Hill et al. .................. 714/726 |
| 2003/0120988 | A1 | 6/2003 | Rajski et al. |
| 2003/0131298 | A1 | 7/2003 | Rajski et al. |
| 2003/0188269 | A1* | 10/2003 | Mitra et al. ................ 716/2 |
| 2004/0107395 | A1* | 6/2004 | Volkerink et al. ........... 714/732 |
| 2004/0128599 | A1* | 7/2004 | Rajski et al. ............... 714/726 |
| 2004/0172431 | A1 | 9/2004 | Rajski et al. |
| 2004/0225939 | A1* | 11/2004 | Adams et al. ............... 714/733 |
| 2004/0230884 | A1* | 11/2004 | Rajski et al. ............... 714/742 |
| 2005/0015688 | A1 | 1/2005 | Rajski et al. |
| 2005/0097419 | A1 | 5/2005 | Rajski et al. |
| 2005/0222816 | A1* | 10/2005 | Cheng et al. ............... 702/185 |
| 2005/0240850 | A1* | 10/2005 | Ohwada et al. ............ 714/738 |
| 2005/0268194 | A1 | 12/2005 | Wang et al. |
| 2006/0041812 | A1 | 2/2006 | Rajski et al. |
| 2006/0041814 | A1 | 2/2006 | Rajski et al. |
| 2006/0095818 | A1* | 5/2006 | Bratt et al. .................. 714/726 |
| 2006/0156122 | A1 | 7/2006 | Wang et al. |
| 2006/0156128 | A1* | 7/2006 | Grinchuk et al. ............ 714/732 |
| 2006/0282732 | A1* | 12/2006 | Kiryu .................. 714/738 |
| 2007/0220383 | A1* | 9/2007 | Kiryu .................. 714/726 |
| 2007/0234150 | A1 | 10/2007 | Jain et al. |
| 2007/0234157 | A1 | 10/2007 | Rajski et al. |
| 2007/0234163 | A1 | 10/2007 | Mukherjee et al. |
| 2007/0234169 | A1 | 10/2007 | Rajski et al. |
| 2007/0283204 | A1 | 12/2007 | Swaminathan |

FOREIGN PATENT DOCUMENTS

| | | |
|---|---|---|
| JP | 63-286780 | 11/1988 |
| JP | 01-239486 | 9/1989 |
| JP | 03-2579 | 1/1991 |
| JP | 03-012573 | 1/1991 |
| JP | 05-011975 | 1/1993 |
| JP | 05-215816 | 8/1993 |
| JP | 05-249197 | 9/1993 |
| JP | 07-174822 | 7/1995 |
| JP | 07-198791 | 8/1995 |
| JP | 08-015382 | 1/1996 |
| JP | 11-030646 | 2/1999 |
| JP | 11-264860 | 9/1999 |
| WO | WO 91/10182 | 7/1991 |
| WO | WO 01/38889 | 5/2001 |
| WO | WO 01/39254 | 5/2001 |
| WO | WO 2004/072660 | 2/2004 |
| WO | WO 2007/098167 | 8/2007 |

OTHER PUBLICATIONS

Aldrich et al., "Improving Test Quality and Reducing Escapes," *Fabless Forum Magazine*, vol. 10, No. 1, 2 pp. (2003).

Bardell et al., "Test Response Compression Techniques," in *Built-In Test for VLSI Pseudorandom Techniques*, Chapter 4, pp. 89-108 (1987).

Barnhart et al., "Extending OPMISR beyond 10x Scan Test Efficiency," *IEEE Design and Test*, vol. 19, No. 5, pp. 65-73 (Sep. 2002).

Barnhart et al., "OPMISR: The Foundation for Compressed ATPG Vectors," *Proc. ITC*, pp. 748-757 (Oct. 2001).

Bartenstein et al., "Diagnosing Combinational Logic Designs Using the Single Location At-a-Time (SLAT) Paradigm," *Proc. ITC*, pp. 287-296 (2001).

Bayraktaroglu et al., "Deterministic Partitioning Techniques for Fault Diagnosis in Scan-Based BIST," *Proc. ITC*, pp. 273-282 (2000).

Bayraktaroglu et al., "Diagnosis for Scan Based BIST: Reaching Deep into the Signatures," *Proc. Design Automation and Test in Europe*, pp. 102-109 (2001).

Bayraktaroglu et al., "Test Volume and Application Time Reduction Through Scan Chain Concealment," *Proc. of the 38th Conference on Design Automation*, pp. 151-155 (Jun. 2001).

Benowitz et al., "An Advanced Fault Isolation System for Digital Logic," IEEE Trans. on Computers, vol. C-24, No. 5, pp. 489-497 (May 1975).

Benware et al., "Impact of Multiple-Detect Test Patterns on Product Quality," *Proc. ITC*, pp. 1031-1040 (Sep. 2003).

Bhattacharya et al., "Synthesis of Single-Output Space Compactors for Scan-Based Sequential Circuits," *IEEE Trans. on Computer-Aided Design of Integrated Circuits and Systems*, vol. 21, No. 10, pp. 1171-1179 (Oct. 2002).

Bhattacharya et al., "Zero-Aliasing Space Compression using a Single Periodic Output and its Application to Testing of Embedded Cores," VLSI Design, 6 pp. (Jan. 2000).

Chakrabarty et al., "Optimal space compaction of test responses," *Proc. ITC*, pp. 834-843 (1995).

Chakrabarty et al., "Optimal Zero-Aliasing Space Compaction of Test Responses," *IEEE Trans. on Computers*, vol. 47, No. 11, pp. 1171-1187 (Nov. 1998).

Chakrabarty et al., "Test response compaction using multiplexed parity trees," *IEEE Transactions CAD of Integrated Circuits and Systems*, vol. CAD-15, No. 11, pp. 1399-1408 (1996).

Chakrabarty, "Zero-Aliasing Space Compaction Using Linear Compactors With Bounded Overhead," *IEEE Transactions on CAD of Integrated Circuits and Systems*, vol. 17, No. 5, pp. 452-457 (May 1998).

Chan et al., "A Study of Faulty Signature for Diagnostics," *Proc. ISCAS*, pp. 2701-2704 (1990).

Chan et al., "A Study of Faulty Signatures Using a Matrix Formulation," *Proc. ITC*, pp. 553-561 (1990).

Cheng et al., "Compactor Independent Direct Diagnosis," *Proc. ATS*, pp. 15-17 (2004).

Chickermane et al., "Channel Masking Synthesis for Efficient On-Chip Test Compression," *Proc. ITC*, pp. 452-461 (2004).

Clouqueur et al., "Design and Analysis of Multiple-Weight Linear Compactors of Responses Containing Unknown Values," *Proc. ITC*, pp. 1099-1108 (Nov. 2005).

Damarla et al., "Multiple Error Detection and Identification via Signature Analysis," *Journal of Electronic Testing: Theory and Applications*, vol. 7, No. 3, pp. 193-207 (1995).

Das et al., "Data Compression in Space Under Generalized Mergeability Based on Concepts of Cover Table and Frequency Ordering," *IEEE Trans. on Instrumentation and Measurement*, vol. 51, No. 1, pp. 150-172 (Feb. 2001).

Das et al., "Fault Tolerance in Systems Design in VLSI Using Data Compression Under Constraints of Failure Probabilities," *IEEE Trans. on Instrumentation and Measurement*, vol. 51, No. 6, pp. 1725-1747 (Dec. 2001).

Edirisooriya et al., "Diagnosis of Scan Path Failures," *Proc. VLSI Test Symp.*, pp. 250-255 (1995).

Frohwerk, "Signature analysis: a new digital field services method," *Hewlett-Packard Journal*, pp. 2-8 (May 1977).

Ghosh-Dastidar et al., "A Rapid and Scalable Diagnosis Scheme for BIST Environments with a Large Number of Scan Chains," *Proc. VLSI Test Symp.*, pp. 79-85 (2000).

Ghosh-Dastidar et al., "Fault Diagnosis in Scan-Based BIST Using Both Time and Space Information," *Proc. ITC*, pp. 95-102 (Sep. 1999).

Guo et al., "A Technique for Fault Diagnosis of Defects in Scan Chains," *Proc. ITC*, pp. 268-277 (2001).

Han et al., "Test Resource Partitioning Based on Efficient Response Compaction for Test Time and Tester Channels Reduction," *Proc. ATS*, pp. 440-445 (Nov. 2003).

Hayes, "Check sum test methods," *Proc. FTCS*, pp. 114-120 (1976).

Hetherington et al., "Logic BIST for Large Industrial Designs: Real Issues and Case Studies," *Proc. ITC*, pp. 358-367 (1999).

Hsu et al., "A Case Study on the Implementation of the Illinois Scan Architecture," *Proc. ITC*, pp. 538-547 (2001).

International Search Report, dated Mar. 6, 2008; International Application No. PCT/US07/04422 filed Feb. 19, 2007.

Ishida et al., "COMPACT: A hybrid method for compressing test data," *Proc. VLSI Test Symposium*, pp. 62-69 (1998).

Ivanov et al., "Programmable BIST space compactors," *IEEE Transactions on Computers*, vol. C-45, No. 12, pp. 1393-1404 (1996).

Jas et al., "Scan vector compression/decompression using statistical coding," *Proc. VLSI Test Symposium*, pp. 114-120 (1999).

Jone et al., "Space compression method for built-in self testing of VLSI circuits," *Int. Journal of Computer Aided VLSI Design*, vol. 3, pp. 309-322 (1991).

Karpovsky et al., "Board-Level Diagnosis by Signature Analysis," *Proc. ITC*, pp. 47-53 (1988).

Karpovsky et al., "Design of Self-Diagnostic Boards by Multiple Signature Analysis," *IEEE Trans. on Computers*, vol. 42, No. 9, pp. 1035-1044 (Sep. 1993).

Koenemann et al., "A SmartBIST Variant with Guaranteed Encoding," *Proc. ATS*, pp. 325-330 (2001).

Koenemann, c/o IBM Corp., B56/901, "LFSR-Coded Test Patterns for Scan Designs," *Proc. European Test Conference*, pp. 237-242 (1991).

Konemann et al., "Built-In Logic Block Observation Techniques," *IEEE Test Conference*, 6 pp. (1979).

Kundu, "On Diagnosis of Faults in a Scan-Chain," *Proc. VLSI Test Symp.*, pp. 303-308 (1993).

Leininger et al., "Diagnosis of Scan-Chains by Use of a Configurable Signature Register and Error-Correcting Codes," *Proc. of the Design, Automation and Test in Europe Conf. and Exhibition*, 6 pp. (Feb. 2004).

Li et al., "Space compression methods with output data modification," *IEEE Trans. CAD if Integrated Circuits and Systems*, vol. CAD-6, No. 2, pp. 290-294 (1987).

Liu et al., "Identification of Error-Capturing Scan Cells in Scan-BIST with Applications to System-on-Chip," *IEEE Trans. on Computer-Aided Design*, vol. 23, No. 10, pp. 1447-1459 (Oct. 2004).

Mano, "Decoders and Multiplexers," in *Computer System Architecture*, Chapter 2, pp. 50-54 (1982).

McAnney et al., "There is Information in Faulty Signatures," *Proc. ITC*, pp. 630-636 (1987).

Mitra et al., "X-Compact: An Efficient Response Compaction Technique," *IEEE Trans on Computer-Aided Design*, vol. 23, No. 4, pp. 421-432 (Mar. 2004).

Mitra et al., "X-Compact: An Efficient Response Compaction Technique for Test Cost Reduction," *Proc. ITC*, pp. 311-320 (Oct. 2002).

Mitra et al., "X-Tolerant Signature Analysis," *Proc. ITC*, pp. 432-441 (Oct. 2004).

Morosov et al., "Design of Parameterizable Error Propagating Space Compactors for Response Observation," *Proc. VLSI Test Symp.*, pp. 48-53 (2001).

Mrugalski et al., "Convolutional Compaction-Driven Diagnosis of Scan Failures," *Proc. ETS*, pp. 176-181 (May 2005).

Mrugalski et al., "Fault Diagnosis in Designs with Convolutional Compactors," *Proc. ITC*, pp. 498-507 (Oct. 2004).

Mrugalski et al., "Test Response Compactor with Programmable Selector," *Proc. of the 43rd Annual Conf. on Design Automation*, Session 61, pp. 1089-1094 (Jul. 2006).

Narayanan et al., "An Efficient Scheme to Diagnose Scan Chains," *Proc. ITC*, pp. 704-713 (1997).

Naruse et al., "On-chip Compression of Output Responses with Unknown Values Using LFSR Reseeding," *Proc. ITC*, pp. 1060-1068 (Sep. 2003).

Notice of Allowance dated Jan. 27, 2010, from U.S. Appl. No. 11/709,071.

Office action dated Apr. 28, 2009, from U.S. Appl. No. 11/709,071.

Office action dated Aug. 31, 2009, from U.S. Appl. No. 11/708,717.

Office action dated Oct. 21, 2009, from U.S. Appl. No. 11/708,717.

Office action dated Oct. 9, 2009, from U.S. Appl. No. 11/709,079.

Patel et al., "Application to Saluja-Karpovsky Compactors to Test Responses with Many Unknowns," *Proc. VLSI Test Symp.*, pp. 107-112 (Apr. 2003).

Poehl et al., "On-Chip Evaluation, Compensation, and Storage of Scan Diagnosis Data," *Proc. ETS*, pp. 239-246 (May 2006).

Pomeranz et al., "On Output Response Compression in the Presence of Unknown Output Values," *Proc. DAC*, pp. 255-258 (Jun. 2002).

Pouya et al., "Synthesis of zero-aliasing elementary-tree space compactors," *Proc. VLSI Test Symp.*, pp. 70-77 (1998).

Rajski et al., "Accumulator-based compaction of test responses," *IEEE Trans. on Computers*, vol. C-42, No. 6, pp. 643-650 (1993).

Rajski et al., Chapter 3, "Test Response Compaction," and Chapter 4, "Fault Diagnosis," in *Arithmetic Built-In Self-Test for Embedded Systems*, pp. 87-133 (1998).

Rajski et al., "Convolutional Compaction of Test Responses," *Proc. ITC*, pp. 745-754 (Sep. 2003).

Rajski et al., "Diagnosis of Scan Cells in BIST Environment," *IEEE Trans. on Computers*, vol. 48, No. 7, pp. 724-731 (Jul. 1999).

Rajski et al., "Embedded Deterministic Test," *IEEE Trans. CAD*, vol. 23, pp. 776-792 (May 2004).

Rajski et al., "Embedded Deterministic Test for Low Cost Manufacturing Test," *Proc. ITC*, pp. 301-310 (Oct. 2002).

Rajski et al., "Modular Compactor of Test Responses," *Proc. VTS*, pp. 242-251 (Apr. 2006).

Rajski et al., "Synthesis of X-tolerant Convolutional Compactors," *Proc. VLSI Test Symposium*, pp. 114-119 (May 2005).

Rajski et al., "Test Data Decompression for Multiple Scan Designs with Boundary Scan," *IEEE Trans. on Computers*, vol. 47, No. 11, pp. 1188-1200 (Nov. 1998).

Rajski et al., "Test responses compaction in accumulators with rotate carry adders," *IEEE Trans. CAD of Integrated Circuits and Systems*, vol. CAD-12, No. 4, pp. 531-539 (1993).

Rajski et al., "X-Press Compactor for 1000x Reduction of Test Data," *Proc. ITC*, Paper 18.1 (Oct. 2006).

Reddy et al., "A Data compression technique for built-in self-test," *IEEE Trans. on Computer*, vol. C-37, pp. 1151-1156 (1988).

Saluja et al., "Testing Computer Hardware through Data Compression in Space and Time," *Proc. ITC*, pp. 83-88 (1983).

Savir et al., "Identification of Failing Tests with Cycling Registers," *Proc. ITC*, pp. 322-328 (1988).

Saxena et al., "Accumulator compression testing," *IEEE Trans. on Computers*, vol. C-35, No. 4, pp. 317-321 (1986).

Saxena et al., "Analysis of checksums, extended-precision checksums, and cyclic redundancy," *IEEE Trans. on Computers*, vol. C-39, No. 7, pp. 969-975, 1990.

Saxena et al., "Extended precision checksums," *Proc. FTCS*, pp. 142-147 (1987).

Serra et al., "The analysis of one-dimensional linear cellular automata and their aliasing properties," *IEEE Trans. CAD of Integrated Circuits and Systems*, vol. CAD-9, No. 7, pp. 767-778 (1990).

Seuring et al., "Space Compaction of Test Responses for IP Cores Using Orthogonal Transmission Functions," *Proc. VLSI Test Symp.*, pp. 213-219 (2000).

Sharma et al., "X-Filter: Filtering Unknowns From Compacted Test Responses," *Proc. ITC*, paper 42.1, pp. 1090-1098 (Nov. 2005).

Smith, "Measures of the effectiveness of fault signature analysis," *IEEE Trans. on Computers*, vol. C-29, No. 6, pp. 510-514 (1980).

Sogomonyan et al., "Early Error Detection in Systems-in-Chip for Fault-Tolerance and At-Speed Debugging," *Proc. VLSI Test Symp.*, pp. 184-189 (2001).

Stroud et al., "Improving the Efficiency of Error Identification via Signature Analysis," *Proc. VLSI Test Symp.*, pp. 244-249 (1995).

Tang et al., "On Efficient X-handling Using a Selective Compaction Scheme to Achieve High Test Response Compaction Ratios," *IEEE Int. Conf. VLSI Design*, pp. 59-64 (Jan. 2005).

Tang et al., "X-Masking During Logic BIST and Its Impact on Defect Coverage," *Proc. ITC*, pp. 442-451 (Oct. 2004).

Tekumalla, "On Reducing Aliasing Effects and Improving Diagnosis of Logic BIST Failures," *Proc. ITC*, pp. 737-744 (Sep. 2003).

Volkerink et al., "Response Compaction with Any Number of Unknowns Using a New LFSR Architecture," *Proc. of the 42nd Annual Conf. on Design Automation*, pp. 117-122 (Jun. 2005).

Waicukauski et al., "Diagnosis of BIST Failures by PPSFT Simulation," *Proc. ITC*, pp. 480-484 (1987).

Waicukauski et al., "Failure Diagnosis of Structured VLSI," *IEEE Design and Test of Computers*, pp. 49-60 (Aug. 1989).

Wang, "BIST Using Pseudorandom Test Vectors and Signature Analysis," *IEEE Custom Integrated Circuits Conference*, pp. 1611-1618 (1998).

Wang et al., "On Compacting Test Responses Data Containing Unknown Values," *Proc. ICCAD*, pp. 855-862 (Nov. 2003).

Wohl et al., "Analysis and Design of Optimal Combinational Compactors," *IEEE VLSI Test Symp.*, pp. 101-106 (Apr. 2003).

Wohl et al., "Design of Compactors for Signature-Analyzers in Built-In Self-Test," *Proc. ITC*, pp. 54-63 (2001).

Wohl et al., "Efficient Compression and Application of Deterministic Patterns in a Logic BIST Architecture," *40th Design Automation Conf.*, pp. 566-575 (2003).

Wohl et al., "X-tolerant Compression and Application of Scan-ATPG Patterns in a BIST Architecture," *Proc. ITC*, pp. 727-736 (Sep. 2003).

Written Opinion of the International Searching Authority, dated Mar. 6, 2008; International Application No. PCT/US 07/04422 filed Feb. 19, 2007 (see WO 07/98167).

Wu et al., "Scan-Based BIST Fault Diagnosis," *IEEE Trans. CAD of Integrated Circuits and Systems*, vol. 18, No. 2, pp. 203-211 (Feb. 1999).

Yamaguchi et al., "An efficient method for compressing test data," *Proc. ITC*, pp. 191-199 (1997).

Zou et al., "On Methods to Improve Location Based Logic Diagnosis," *Proc. VLSI Design*, pp. 181-187 (Jan. 2006).

First Office Action dated Mar. 16, 2011, from Chinese Patent Application No. 200780010367.X, 16 pp.

Notification of Reasons for Refusal dated Oct. 13, 2011, for Japanese Patent Application No. 2008-555415 (English translation), 2 pp.

\* cited by examiner

FIG. 14

| Circuit | C1 | r | TPC | % | C(x) | TPC | % | C(x) | TPC | % | C(x) | TPC | % | C(x) |
|---|---|---|---|---|---|---|---|---|---|---|---|---|---|---|
| | | | | 13 | | | 16 | | | 24 | | | 32 | |
| Scan | 160 × 283 | 1 | 2664 | 25.13 | 122.3 | 2554 | 19.96 | 126.2 | 2425 | 13.90 | 129.5 | 2385 | 12.02 | 125.3 |
| Faults | 1147164 | 2 | 2844 | 33.58 | 216.6 | 2738 | 28.60 | 230.7 | 2607 | 22.45 | 220.8 | 2616 | 22.87 | 210.0 |
| Errors | 1499807 | 3 | 3066 | 44.01 | 285.0 | 3025 | 42.09 | 281.2 | 2885 | 35.51 | 275.4 | 2893 | 35.89 | 257.6 |
| Tests | 2129 | 4 | 2935 | 57.86 | 374.3 | 2899 | 36.17 | 366.4 | 2798 | 31.42 | 348.9 | 2795 | 31.28 | 323.1 |
| Depth | 2 | 6 | 3169 | 48.85 | 459.7 | 3135 | 47.25 | 444.6 | 2970 | 39.50 | 420.6 | 2957 | 38.89 | 382.8 |
| FC (%) | 98.83 | 8 | 3112 | 46.17 | 549.5 | 3025 | 42.09 | 536.7 | 2905 | 36.45 | 492.5 | 2855 | 34.10 | 448.0 |
| X's (%) | 0.04 | 12 | 3217 | 51.10 | 616.8 | 3167 | 48.76 | 590.1 | 2991 | 40.49 | 540.9 | 2948 | 38.47 | 483.9 |
| | | 16 | 3233 | 51.86 | 638.7 | 3179 | 49.32 | 610.3 | 2996 | 40.72 | 557.8 | 2959 | 38.99 | 496.0 |
| Circuit | C2 | 1 | 2100 | 60.55 | 97.3 | 2103 | 60.78 | 96.7 | 2026 | 54.89 | 98.9 | 1981 | 51.45 | 99.7 |
| Scan | 160 × 541 | 2 | 2168 | 65.75 | 182.9 | 2147 | 64.14 | 182.8 | 2080 | 59.02 | 183.6 | 2012 | 53.82 | 184.5 |
| Faults | 2558380 | 3 | 2209 | 68.73 | 261.3 | 2208 | 68.81 | 257.2 | 2163 | 65.37 | 252.5 | 2125 | 62.46 | 247.4 |
| Errors | 2432380 | 4 | 2253 | 72.25 | 330.1 | 2238 | 71.10 | 325.9 | 2163 | 65.37 | 320.6 | 2144 | 63.91 | 308.4 |
| Tests | 1305 | 6 | 2315 | 76.99 | 448.0 | 2303 | 76.07 | 438.3 | 2249 | 71.94 | 418.9 | 2202 | 68.35 | 401.2 |
| Depth | 2 | 8 | 2405 | 83.87 | 531.2 | 2347 | 79.43 | 526.5 | 2339 | 78.82 | 485.9 | 2273 | 73.78 | 463.8 |
| FC (%) | 98.91 | 12 | 2403 | 83.72 | 672.3 | 2407 | 84.02 | 643.6 | 2336 | 78.59 | 597.8 | 2298 | 75.69 | 553.1 |
| X's (%) | 0.44 | 16 | 2521 | 92.74 | 715.0 | 2519 | 92.58 | 682.9 | 2374 | 81.50 | 646.1 | 2351 | 79.74 | 588.6 |
| Circuit | C3 | 1 | 7451 | 1.02 | 154.1 | 7443 | 0.91 | 153.3 | 7412 | 0.49 | 151.5 | 7404 | 0.38 | 149.2 |
| Scan | 160 × 470 | 2 | 7529 | 2.07 | 294.7 | 7506 | 1.76 | 292.1 | 7455 | 1.07 | 285.1 | 7440 | 0.87 | 277.1 |
| Faults | 1836691 | 3 | 7546 | 2.30 | 425.7 | 7513 | 1.86 | 420.3 | 7469 | 1.26 | 404.3 | 7454 | 1.06 | 388.2 |
| Errors | 1925441 | 4 | 7567 | 2.59 | 545.0 | 7542 | 2.25 | 534.9 | 7492 | 1.57 | 508.8 | 7485 | 1.48 | 482.8 |
| Tests | 7376 | 6 | 7573 | 2.67 | 752.5 | 7548 | 2.33 | 732.4 | 7507 | 1.78 | 682.0 | 7486 | 1.49 | 636.9 |
| Depth | 2 | 8 | 7545 | 2.30 | 921.7 | 7553 | 2.40 | 887.5 | 7521 | 1.97 | 812.7 | 7499 | 1.67 | 749.0 |
| FC (%) | 96.53 | 12 | 7549 | 2.35 | 1145. | 7538 | 2.20 | 1095. | 7496 | 1.63 | 984.4 | 7485 | 1.48 | 891.0 |
| X's (%) | 0.003 | 16 | 7550 | 2.36 | 1258. | 7547 | 2.32 | 1197. | 7499 | 1.67 | 1066. | 7486 | 1.49 | 957.6 |

Mask register size = m

|  |  | $v$ | TPC | % | C(x) | TPC | % | C(x) | TPC | % | C(x) | TPC | % | C(x) |
|---|---|---|---|---|---|---|---|---|---|---|---|---|---|---|
|  |  |  |  |  |  | Mask register size - $m$ |  |  |  |  |  |  |  |  |
|  |  |  | 12 |  |  | 16 |  |  | 24 |  |  | 32 |  |  |
| Circuit | C4 | 1 | 2642 | 24.27 | 99.6 | 2566 | 20.70 | 101.5 | 2467 | 16.04 | 103.3 | 2420 | 13.83 | 103.1 |
| Scan | 128 × 353 | 2 | 2861 | 34.57 | 176.3 | 2804 | 31.89 | 176.1 | 2709 | 27.42 | 175.1 | 2646 | 24.46 | 172.5 |
| Faults | 1147100 | 3 | 2945 | 38.52 | 245.9 | 2927 | 37.68 | 240.1 | 2769 | 30.24 | 239.8 | 2741 | 28.93 | 229.6 |
| Errors | 1458974 | 4 | 2947 | 38.62 | 312.7 | 2905 | 36.64 | 305.5 | 2763 | 29.96 | 299.1 | 2716 | 27.75 | 284.7 |
| Tests | 2126 | 6 | 3113 | 46.43 | 401.6 | 3062 | 44.03 | 388.1 | 2902 | 36.50 | 372.6 | 2866 | 34.81 | 346.1 |
| Depth | 2 | 8 | 3118 | 46.66 | 480.4 | 3040 | 42.99 | 463.8 | 2898 | 36.31 | 435.4 | 2842 | 33.68 | 401.8 |
| FC (%) | 98.83 | 12 | 3166 | 48.92 | 568.0 | 3083 | 45.01 | 542.7 | 2927 | 37.68 | 501.7 | 2868 | 34.90 | 456.2 |
| X's (%) | 0.04 | 16 | 3122 | 46.85 | 614.6 | 3077 | 44.73 | 577.5 | 2885 | 35.70 | 536.5 | 2850 | 34.05 | 481.1 |
| Circuit | C5 | 1 | 1023 | 13.04 | 99.3 | 992 | 9.61 | 99.7 | 948 | 4.75 | 99.2 | 930 | 2.76 | 96.4 |
| Scan | 122 × 138 | 2 | 1034 | 14.25 | 177.5 | 996 | 10.06 | 175.8 | 950 | 4.97 | 168.8 | 932 | 2.98 | 158.7 |
| Faults | 279175 | 3 | 1037 | 14.59 | 240.9 | 997 | 10.17 | 235.1 | 942 | 4.09 | 221.6 | 932 | 2.98 | 201.8 |
| Errors | 305343 | 4 | 1043 | 15.25 | 289.3 | 987 | 9.06 | 283.3 | 944 | 4.31 | 258.2 | 934 | 3.20 | 231.4 |
| Tests | 905 | 6 | 1051 | 16.13 | 353.6 | 989 | 9.28 | 342.4 | 948 | 4.75 | 303.3 | 933 | 3.09 | 267.7 |
| Depth | 2 | 8 | 1038 | 14.70 | 394.1 | 973 | 7.51 | 379.6 | 943 | 4.20 | 328.1 | 928 | 2.54 | 286.8 |
| FC (%) | 98.85 | 12 | 1054 | 16.46 | 407.2 | 979 | 8.18 | 394.0 | 941 | 3.98 | 340.9 | 928 | 2.54 | 295.8 |
| X's (%) | 1.41 | 16 | 1053 | 16.35 | 395.1 | 990 | 9.39 | 378.8 | 942 | 4.09 | 332.6 | 929 | 2.65 | 289.6 |
| Circuit | C6 | 1 | 9458 | 0.23 | 78.8 | 9452 | 0.17 | 78.5 | 9451 | 0.16 | 77.9 | 9453 | 0.18 | 77.2 |
| Scan | 80 × 940 | 2 | 9494 | 0.61 | 154.4 | 9490 | 0.57 | 153.2 | 9480 | 0.47 | 150.9 | 9483 | 0.50 | 148.5 |
| Faults | 1836531 | 3 | 9505 | 0.73 | 227.4 | 9507 | 0.75 | 224.6 | 9506 | 0.74 | 219.3 | 9504 | 0.72 | 214.3 |
| Errors | 1681671 | 4 | 9528 | 0.97 | 296.7 | 9523 | 0.92 | 292.2 | 9519 | 0.88 | 283.4 | 9514 | 0.83 | 275.2 |
| Tests | 9436 | 6 | 9538 | 1.08 | 425.9 | 9536 | 1.06 | 416.5 | 9529 | 0.99 | 398.9 | 9532 | 1.02 | 382.4 |
| Depth | 1 | 8 | 9547 | 1.18 | 540.6 | 9543 | 1.13 | 525.5 | 9536 | 1.06 | 497.7 | 9544 | 1.14 | 472.1 |
| FC (%) | 96.51 | 12 | 9550 | 1.21 | 726.1 | 9549 | 1.20 | 698.8 | 9539 | 1.09 | 650.6 | 9535 | 1.05 | 608.3 |
| X's (%) | 0.001 | 16 | 9543 | 1.13 | 857.1 | 9543 | 1.13 | 819.4 | 9539 | 1.09 | 753.3 | 9537 | 1.07 | 697.0 |
| Circuit | C7 | 1 | 664 | 87.57 | 25.8 | 637 | 79.94 | 26.6 | 597 | 68.64 | 27.9 | 597 | 68.64 | 27.3 |
| Scan | 50 × 373 | 2 | 686 | 93.79 | 48.0 | 656 | 85.31 | 49.2 | 609 | 72.03 | 51.0 | 598 | 68.93 | 50.1 |
| Faults | 471362 | 3 | 707 | 99.72 | 67.0 | 674 | 90.40 | 68.3 | 627 | 77.12 | 69.6 | 626 | 76.84 | 66.2 |
| Errors | 276906 | 4 | 720 | 103.4 | 83.9 | 687 | 94.07 | 84.9 | 640 | 80.79 | 85.1 | 629 | 77.68 | 81.2 |
| Tests | 354 | 6 | 729 | 105.9 | 113.0 | 728 | 105.6 | 107.7 | 673 | 90.11 | 106.4 | 661 | 86.72 | 99.7 |
| Depth | 2 | 8 | 746 | 110.7 | 132.8 | 744 | 110.2 | 125.6 | 688 | 94.35 | 122.0 | 665 | 87.85 | 114.6 |
| FC (%) | 98.93 | 12 | 725 | 104.8 | 165.3 | 610 | 72.32 | 183.2 | 678 | 91.53 | 145.2 | 675 | 90.68 | 130.3 |
| X's (%) | 2.62 | 16 | 680 | 92.09 | 189.2 | 762 | 115.3 | 156.6 | 679 | 91.81 | 153.6 | 611 | 72.60 | 151.5 |
| Circuit | C8 | 1 | 1855 | 43.35 | 55.2 | 1880 | 45.29 | 54.3 | 1833 | 41.65 | 55.2 | 1789 | 38.25 | 56.2 |
| Scan | 80 × 1081 | 2 | 1906 | 47.30 | 105.9 | 1894 | 46.37 | 105.8 | 1855 | 43.35 | 106.5 | 1836 | 41.89 | 106.1 |
| Faults | 2558220 | 3 | 1939 | 49.85 | 153.8 | 1937 | 49.69 | 152.3 | 1927 | 48.92 | 149.9 | 1903 | 47.45 | 148.4 |
| Errors | 2381823 | 4 | 1983 | 53.25 | 197.1 | 1956 | 51.16 | 197.1 | 1965 | 51.85 | 190.9 | 1939 | 49.85 | 188.4 |
| Tests | 1294 | 6 | 2048 | 58.27 | 275.7 | 2034 | 57.19 | 272.1 | 2011 | 55.41 | 264.8 | 2010 | 55.33 | 255.2 |
| Depth | 2 | 8 | 2146 | 65.84 | 336.2 | 2130 | 64.61 | 330.2 | 2092 | 61.67 | 320.1 | 2096 | 61.98 | 304.9 |
| FC (%) | 98.91 | 12 | 2199 | 69.94 | 446.1 | 2195 | 69.63 | 431.7 | 2121 | 63.91 | 418.5 | 2129 | 64.53 | 392.0 |
| X's (%) | 0.44 | 16 | 2351 | 81.68 | 498.1 | 2288 | 76.82 | 491.2 | 2209 | 70.71 | 471.0 | 2208 | 70.63 | 438.6 |
| Circuit | C9 | 1 | 13982 | 15.21 | 90.0 | 14002 | 15.38 | 89.7 | 13839 | 14.03 | 90.6 | 13895 | 14.49 | 90.0 |
| Scan | 104 × 3488 | 2 | 14393 | 18.60 | 174.0 | 14405 | 18.70 | 173.4 | 14336 | 18.13 | 173.5 | 14415 | 18.78 | 171.8 |
| Faults | 8533366 | 3 | 14786 | 21.84 | 252.8 | 14787 | 21.84 | 251.9 | 14842 | 22.30 | 249.3 | 14831 | 22.21 | 247.8 |
| Errors | 5840757 | 4 | 14964 | 23.30 | 331.3 | 15085 | 24.30 | 327.2 | 14960 | 23.27 | 327.0 | 14956 | 23.24 | 324.2 |
| Tests | 12136 | 6 | 15201 | 25.26 | 483.2 | 15348 | 26.47 | 475.4 | 15268 | 25.81 | 471.7 | 15284 | 25.94 | 465.1 |
| Depth | 1 | 8 | 15580 | 28.38 | 619.7 | 15578 | 28.36 | 614.3 | 15467 | 27.45 | 608.2 | 15604 | 28.58 | 592.7 |
| FC (%) | 94.44 | 12 | 15609 | 28.62 | 896.3 | 15856 | 30.65 | 871.3 | 15920 | 31.18 | 846.5 | 16137 | 32.97 | 815.2 |
| X's (%) | 0.83 | 16 | 15613 | 28.65 | 1146.2 | 15987 | 31.73 | 1101.5 | 16214 | 33.60 | 1052.4 | 16292 | 34.25 | 1015.8 |

FIG. 15

ON-CHIP COMPARISON AND RESPONSE COLLECTION TOOLS AND TECHNIQUES

CROSS REFERENCE TO RELATED APPLICATIONS

This application is a continuation of U.S. patent application Ser. No. 11/709,079, titled "On-Chip Comparison and Response Collection Tools and Techniques," filed Feb. 20, 2007 now U.S. Pat. No. 7,913,137, which claims the benefit of U.S. Provisional Patent Application No. 60/774,431, titled "Multi-Stage Test Response Compactors," filed Feb. 17, 2006; U.S. Provisional Patent Application No. 60/832,466, titled "Multi-Stage Test Response Compactors," filed Jul. 22, 2006; and U.S. Provisional Patent Application No. 60/853,055, titled "Multi-Stage Test Response Compactors," filed Oct. 20, 2006. Each of these applications is incorporated herein by reference.

FIELD

The disclosed technologies relate to testing electronic circuits, particularly using compression hardware.

BACKGROUND

Testing an electronic circuit for possible defects can result in a significant amount of test data (for example, test responses), particularly if the circuit is large and/or complicated. Test responses stored by scan chains in a circuit can be compressed, for example, to allow for the responses to be analyzed using fewer test resources (for example, test pins), possibly by automated testing equipment (ATE) external to the circuit. Test response compactors exist, but the compaction ratio of these devices is often limited to the ratio of the number of scan chains to the number of compactor outputs. Accordingly, there is a need for compaction schemes providing potentially higher compaction ratios.

SUMMARY

Disclosed herein are exemplary embodiments of improved test response compactors, methods of operation and designing such compactors, and systems using such compactors. Certain embodiments of such compactors are referred to herein as "X-(su)press" or "X-press" test response compactors and comprise a first compaction section, a second compaction section (sometimes referred to herein as the "overdrive section"), and scan chain selection logic for selectively masking one or more test response bits. Certain embodiments of the disclosed technology offer compaction ratios on the order of 1000x. Exemplary embodiments of the disclosed compactor can maintain about the same coverage and about the same diagnostic resolution as that of conventional scan-based test scenarios. Some embodiments of a scan chain selection scheme can significantly reduce or entirely eliminate unknown states occurring in test responses that enter the compactor.

Various aspects and features of the disclosed technology (which can be realized alone or in combination with one another) can include the following: (1) an architecture of a multi-stage test response compactor that works with multiple scan chains, generally preserves the benefits of spatial compaction, and offers comparatively higher compression ratios; (2) a multi-level scan chain selection logic that can be integrated with the compactor; and (3) a methodology for determining per-pattern scan chain selection masks employed to suppress unknown ("X") states based on a ranking of scan chains.

In some embodiments of the disclosed technologies, two-stage test response compactors with scan chain selection logic (for example, for selectively masking one or more test response bits) are provided. Embodiments of the compactor are capable of handling a wide range of X state profiles, offer compaction ratios higher than the ratio of scan chains to compactor outputs, and/or provide high diagnostic resolution. In addition, and in certain embodiments, on-chip comparator and registration circuitry records fail log information. This can result in a significant reduction of test time. Furthermore, embodiments of the multi-stage compactors described herein can be useful for legacy cores where higher compression ratios can only be achieved by external solutions, as their scan chain configurations generally cannot be changed.

Also described herein are exemplary methods for synthesizing selection logic for masking one or more test response bits. These techniques can reduce the data required to operate the selection logic. Moreover, exemplary selection techniques for determining mask bits (also referred to herein as "masking instructions" or "masking instruction bits") for the selection logic are disclosed.

One exemplary embodiment disclosed herein is an apparatus for compacting test responses of a circuit-under-test. The apparatus includes, for example, a first spatial compactor comprising a plurality of first-compactor inputs and a first-compactor output; a register comprising a register input coupled to the first-compactor output and a plurality of register outputs; and a second spatial compactor comprising a plurality of second-compactor inputs coupled to the plurality of register outputs and a second-compactor output. In certain implementations of these embodiments, the register is operable to load test response bits through the register input and to output the test response bits in parallel through the plurality of register outputs. In some embodiments the first spatial compactor and the second spatial compactor are feedback free. In certain embodiments, the first spatial compactor and the second spatial compactor comprise respective networks of XOR or XNOR gates. In some embodiments, at least one of the first spatial compactor and second spatial compactor is a pipelined spatial compactor. The register can comprise two or more sequential elements coupled in series. The register can also be operable to serially load the test response bits. In certain embodiments, the first spatial compactor comprises a plurality of first-compactor outputs, and in some embodiments the second spatial compactor comprises a plurality of second-compactor outputs.

In additional embodiments, the apparatus can further comprise a first set of masking logic coupled to the plurality of first-compactor inputs and a second set of masking logic coupled between the plurality of register outputs and the plurality of second-compactor inputs. In some embodiments, the apparatus further comprises selection logic having one or more selection-logic inputs and a plurality of selection-logic outputs, the plurality of selection-logic outputs being coupled to respective inputs of the first set of masking logic and respective inputs of the second set of masking logic, the selection logic being operable to selectively control the first set of masking logic and the second set of masking logic in response to one or more masking instruction bits received at the one or more selection-logic inputs. In certain embodiments, the selection logic comprises a network of digital logic gates (for example, XOR or XNOR gates) configured according to polynomials (for example, polynomials describing respective relationships between at least one selection logic input and at least one selection logic output). In some embodiments, the register is a first register, the selection logic comprises a plurality of selection-logic inputs, and the apparatus further comprises a second register having a second-register input and a plurality of second-register outputs, the plurality of second-register outputs being coupled to the plurality of selection-logic inputs. In certain embodiments of the apparatus, the masking instruction bits are uncompressed bits received from, for example, an external tester, an on-chip memory, or an on-chip decompressor.

Another exemplary embodiment disclosed herein is a method for compacting test responses of a circuit-under-test. In this exemplary embodiment, a plurality of uncompressed test response bits is compressed, thereby producing a first set of compressed test response bits. The first set of compressed test response bits are loaded into a plurality of sequential elements. The first set of compressed test response bits are unloaded in parallel from the plurality of sequential elements, and the first set of compressed test response bits are further compressed. In some embodiments, the loading occurs in a first period of two or more clock cycles, and the unloading occurs in a second period of one clock cycle. In certain embodiments, one or more of the uncompressed test response bits are selectively masked before the uncompressed test response bits are compressed and/or further compressed. In some embodiments, masking instruction bits for controlling the selective masking are loaded as the uncompressed test response bits are being compressed and/or as the compressed test response bits are being further compressed. Circuits for compressing test responses that are configured to perform these methods are also disclosed.

Another exemplary embodiment disclosed herein is an apparatus for compacting test responses of a circuit-under-test. The apparatus of this embodiment includes two or more sequential elements having respective inputs and outputs. The sequential elements are operable to input a group of two or more uncompressed test response bits through the inputs of the sequential elements and are further operable to output in parallel the group of uncompressed test response bits through the outputs of the sequential elements. The apparatus further includes a first spatial compactor comprising a plurality of first-compactor inputs and a first-compactor output. The first-compactor inputs are coupled to the outputs of the sequential elements. In some embodiments, the apparatus further includes a second spatial compactor comprising a plurality of second-compactor inputs and a second-compactor output. In these embodiments, one of the plurality of second-compactor inputs is coupled to the first-compactor output. In certain embodiments, the two or more sequential elements are scan cells in a scan chain of the circuit-under-test. In some embodiments, the two or more sequential elements form a register coupled to an output of a scan chain of the circuit-under-test. In certain embodiments, the first spatial compactor and the second spatial compactor are feedback free. In some embodiments, the first spatial compactor and the second spatial compactor comprise respective networks of XOR or XNOR gates. In certain embodiments, the second-compactor inputs are coupled to outputs of multiple additional spatial compactors. In these embodiments, each additional spatial compactor is configured to input additional uncompressed test response bits received in parallel from additional respective sequential elements. Some embodiments further comprise a first set of masking logic coupled to the plurality of first-compactor inputs, and a second set of masking logic coupled to the plurality of second-compactor inputs. In certain embodiments, the apparatus further comprises selection logic having one or more selection-logic inputs and a plurality of selection-logic outputs. In these embodiments, the plurality of selection-logic outputs is coupled to respective inputs of the first set of masking logic and respective inputs of the second set of masking logic. Furthermore, the selection logic can be operable to selectively control the first set of masking logic and the second set of masking logic in response to one or more masking instruction bits received at the one or more selection-logic inputs. The selection logic can comprise, for example, a network of XOR or XNOR gates configured according to polynomials. In certain embodiments, the apparatus further comprises a register having a register input and a plurality of register outputs. In these embodiments, the plurality of register outputs is coupled to the plurality of selection-logic inputs.

Another exemplary embodiment disclosed herein is a method of testing a circuit-under-test. In this exemplary embodiment, test pattern data is provided to inputs of a circuit-under-test during a first interval. Masking instructions for a masking circuit are provided to the inputs of the circuit-under-test during a second interval. In certain embodiments, the first interval precedes the second interval. In other embodiments, the second interval precedes the first interval. In some embodiments, the first interval comprises a third and a fourth interval and the second interval comprises a fifth and sixth interval, and the third and fourth intervals are interspersed with the fifth and sixth intervals. In certain embodiments, the masking instructions are applied to a masking circuit as a test response to a test pattern generated from the test pattern data is being unloaded from the circuit-under-test. In some embodiments, the masking instructions are applied to a masking circuit as a test response to a test pattern generated from other test pattern data is being unloaded from the circuit-under-test. The method can further comprise masking one or more test response bits according to the masking instructions. Circuits for performing these exemplary methods are also disclosed.

Another exemplary embodiment described herein is a method of generating selection logic for a selection circuit used to control the masking of unknown states during test response compaction. In this embodiment, a candidate polynomial for possible inclusion in a set of accepted polynomials is generated (for example, randomly). The candidate polynomial and the accepted polynomials describe connections of two or more inputs of the selection logic to a respective output of the selection circuit. One or more test sets of polynomials are selected. The test sets respectively comprise at least the candidate polynomial and one or more polynomials from the set of accepted polynomials. Rank values for the test sets are computed. The candidate polynomial is selected for inclusion in the set of accepted polynomials based at least in part on the rank values. The set of accepted polynomials (with the candidate polynomial) is stored on one or more computer-readable media. In certain embodiments, the method further includes generating a circuit description of the selection logic and storing the circuit description of the selection logic on one or more computer-readable media. In these embodiments, the selection logic implements polynomials from the set of accepted polynomials. In some embodiments, the method further includes determining whether the candidate polynomial shares more than a fixed number of terms with one or more of the polynomials in the set of accepted polynomials, and generating a new candidate polynomial if the candidate polynomial does share more than the fixed number of terms with one or more of the polynomials in the set of accepted polynomials. In certain embodiments, the act of computing the rank values further comprises averaging the rank values for the two or more test sets of polynomials, and the act of selecting the candidate polynomial is based at least in part on the average rank value. In some embodiments, the acts of generating, selecting, and computing are repeated for a plurality of additional candidate polynomials. In certain embodiments, the act of selecting the candidate polynomial for inclusion in the accepted set of polynomials is further based on comparing the average rank value of the candidate polynomial with respective average rank values of the additional candidate polynomials. In some embodiments, the act of computing the rank values for the two or more sets of polynomials comprises determining reduced-row echelon forms of the two or more test sets of polynomials.

Another exemplary embodiment disclosed herein is a method of generating masking instructions for a selection circuit operable to mask test response bits during testing of a circuit-under-test. In this embodiment, a test pattern being applied to the circuit-under-test is simulated to produce a test response. One or more unknown states are identified in the test response. One or more test response bits are selected for masking based at least in part on the one or more identified unknown states. One or more indications of the selected test response bits are stored on one or more computer-readable media. In certain embodiments, masking instructions for a selection circuit are encoded based at least in part on the selected one or more test response bits. In some embodiments, one or more fault observation sites in the test response are identified, and the selection of the one or more test response bits for masking is further based at least in part on the one or more identified fault observation sites. In certain embodiments, the act of selecting one or more test response bits for masking comprises assigning weights to one or more scan cells of a selected scan chain of the circuit-under-test based at least in part on the one or more identified unknown states, the one or more identified fault observation sites, or both the one or more identified unknown states and the one or more identified fault observation sites. The method can further include aggregating the weights for one or more groups of scan cells within the selected scan chain, computing one or more scores for the selected scan chain based at least in part on the aggregated weights, and determining whether to mask test response bits from the selected scan chain based at least in part on the scores. In some embodiments, the weights represent a type of value stored in the scan cells after the simulation of the test pattern being applied. In certain embodiments, one of the scores computed for the selected scan chain is proportional to an estimated number of errors that will be preserved if the selected scan chain is masked and/or one of the scores computed for the selected scan chain is proportional to an estimated number of errors that will be preserved if the selected scan chain is not masked.

Another exemplary embodiment disclosed herein is a method of generating masking instructions for a selection circuit operable to mask test response bits during testing of a circuit. According to this embodiment, weights are assigned to one or more scan cells of a selected scan chain. The weights are aggregated for one or more groups of scan cells within the selected scan chain. One or more scores are computed for the selected scan chain based at least in part on the aggregated weights. A determination is made whether to mask test response bits from the selected scan chain based at least in part on the scores. The determination is stored on one or more computer-readable media. In certain embodiments, masking instructions for the selection circuit are encoded based at least in part on the determination, and the masking instructions are stored on one or more computer-readable media. In some embodiments, the weights represent a type of value stored in the scan cells after a test pattern is applied to a circuit-under-test. In certain embodiments, the act of assigning weights comprises assigning a first weight to a first respective scan cell in the selected scan chain that captures an unknown value. In some embodiments, the act of assigning weights comprises assigning a second weight to a second respective scan cell in the selected scan chain that captures a value indicative of a targeted fault. In certain embodiments, the second weight is greater than the first weight. In some embodiments, the act of assigning weights further comprises assigning a third weight to a third respective scan cell in the selected scan chain that capture a value that is neither unknown nor indicative of a targeted fault. In certain embodiments, the second weight is greater than both the first weight and the third weight, and the third weight is greater than the first weight. In some embodiments, one of the scores computed for the selected scan chain is proportional to an estimated number of errors that will be preserved if the selected scan chain is not masked and/or one of the scores computed for the selected scan chain is proportional to an estimated number of errors that will be preserved if the selected scan chain is masked. In certain embodiments, the acts of assigning, aggregating, and computing are repeated for one or more additional scan chains, thereby computing one or more scores for each of the one or more additional scan chain. In some embodiments, the act of determining whether to mask test response bits from the selected scan chain further comprises comparing the one or more scores of the selected scan chain with the one or more scores for each respective additional scan chain.

Another exemplary embodiment disclosed herein comprises a method of testing a plurality of circuits in a testing system. At a first input of one of the plurality of circuits, masking data for controlling a masking circuit is received. At a second input of the one of the plurality of circuits, expected test response data for evaluating test responses generated during testing of the one of the plurality of circuits is received. In this exemplary embodiment, the masking data and the expected test response data are received simultaneously at the first and second inputs. In some embodiments, the test responses are compacted test responses. In certain embodiments, the test responses are loaded into a multiple-input shift register (MISR), one or more compactor signatures are produced in the MISR, and the one or more compactor signatures are stored in one or more computer-readable media. In some embodiments, a list of candidate fault locations is generated according to the one or more compactor signatures, and the list of candidate fault locations is stored on one or more computer-readable media. In certain embodiments, one or more error vectors are generated based at least in part on the test responses and the expected test response data. In these embodiments, the error vectors can be compacted in a multiple-input shift register to produce one or more compactor signatures, and the one or more compactor signatures can be stored in one or more computer-readable media. The multiple-input shift register can produce a compactor signature from multiple error vectors input over a plurality of shift cycles. For example, the multiple-input shift register can produce one compactor signature per test pattern. In certain embodiments, an error vector is generated based at least in part on the test responses and the expected test response data (for example, for a single shift cycle), and the error vector is stored on one or more computer-readable media. In some embodiments, the test responses are loaded into a priority encoder circuit. In these embodiments, the test responses comprise test response values from three or more compactor outputs, and the priority encoder circuit is configured to detect three or more errors in the test responses input in a single shift cycle.

Another exemplary embodiment disclosed herein is an apparatus comprising a plurality of scan chain groups, each scan chain group of the plurality comprising one or more scan chains and one or more corresponding scan chain group outputs. The apparatus further comprises a plurality of comparator circuits, each comparator circuit of the plurality comprising a comparator input and a comparator output. The apparatus also includes a multiple-input shift register (MISR) comprising MISR inputs and a MISR output. The apparatus additionally includes a plurality of compactors, each compactor of the plurality comprising one or more compactor inputs coupled to the scan chain group outputs of a respective one of the plurality of scan chain groups and further comprising a compactor output coupled directly to a respective one of the MISR inputs and also coupled to the comparator input of a respective comparator. In some embodiments, the apparatus further includes a memory with a first input coupled to the MISR output and a second input coupled to a pattern counter. In certain embodiments, the apparatus further comprises a plurality of masking gates, each masking gate being coupled between the compactor output of a respective one of the comparators and a respective input of the MISR.

Another exemplary embodiment disclosed herein is an apparatus comprising a plurality of scan chain groups, each scan chain group of the plurality comprising one or more scan chains and one or more corresponding scan chain group outputs. The apparatus of this embodiment further comprises a plurality of comparator circuits, each comparator circuit of the plurality comprising a comparator input and a comparator output. The apparatus also comprises a multiple-input shift register (MISR) comprising MISR inputs coupled to the comparator outputs of respective comparators and a MISR output. The apparatus further comprises a plurality of compactors, each compactor of the plurality comprising one or more compactor inputs coupled to the scan chain group outputs of a respective one of the plurality of scan chain groups and further comprising a compactor output coupled to the comparator input of a respective comparator. The apparatus further includes a first collector circuit coupled to one or more of the comparator outputs. The first collector circuit can be configured to record which one or more of the plurality of compactors produces one or more error outputs during testing. The apparatus also includes a second collector circuit coupled to one or more comparator outputs. The second collector circuit can be configured to record one or more time indicators for the one or more error outputs. In certain embodiments, the second collector circuit is coupled to two or more of the comparator outputs through an OR gate. Some embodiments further include a memory having an input coupled to the MISR output. Certain embodiments further include a plurality of masking circuits, each masking circuit having a masking circuit input coupled to the comparator output of a respective comparator and a masking circuit output coupled to a respective MISR input of the MISR.

Another exemplary embodiment disclosed herein is an apparatus for testing a plurality of electronic circuits. The apparatus includes a plurality of scan chain groups, each scan chain group of the plurality comprising one or more scan chains and one or more corresponding scan chain group outputs. The apparatus also includes a plurality of comparator circuits, each comparator circuit of the plurality comprising a comparator input and a comparator output. The apparatus further includes an encoder circuit comprising a plurality of encoder inputs and an encoder output. The encoder inputs are coupled to respective comparator outputs. The apparatus also includes a plurality of compactors, each compactor comprising one or more compactor inputs coupled to the scan chain group outputs of a respective one of the scan chain groups and further comprising a compactor output coupled to the comparator input of a respective comparator. The encoder of this embodiment is configured to detect more than two error values output from the compactor outputs (for example, during a single shift cycle). The encoder can additionally be configured to detect two or fewer error values output from the compactor outputs. Some embodiments further include a plurality of masking circuits, each masking circuit having a masking circuit input coupled to the comparator output of a respective compactor and a masking output coupled to respective encoder inputs. Certain embodiments also comprise a memory coupled to the encoder output.

Any of the disclosed methods can be implemented as computer-readable media comprising computer-executable instructions for causing a computer to perform the methods. Further, computer-readable media storing signatures produced by any of the disclosed compactors, storing lists of fault candidates or faulty scan cell candidates identified by any of the disclosed methods, storing circuit descriptions for implementing any of the disclosed compactor embodiments, or storing final or intermediate results for any of the described methods are also disclosed.

The foregoing and other objects, features, and advantages of the invention will become more apparent from the following detailed description, which proceeds with reference to the accompanying figures.

BRIEF DESCRIPTION OF THE DRAWINGS

FIGS. 14 and 15 show tables describing experimental results of using methods and apparatus described herein.

DETAILED DESCRIPTION

Figure 1:
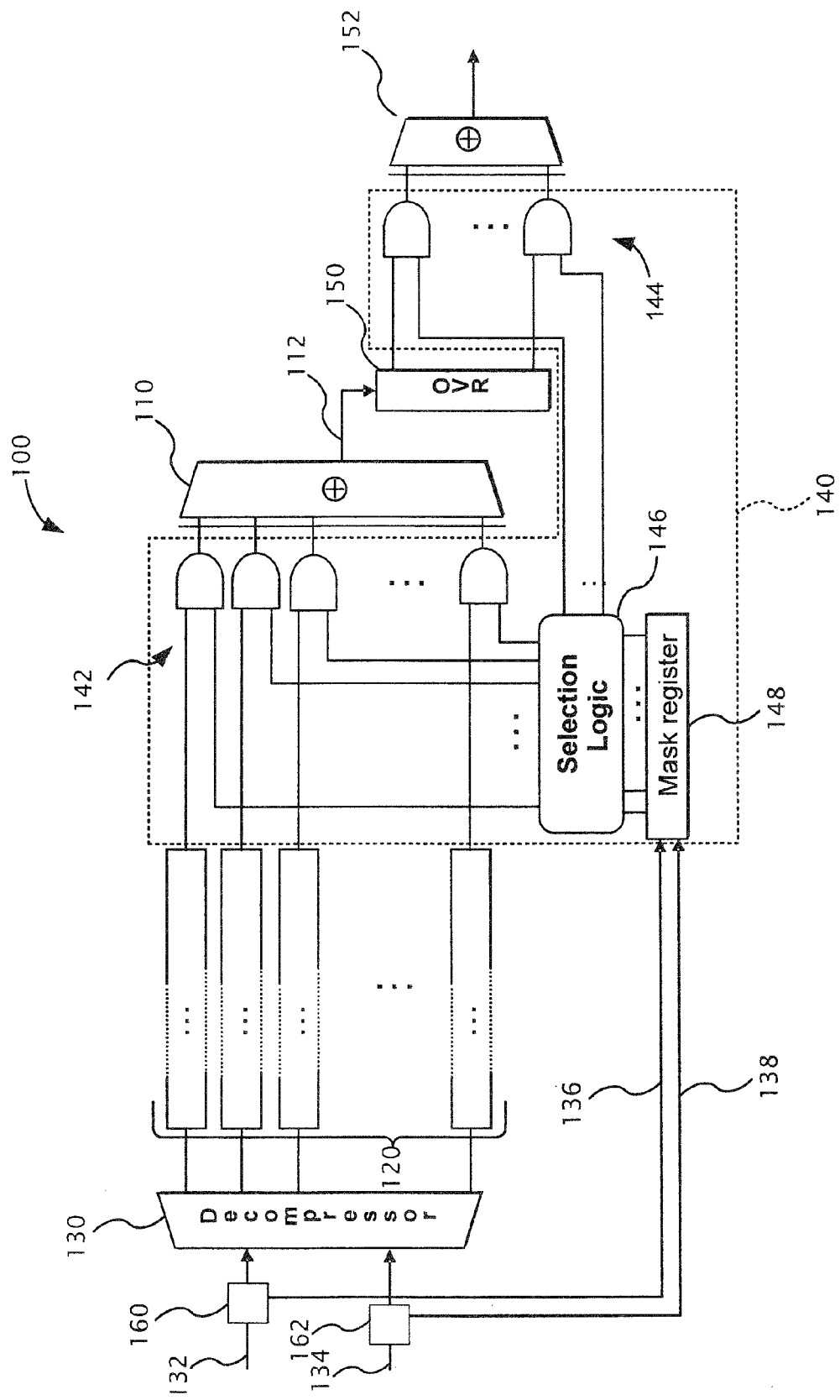
FIG. 1 shows an exemplary embodiment of a test response compactor architecture.

Disclosed below are representative embodiments of electronic circuit testing techniques and associated apparatus that should not be construed as limiting in any way. Instead, the present disclosure is directed toward all novel and nonobvious features and aspects of the various disclosed methods, apparatus, and equivalents thereof, alone and in various combinations and subcombinations with one another. The disclosed technology is not limited to any specific aspect or feature, or combination thereof, nor do the disclosed methods and apparatus require that any one or more specific advantages be present or problems be solved.

As used in this application and in the claims, the singular forms "a," "an" and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "determine" and "select" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be implemented in, for example, a wide variety of integrated circuits that utilize scan-based or partially scan-based testing (for example, application-specific integrated circuits (ASICs) (including mixed-signals ASICs), systems-on-a-chip (SoCs), or programmable logic devices (PLDs) such as field programmable gate arrays (FPGAs)). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits with embodiments of the disclosed technology or equivalents are considered to be within the scope of this disclosure.

Any of the apparatus described herein can be designed, verified, and/or simulated using software that comprises computer-executable instructions stored on one or more computer-readable media. Such software can comprise, for example, an electronic design automation (EDA) software tool, such as a design, verification, or simulation tool. Similarly, any of the methods described herein can be performed or simulated (at least in part) using software comprising computer-executable instructions stored on one or more computer-readable media. Furthermore, any intermediate or final results of the disclosed methods can be stored on one or more computer-readable media. For example, a software tool can be used to determine and store one or more control signals (for example, mask bits) used to control any of the disclosed apparatus. Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For the same reason, computer hardware is not described in further detail. It should be understood that the disclosed technology is not limited to any specific computer language, program, or computer. For instance, a wide variety of commercially available computer languages, programs, and computers can be used.

Further, any of the disclosed apparatus can be stored as circuit design information on one or more computer-readable media. For example, one or more data structures containing design information (for example, a netlist, HDL file, or GDSII file) can be created (or updated) and stored to include design information for any of the disclosed apparatus. Such data structures can be created (or updated) and stored at a local computer or over a network (for example, by a server computer). Similarly, compressed test responses produced by any of the disclosed apparatus or control signals used to operate any of the disclosed apparatus (for example, mask bits) can be stored on one or more computer-readable media (for example, in one or more data structures). Such computer-readable media are considered to be within the scope of the disclosed technologies.

Moreover, any of the disclosed methods can be used in a computer simulation, ATPG, or other EDA environment, wherein test patterns, test responses, and compressed test responses are determined by or otherwise analyzed using representations of circuits, which are stored on one or more computer-readable media. For presentation purposes, however, the present disclosure sometimes refers to a circuit or its circuit components by their physical counterpart (for example, scan cells, spatial compactors, registers, selection logic, logic gates, and other such terms). It should be understood, however, that any reference in the disclosure or the claims to a physical component includes representations of such circuit components as are used in simulation, ATPG, or other such EDA environments.

Introduction and Overview of Disclosed Technologies

Test response compaction, in conjunction with stimuli compression, can play an important role in handling the growth of test data volume. Although the development of various compaction schemes reflects the needs of various application domains, a test response compactor desirably preserves the observability of any scan cell for a wide range of unknown-state profiles, while maintaining high compaction ratios, providing the ability to detect a variety of failures found in real silicon, and/or achieving design simplicity. It can also be desirable to control compactor operations with a minimal amount of additional information, so that this data will have little or no negative impact on the effective test data volume compression.

In some cases, unknown states (also referred to herein as "X states") can render tests useless when employing test response compaction. In many scan-based designs, X states, once captured in scan cells, are subsequently injected into a compactor. Hence, they can affect a resultant signature, especially if a time compactor is used, where X states can quickly multiply (due to a feedback fan-out) and stay in the compactor until a read out operation. Multiplication of unknown states can be prevented in some compactor architectures, such as modular time compactors which use simple binomials in the feedback. In some cases, such an arrangement can significantly reduce the negative impact of X states. Combinational compactors can flush out X states, but in order to avoid masking inputs from the scan chains and to allow diagnosis, such compactors typically have to observe each scan chain on two or more outputs. Finite memory compactors can flush out X states in a number of scan shift cycles. However, even if a test response compactor is designed to tolerate a pre-specified amount of X states, its ability to handle a wide range of X state profiles typically requires a scan chain selection (masking) mechanism. See, e.g., U.S. Pat. Nos. 6,557,129 and 6,829,740, which are incorporated herein by reference. Otherwise, certain combinations of X states that cannot be eliminated by automatic test pattern generation (ATPG) can prevent observability of some scan cells and cause a significant fault coverage drop.

Exemplary Test Circuit Compactor Architectures

FIG. 1 shows an exemplary embodiment 100 of a compactor architecture (an X-Press compactor architecture) comprising a first test response compactor 110 and a second test response compactor 152 in an embedded deterministic test environment having n scan chains 120. Compressed test stimuli can be provided to the scan chains 120 via a decompressor 130 through one or more input channels (or input paths) 132, 134. In some embodiments, these channels can also be used in conjunction with input channels 136, 138 to deliver mask bits (masking instructions) to a selector circuit 140 via components 160, 162. In particular embodiments, the components 160, 162 are pipeline registers, while in other embodiments they are demultiplexers. In further embodiments, there is not necessarily a data dependency between the compressed test stimuli and the mask bits, as is discussed more fully below. The compactor 110 can be a space compactor (or spatial compactor) comprising an XOR or XNOR tree and can be coupled to the scan chains 120 via the selector circuit 140. An output 112 of the first compactor 110 can be coupled to a v-bit overdrive register 150. In some embodiments the overdrive register 150 can be implemented as a sequentially loading register, for example, a shift register. The overdrive register 150 can comprise one or more sequential elements, such as flip-flops or latches, coupled in series. The overdrive register 150 can be configured to receive compressed test responses from the first compactor 110 and provide them to the second compactor 152. The second compactor 152 can be a space compactor (or spatial compactor) comprising an XOR or XNOR tree. In particular embodiments, the first compactor 110 and/or the second compactor 152 comprise feedback free compactors. In further embodiments, the first compactor 110 and/or the second compactor 152 comprise pipelined spatial compactors.

Figure 2:
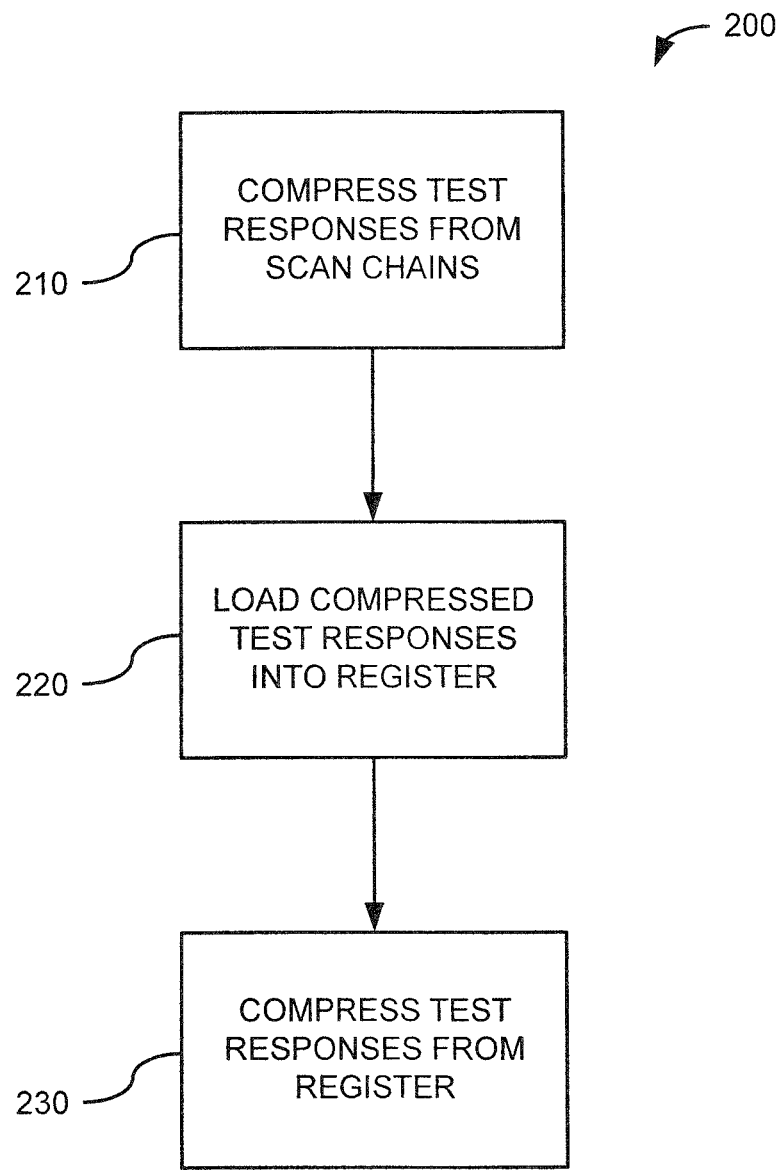
FIG. 2 shows a block diagram of one embodiment of a method for compressing test responses.

FIG. 2 shows a block diagram of one exemplary embodiment of a method 200 for compressing test responses using a test response compactor architecture such as the embodiment 100 of FIG. 1. In method act 210, test response bits from the scan chains 120 are compressed by the compactor 110. In method act 220 the compressed test response bits are loaded into the v-bit overdrive register 150. In exemplary embodiments, the compressed test response bits are serially loaded into the register. This loading can occur, for example, over a period of two or more clock cycles. In method act 230, the compressed test response bits are further compressed by the second compactor 152. In exemplary embodiments, the contents of the overdrive register are unloaded in parallel (possibly over a period of one clock cycle) into the second compactor 152 and compressed every v scan shift cycles. The unloading of the overdrive register 150 and compression in the second compactor 152 can occur during the same clock cycle as the last shift cycle from the v scan shift. In certain embodiments, the compressed test response bits are unloaded and compressed into the second compactor 152 during every clock cycle, but are only recorded every v scan shift cycles.

The compression ratio of scan chain inputs to compactor outputs that can potentially be achieved using a two-stage compaction scheme, such as that described in FIG. 2, can go beyond a limit determined approximately by the ratio between the number of scan chains n and the number of compactor outputs w. In some embodiments, for instance, the compression ratio can be increased by about a factor of v (for example, the ratio can be approximately n×v:w).

For example, one embodiment of a test response compactor architecture according to the architecture of FIG. 1 comprises two tester input channels (for example, channels 132, 134), one compactor output channel (w=1), one hundred internal scan chains (n=100), and an overdrive register ten bits (v=10). With conventional technologies the ratio of scan chains to tester input channels sets the maximum compression level (for example, 50x). Using the disclosed technologies, however, the test data compression ratio is approximately 100×10/1=1000x.

Returning to FIG. 1, the selector circuit 140 can comprise a first group of logic gates 142 and second group of logic gates 144. One or more groups of such logic gates are sometimes referred to herein as "masking logic." In the depicted embodiment, these gates are shown as being AND gates, but in further embodiments other logic gates (including multiple types of logic gates) can be used. The selector circuit 140 can further comprise a selection logic circuit 146 configured to apply signals to at least some of the first and second groups of logic gates 142, 144. In some embodiments the selector circuit 140 can act in response to mask bits received (for example, through the input paths 136, 138). In further embodiments, at least some of the mask bits are provided to the selection logic 146 via a mask register 148. Design and implementation of the selection logic circuit 146 is described in more detail below.

In some embodiments, the selector circuit 140 can block or "mask" one or more selected inputs to the first compactor 110 and/or the second compactor 152. The selected inputs can carry, for example, unknown states and/or unwanted responses from the scan chains 120 and/or the overdrive register 150. Inputs to the groups of logic gates 142, 144 can be provided such that the unknown states and/or unwanted responses do not reach the compactors 110, 152, and are instead replaced by known values (for example, a "0" or "1").

In some embodiments, the following signals can be provided to one or more gates in the groups of logic gates 142, 144. To block a selected scan chain output or a selected overdrive register output (for example, to suppress an X state), a "0" value can be provided to one or more of the gates. A "1" value can be provided to one or more of the gates to cause the selector circuit 140 to pass values (for example, values indicative of a targeted or untargeted fault) to a compactor. For scan chain outputs or overdrive outputs whose content is not considered critical (for example, are not associated with a scan cell whose value is indicative of a targeted or untargeted fault), a "don't care" value of either "0" or "1" can be assigned to logic gates for those outputs. These values can vary depending on the implementation.

In this application and in the claims, "first compactor stage" generally refers to the first compactor 110 and the group of logic gates 142, while "second compactor stage" generally refers to the second compactor 152, the group of logic gates 144 and the overdrive register 150.

Figure 3:
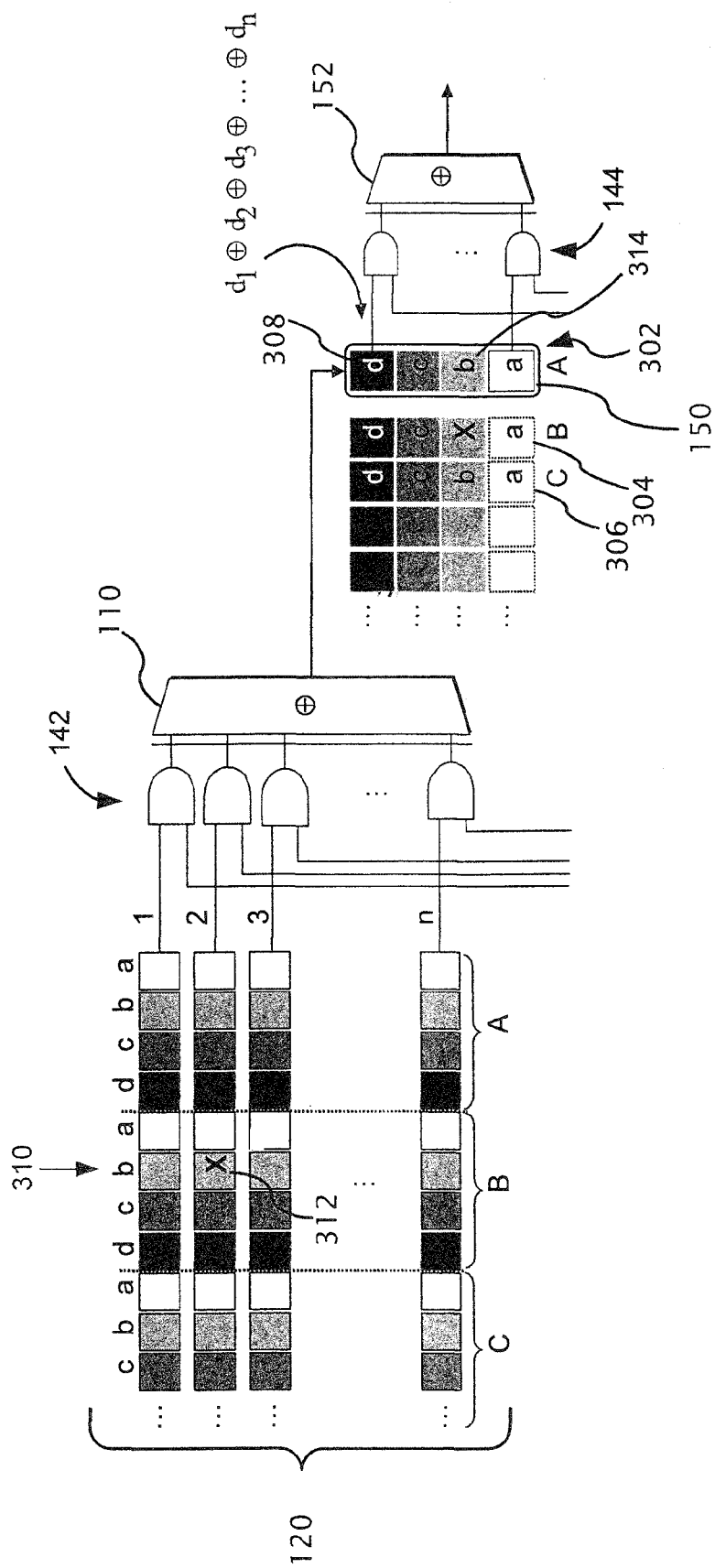
FIG. 3 illustrates one example of how a selector circuit can be used to handle X states that can appear in scan chains of a circuit-under-test.

FIG. 3 is a schematic block diagram illustrating one example of how the selector circuit 140 can be used to handle X states that can appear in the scan chains 120. In the depiction of FIG. 3, the overdrive register 150 is a 4-bit shift register. Accordingly, in the left half of FIG. 3 the data cycles in the scan chains 120 are shown as being grouped into blocks of four cycles, as indicated by the capital letters "A," "B" and "C." Individual cycles in each block are respectively labeled with lower-case letters "a," "b," "c" and "d." In the right half of FIG. 3, compressed test response bits 302 of block A are shown loaded into the overdrive register 150. (Although the left and right halves of FIG. 3 show events that do not happen simultaneously, they are shown in one figure for ease of reference.) Block A in the right half of FIG. 3 comprises bits that are the result of compressing uncompressed test response bits from multiple scan chains. For example, a compressed test response bit 308 is the XORed value of uncompressed test response bits 1 to n from the d cycle of the A block. Compressed test response bits 304, 306 of blocks B and C, respectively, can be loaded in succession into the overdrive register 150.

As shown on the left-hand side of FIG. 3, scan chain cycle 310 (i.e., cycle b of block B) contains an X state in cell 312 of scan chain 2. This X state can hide errors captured in the same scan-out cycle (i.e., in cycle b of block B in the other scan chains). Subsequently, this X state can invalidate test results in the block B as a whole (for example, after block B is compressed by the compactor 152). This is because, in the depicted embodiment and in the absence of any masking, the compressed content of the cells comprising block B are loaded into the overdrive register 150 in such a way that data for cycles a, b, c and d of a block are processed simultaneously by the second compactor 152. In some embodiments, the X state can be masked by the one of the logic gates 142 such that the X state is not passed to the first compactor 110. In some embodiments, mask signals are provided to the logic gates on a per-pattern basis, though in other embodiments masking signals are applied in other intervals (for example, on a multiple-pattern basis, a cycle-by-cycle basis, or a multiple-cycle basis). Accordingly, using the logic gates 142 to mask one cell in the scan chains 120 results in masking values for the entire scan chain, which can prevent test response bits indicative of targeted faults (error values) from being observed from the masked scan chain. An alternative approach is to allow the cycle 310 to be compressed by the first compactor 110. The second-stage logic gates 144 can then be used to mask the compressed b cycle containing the unknown state. If mask signals are provided to the second-stage logic gates 144 on a per-pattern basis, masking at this stage can potentially eliminate not only errors occurring in every v-th cell in the scan chain, but also unknown states captured in those cells.

Figure 4:
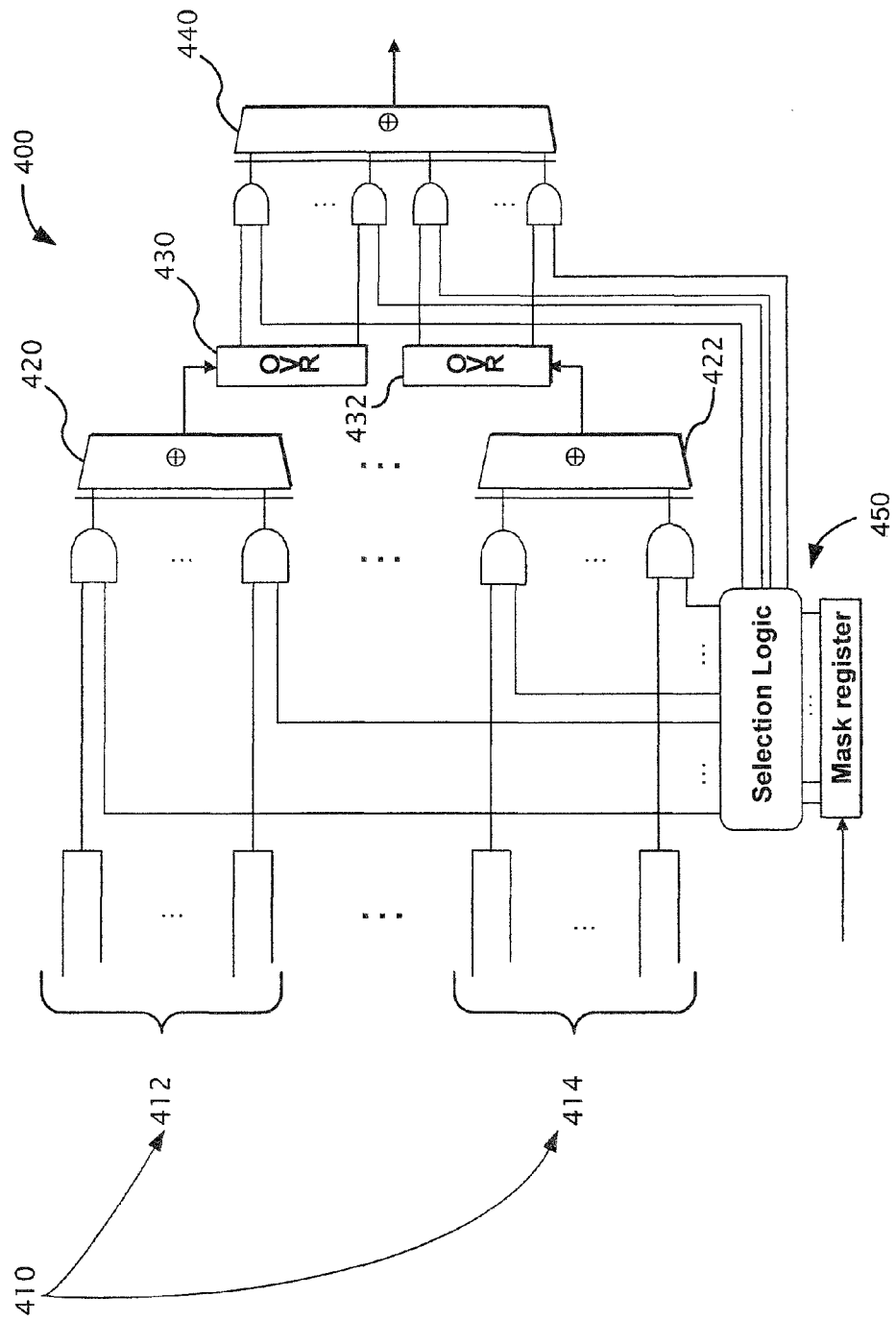
FIG. 4 shows a block diagram of an additional embodiment of a test response compactor architecture.

Additional embodiments of test circuit compactor architectures appear in FIGS. 4-7. FIG. 4 shows one embodiment of a test response compactor architecture 400 where the scan chains 410 are partitioned into groups 412 and 414. Data from each scan chain group is compressed by a separate compactor 420, 422 and fed into respective separate overdrive registers 430, 432. Values in the overdrive registers 430, 432 can be compressed by another compactor 440. Inputs to the compactors 420, 422, 440 can be masked using one or more selector circuits 450, as is similarly described above. In the embodiment of FIG. 4, a bit in one overdrive register can be masked while bits in the other overdrive register remain unmasked. Thus, the impact of an X state in one of the scan chain groups 412, 414 on results obtained from the other scan chain group can be reduced. Although only two first-stage compactors and overdrive registers are shown in FIG. 4, it is to be understood that multiple additional compactors and registers could be used in the illustrated architecture.

Figure 5:
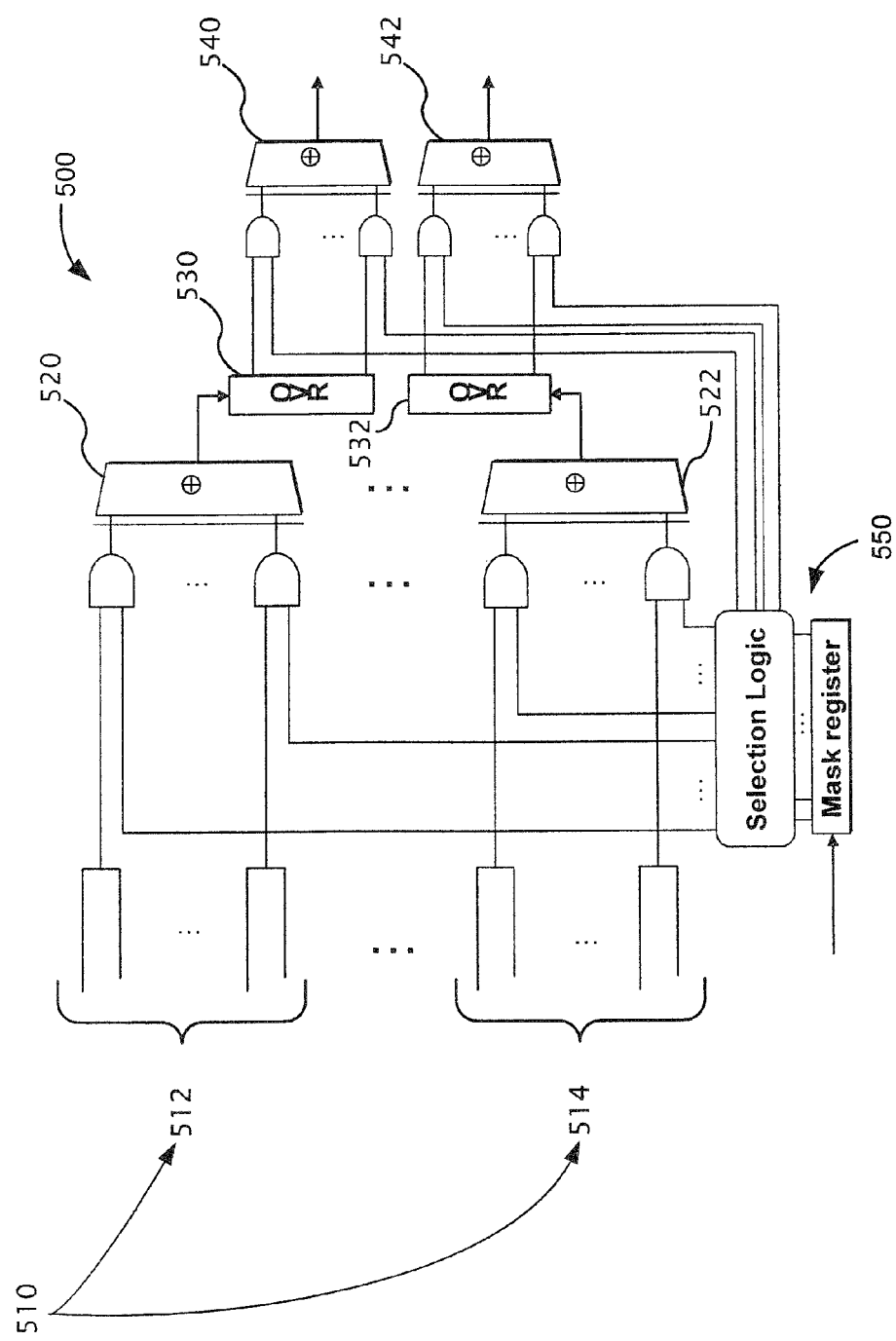
FIG. 5 shows a block diagram of an additional embodiment of a test response compactor architecture.

FIG. 5 shows another embodiment of a test response compactor architecture 500 configured to provide multiple outputs. Similar to the test circuit compactor architecture 400 of FIG. 4, architecture 500 comprises scan chains 510 partitioned into groups 512, 514, the groups providing test response data that is compressed by compactors 520, 522. These compactors 520, 522 feed data into respective overdrive registers 530, 532. In the architecture 500, the overdrive registers 530, 532 feed compacted responses into separate respective compactors 540, 542 instead of the same compactor. This can isolate a first scan chain group from the effects of an X state in a second scan chain group with or without masking one or more inputs to the compactors 520, 540, 542. In embodiments where masking can be used, the architecture can further comprise one or more selector circuits 550. Although only two first-stage compactors, overdrive registers, and second-stage compactors are shown in FIG. 5, it is to be understood that multiple additional compactors and registers could be used in the illustrated architecture.

Figure 6:
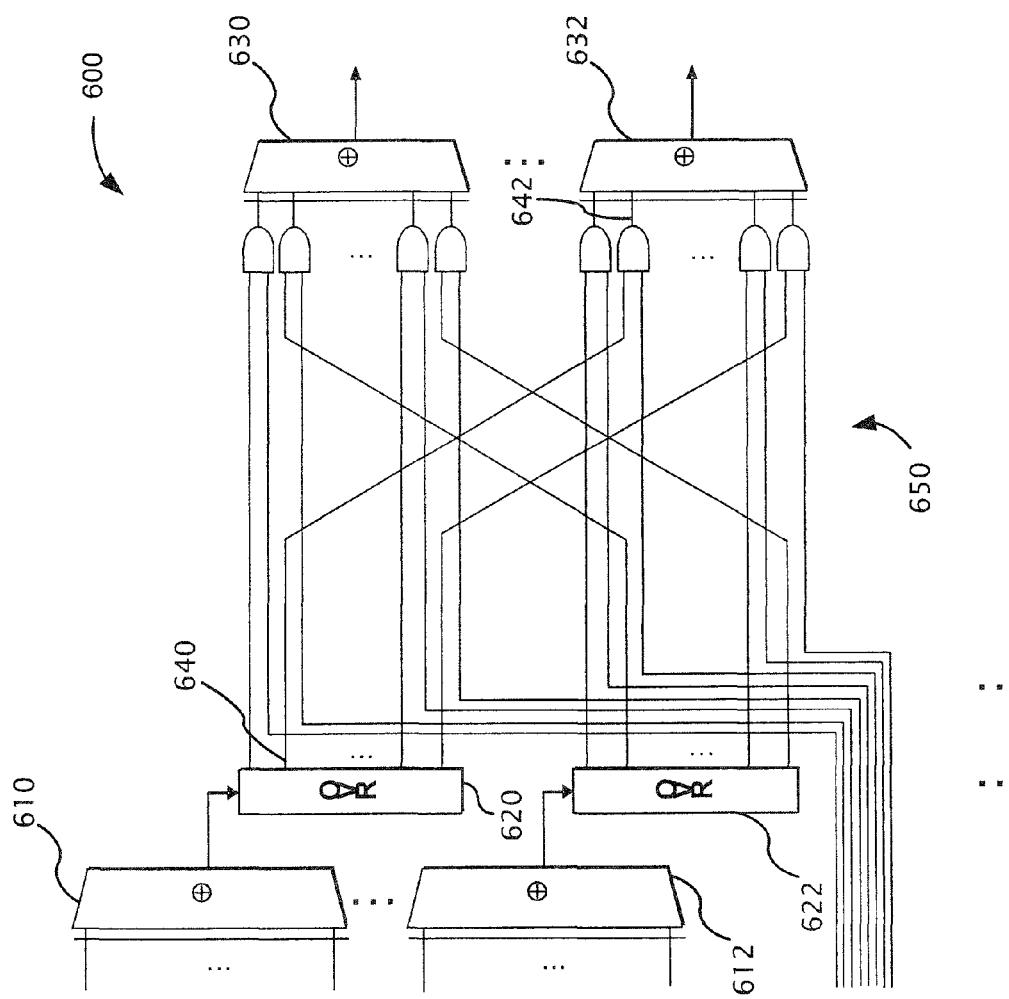
FIG. 6 shows a block diagram of an additional embodiment of a test response compactor architecture.

FIG. 6 depicts an additional embodiment of a test response compactor architecture 600 configured to provide multiple outputs. In this embodiment, compactors 610, 612 compress outputs from multiple respective scan chain groups (not shown) and provide the compressed outputs to respective overdrive registers 620, 622. The overdrive registers 620, 622 provide inputs to two compactors 630, 632. In this embodiment, non-consecutive bits from the overdrive registers can be provided to the compactors 630, 632 to reduce the impact of burst errors. For example, an output 640 from the overdrive register 620 can be routed to an input 642 on the compactor

632, rather than to an input on the compactor 630. Other routing configurations can also be used. The test circuit compactor architecture can further comprise one or more selector circuits 650. Although only two first-stage compactors, overdrive registers, and second-stage compactors are shown in FIG. 6, it is to be understood that multiple additional compactors and registers could be used in the illustrated architecture.

Figure 7:
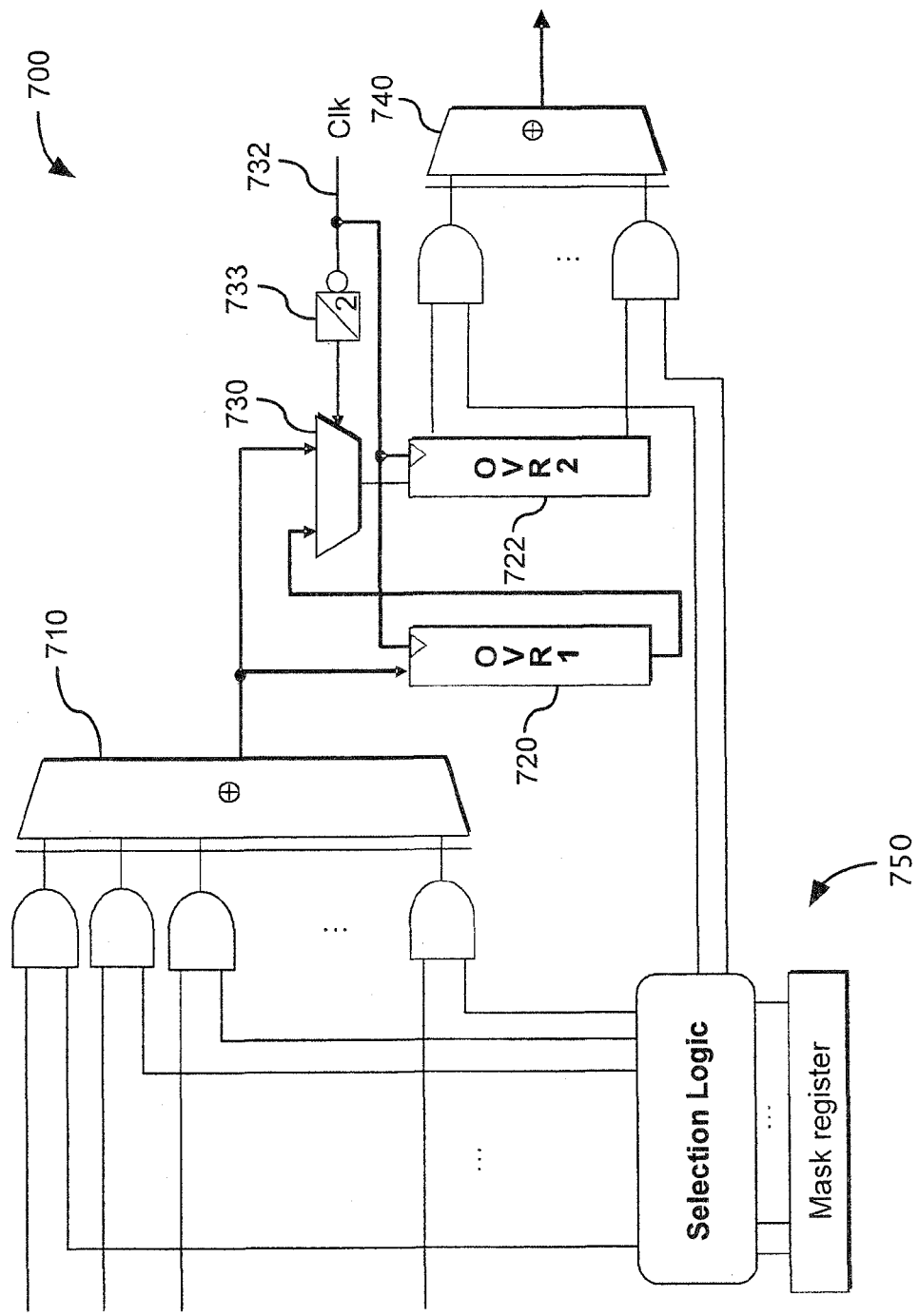
FIG. 7 shows a block diagram of an additional embodiment of a test response compactor architecture.

An additional embodiment of a test response compactor architecture 700 appears in FIG. 7. The depicted embodiment is configured to reduce the effect of burst errors while providing a single output. Compressed outputs from a compactor 710 are provided to a first overdrive register 720 and to a multiplexer (MUX) 730. The overdrive register 720 also feeds into the MUX 730, which is in turn coupled to a second overdrive register 722. The overdrive registers 720, 722 are clocked by a clock signal 732, and a divided version of the clock signal (produced by clock divider 733) is provided to the MUX 730. This arrangement can allow the overdrive register 722 to provide a non-consecutive group of outputs to a compactor 740. The architecture 700 can further comprise one or more selector circuits 750. Although only one first-stage compactors, two overdrive registers, and one second-stage compactors are shown in FIG. 7, it is to be understood that multiple additional compactors and registers could be used in the illustrated architecture.

Figure 8:
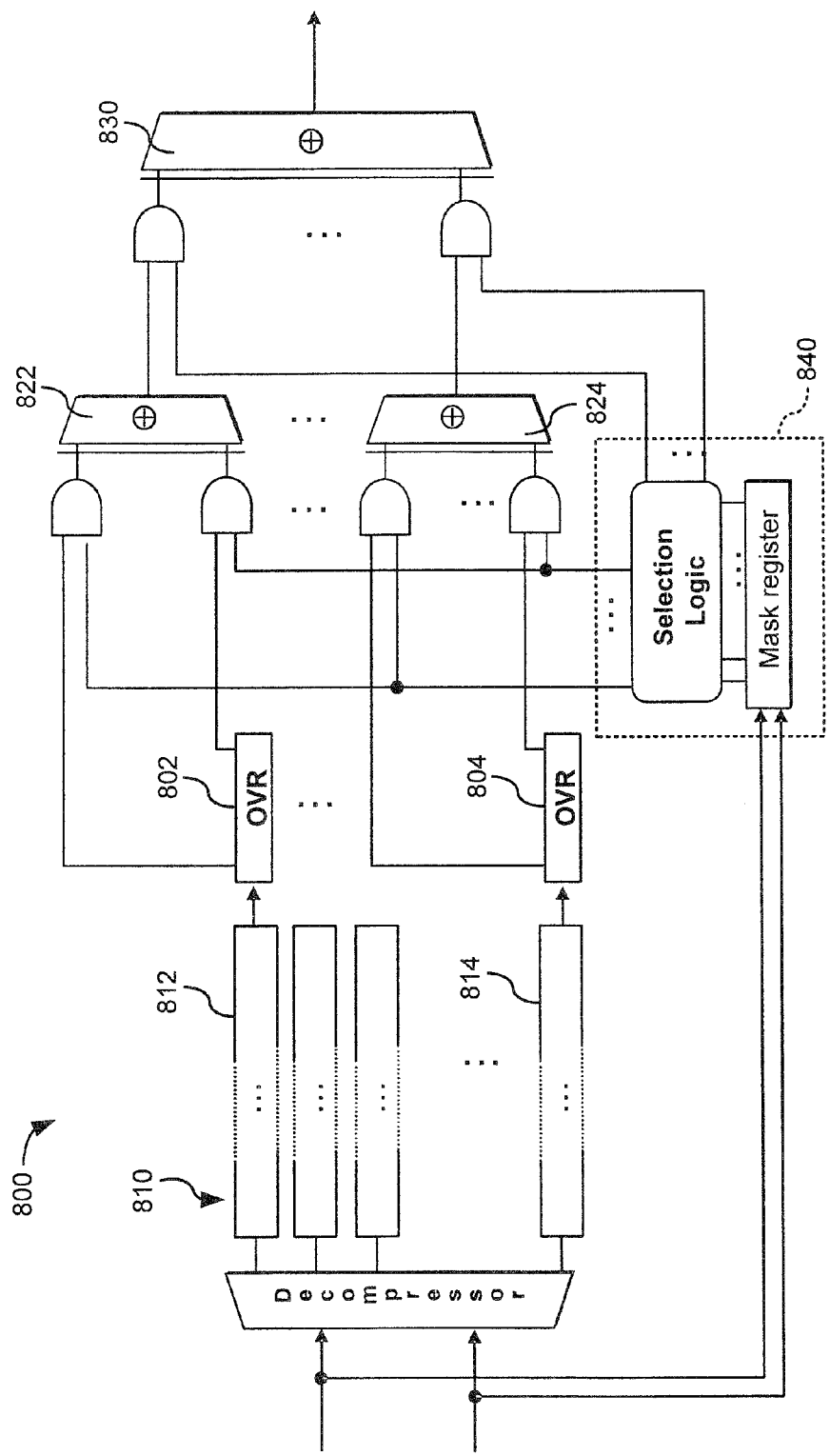
FIG. 8 shows a block diagram of an additional embodiment of a test response compactor architecture.

FIG. 8 shows a block diagram of another embodiment of a test response compactor architecture 800. In this embodiment, one or more overdrive registers 802, 804 are placed in the first stage of the compactor architecture 800. More particularly, the overdrive registers 802, 804 receive inputs from one or more scan chains. For example, overdrive register 802 receives inputs from scan chain 812. Although FIG. 8 shows only two overdrive registers, it is to be understood that, in this embodiment, one overdrive register is coupled to each of the scan chains 810. In other embodiments, other numbers of registers are coupled to the scan chains. The overdrive registers 802, 804 are configured to load inputs from their respective scan chains into a first stage of compactors. For example, overdrive registers 802, 804 load values received from scan chains 812, 814 into first-stage compactors 822, 824, respectively. Generally, values are loaded in parallel from the overdrive registers 802, 804 into the first-stage compactors 822, 824. Outputs from the first-stage compactors 822, 824 can be subsequently compacted by a second-stage compactor 830. The compactor architecture 800 can further comprise a selector circuit 840 for masking one or more inputs to the compactors 822, 824, 830. The selector circuit 840 can be similar to the selector circuits of other compactor architectures described above. Although only two first-stage compactors and overdrive registers are shown in FIG. 8, it is to be understood that multiple additional compactors and registers could be used in the illustrated architecture.

Figure 9:
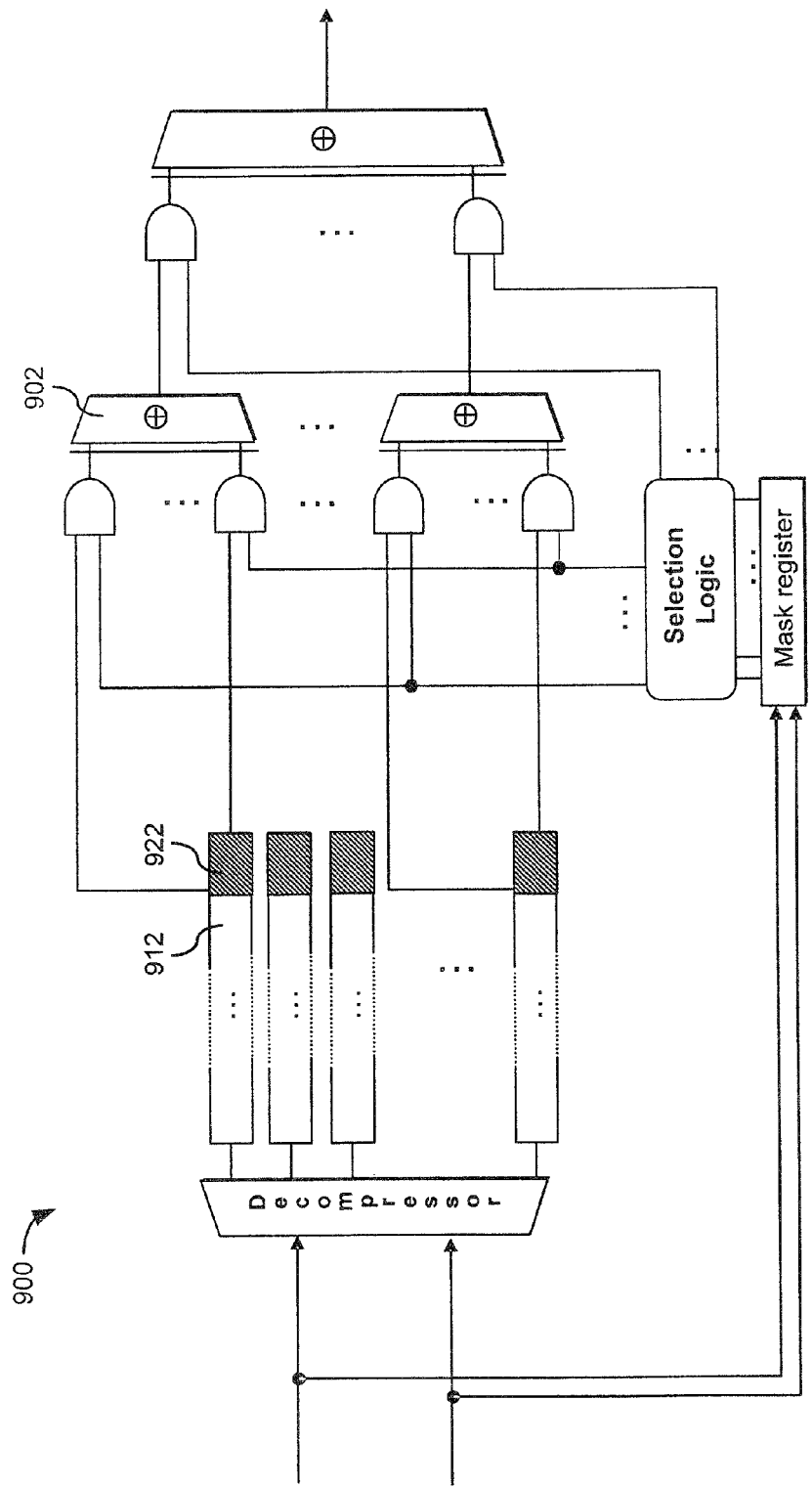
FIG. 9 shows a block diagram of an additional embodiment of a test response compactor architecture.

FIG. 9 shows a block diagram of a further embodiment of a test response compactor architecture 900. In this embodiment, instead of providing inputs to a first stage compactor 902 from an overdrive register, inputs can be loaded in parallel directly from v scan cells in a scan chain (usually, the last v cells of the chain) every v clock cycles. For example, in FIG. 9, scan chain 912 provides inputs to a compactor 902 from v scan cells 922 at the end of the chain 912. (In FIG. 9, in order to aid clarity, the individual cells are not shown.)

Figure 31:
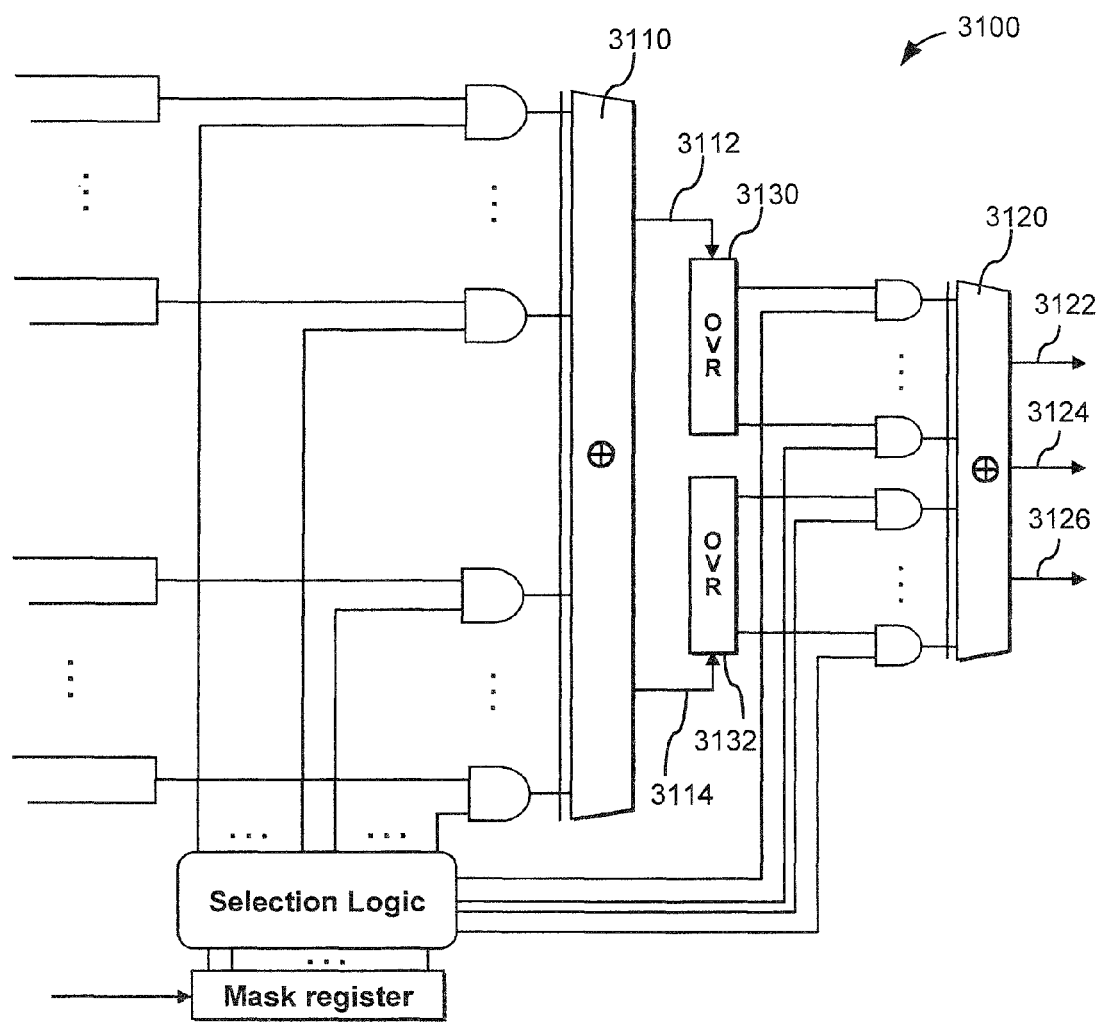
FIG. 31 shows a block diagram of an additional embodiment of a test response compactor architecture.

FIG. 31 shows a block diagram of a further embodiment of a test response compactor architecture 3100 comprised of a compactor 3110 in a first-stage and a compactor 3120 in a second stage. The compactor 3110 comprises multiple outputs 3112, 3114 coupled to respective overdrive registers 3130, 3132. The compactor 3120 comprises multiple outputs 3122, 3124, 3126. Generally, test compactor architectures described herein can be adapted to embodiments comprising one or more compactors with multiple outputs.

Figure 32:
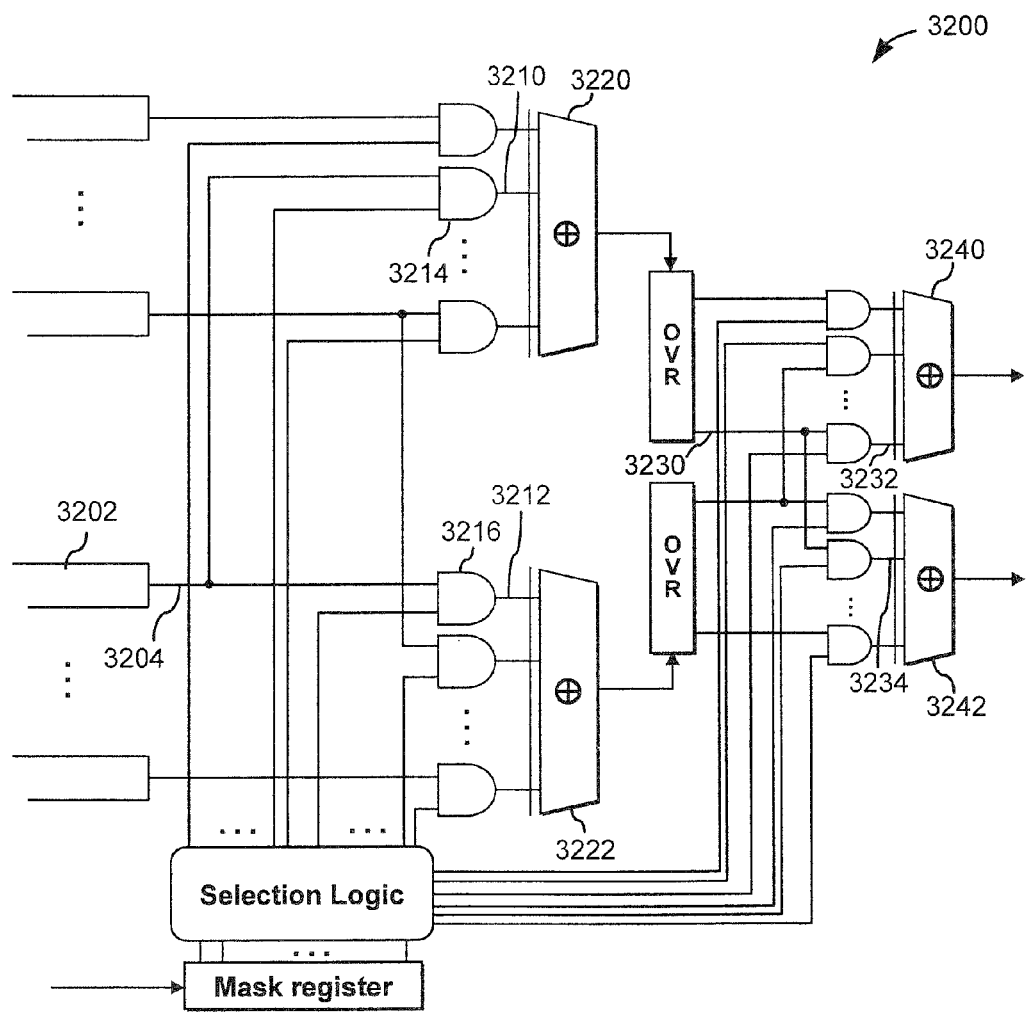
FIG. 32 shows a block diagram of an additional embodiment of a test response compactor architecture.

FIG. 32 shows a block diagram of another embodiment of a test response compactor architecture 3200 where one or more scan chain outputs and/or overdrive register outputs can each drive multiple compactor inputs (for example, the outputs can have fan-out). For example, in the depicted embodiment a scan chain 3202 has a scan chain output 3204 that is coupled to compactor inputs 3210, 3212 through respective masking gates 3214, 3216. Thus the scan chain output 3204 can drive two compactors 3220, 3222. An overdrive register output 3230 similarly drives inputs 3232, 3234 of two second-stage compactors 3240, 3242, respectively.

Figure 33:
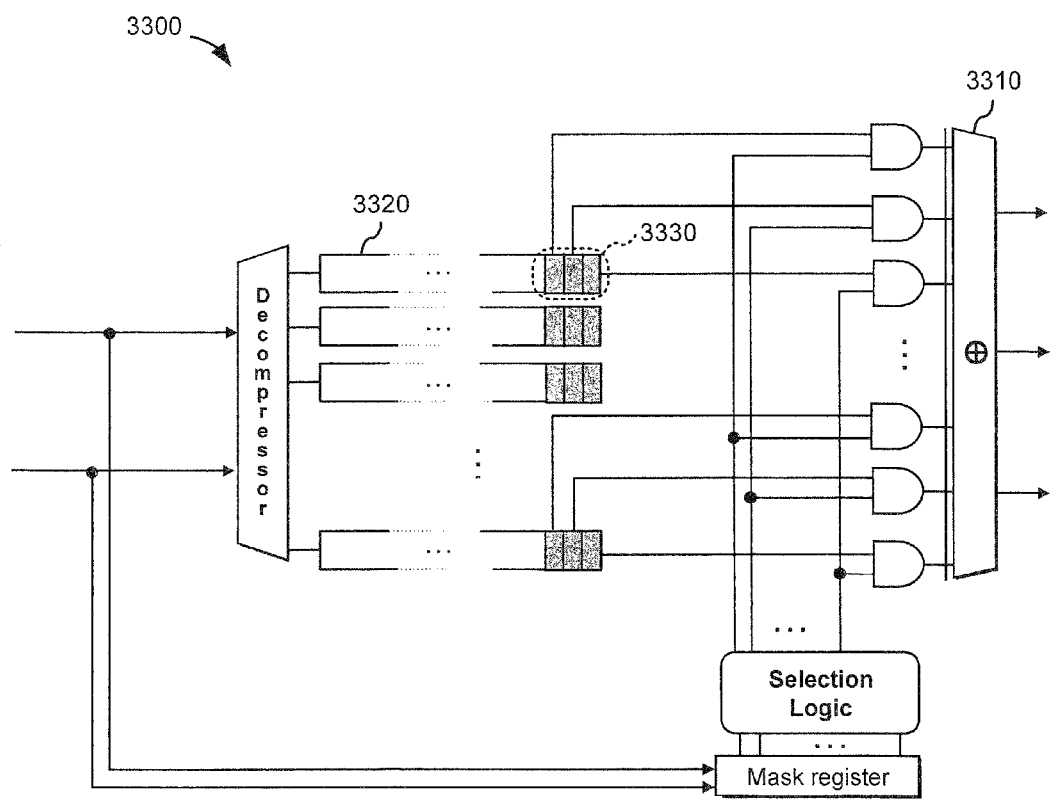
FIG. 33 shows a block diagram of an additional embodiment of a test response compactor architecture.

FIG. 33 shows a block diagram of an additional embodiment of a test response compactor architecture 3300. This embodiment is similar to the architecture 900 of FIG. 9 in that inputs to a compactor 3310 can be loaded in parallel from v cells in a scan chain. For example, a scan chain 3320 provides inputs to the compactor 3310 from the scan cells 3330 of the scan chain 3320. In the depicted embodiment, the compactor 3310 comprises multiple outputs, and the architecture 3300 is a single-stage compactor architecture. In further embodiments, compactor inputs can be loaded from one or more overdrive registers instead of directly from the scan chains themselves, similar to the architecture 800 of FIG. 8.

Masking Signal Selection Methods

The selection of masking signals for selector circuits (for example, in selector circuit 140 of FIG. 1, the mask signals provided by the selection logic 146 to the groups of logic gates 142, 144) can have a significant impact on test quality. Masking signals can be chosen using different methods. In some embodiments, for a given test pattern applied to a circuit design, scan chains are ranked according to one or more factors (for example, potential coverage gains or losses in detecting possible faults that can result from masking or not masking the chain). For purposes of this discussion, a single scan cell is chosen as a primary fault propagation site. This approach allows faults to be handled in a uniform manner. Otherwise, faults with a small number of propagation sites might be difficult to detect due to a dominant position of faults with a large number of observation points.

Figure 10:
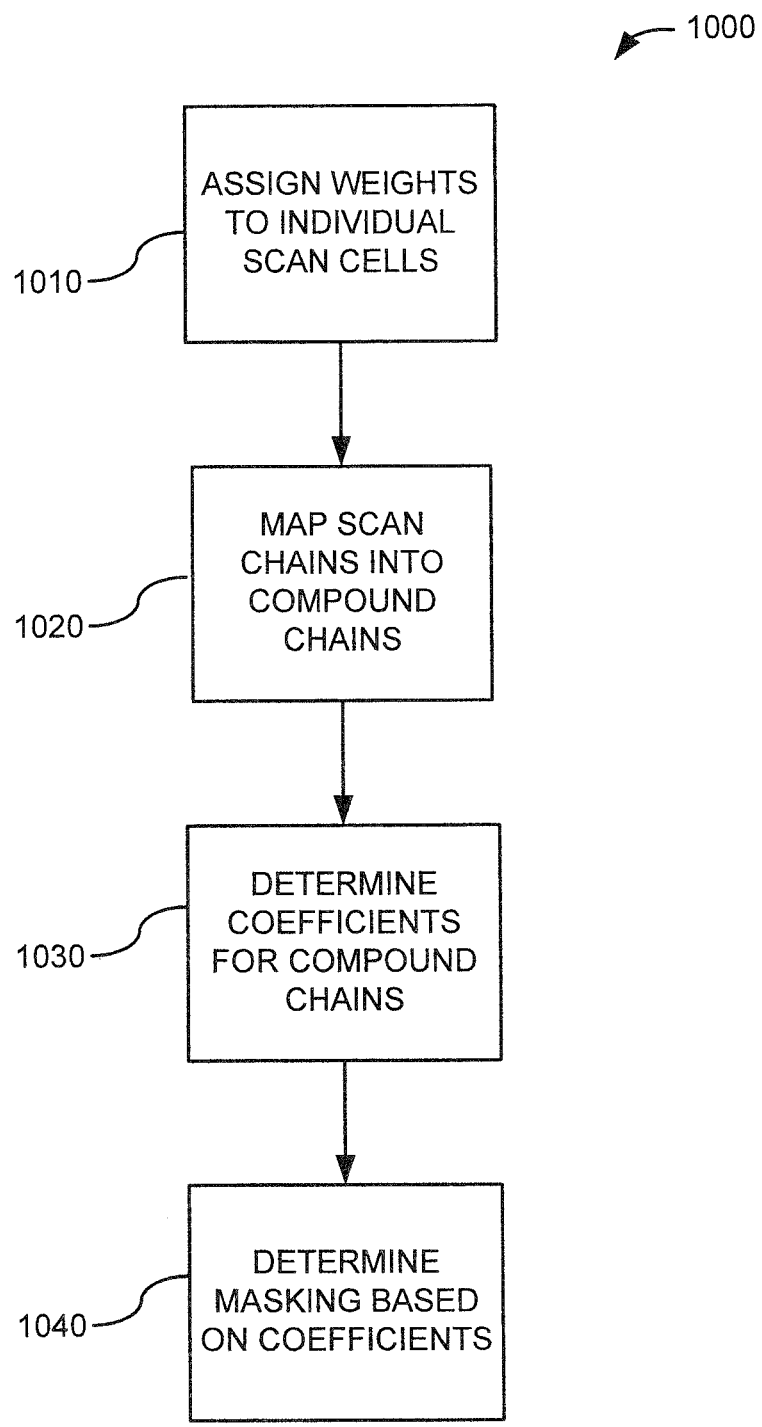
FIG. 10 shows a block diagram of one embodiment of a method for determining masking signals for use with a selector circuit.

FIG. 10 shows a block diagram of one embodiment of a general method 1000 for determining masking signals for use with a selector circuit, such as selector circuit 140. The disclosed embodiment can be performed, for example, for each test pattern of a test set to be applied during testing and can use simulation results (for example, from a simulation of the test pattern being applied to the circuit-under-test) to determine the respective weights to be assigned. The method 1000 can also be used with a variety of compactor architectures (for example, XOR, X-compact, I-compact, and others). In method act 1010, weights are assigned to a plurality of individual scan cells in one or more scan chains. For example, assuming that a given cell is observed, the cell's weight can indicate the cell's contribution to the total error coverage. In some embodiments, weights can be assigned as follows: scan cells that capture unknown states can be assigned a weight of "0"; scan cells that capture don't care states can be assigned a value of "1"; and scan cells which are likely to be affected by faults (termed herein "primary" cells) can be assigned a weight "C." By assigning a weight of 1 to cells capturing don't care states, those cells can be included in analyses that lead to masking decisions. Since faults often propagate to more than one scan cell, it can be beneficial to have such cells observed (for example, if the primary cell is masked). To retain priority among scan cells, however, the weight C associated with primary cells is desirably large enough so that the combined effect of having many or all cells with don't care values observed does not significantly reduce the visibility of one or more primary cells.

Figure 11:
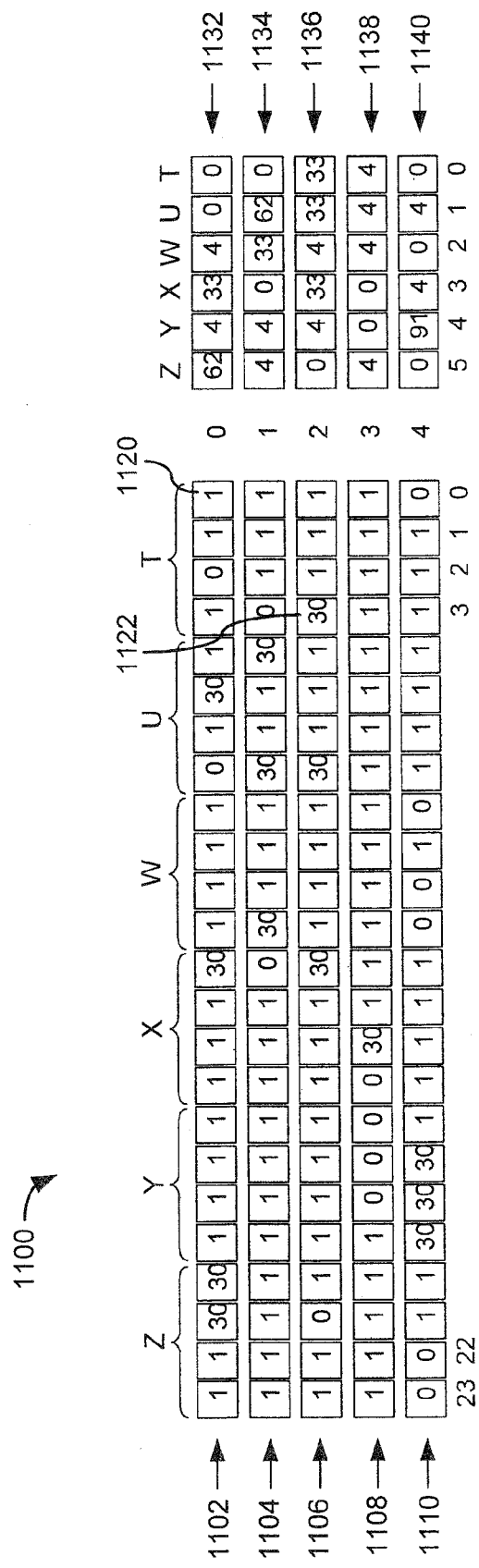
FIG. 11 shows one embodiment of a representation of scan chains.

FIG. 11 shows one embodiment of a representation 1100 of five scan chains 1102, 1104, 1106, 1108, 1110 each comprised of 24 scan cells. The scan cells have been assigned a weight of 0, 1, or 30 (the value of C in this embodiment) according to method act 1010. For example, a scan cell 1120 has been assigned a weight of 1, indicating that it captured a don't care value, whereas scan cell 1122 has been assigned a weight of 30, indicating that it captured a value indicative of the presence of a fault.

Returning to FIG. 10, in method act 1020, the weights for a plurality of the scan cells within one or more of the scan chains are aggregated. The weights are desirably aggregated according to how the scan cells will be compacted during the next compaction stage. For example, in certain exemplary embodiments, the scan chain representation 1100 is mapped to a representation referred to herein as a "compound chain." A compound chain can be created from the weights assigned to a scan chain by representing several scan cells from a chain in a single compound cell. In some embodiments v consecutive scan cells in a chain can be represented by one compound cell. A weight can be assigned to a compound cell based at least in part on values in one or more original scan cells that the compound cell represents. In some embodiments, a compound cell weight is the sum of the weights of the original cells. Additionally, a compound cell can be assigned a weight of "0" if one of the original cells to be included as part of the compound cell has a weight of "0" (for example, if one of the original cells captures an X state). In particular embodiments, this can anticipate, to some extent, possible results of compaction of data provided by an overdrive register. As explained above, an X state that is not suppressed before a first compaction stage can potentially render lots of error data useless, either due to X-masking or due to the second stage gating. In some embodiments, blocking certain X states earlier in a compaction process can help prevent a significant coverage drop.

FIG. 11 shows exemplary embodiments of the scan chains 1102, 1104, 1106, 1108, 1110 mapped into compound chains 1132, 1134, 1136, 1138, 1140, respectively. For ease of reference, in FIG. 11 the scan chains 1102, 1104, 1106, 1108, 1110 are shown divided into 4-cell groups T, U, W, X, Y and Z. The columns of the compound chains (sometimes referred to herein as "time frames") are labeled to indicate which 4-cell group a compound cell represents. For example, the 4-cell group in the T column of compound chain 1136 has a weight of 33, which is the sum of the scan cells in group T of scan chain 1106. The compound cell in column T of compound chain 1132 has a value of 0, since one cell in group T of scan chain 1106 has a weight of 0.

In certain embodiments, mask selection can be based on the weights of the original scan chains instead of the weights of the compound scan chains. This can be used if, for example, no cell or few cells in the compound chains have a weight at least equal to C.

In method act 1030 of method 1000, coefficients (sometimes referred to herein as "scores") can be determined based, for example, on the aggregated weights in one or more compound scan chains. In some embodiments, coefficients $S_i$ and $M_i$ are computed for the compound scan chains. In such exemplary embodiments, $S_i$ is proportional to the estimated number of errors that will be preserved provided scan chain i is selected, and coefficient $M_i$ is proportional to the estimated number of errors that will be preserved if the scan chain i is masked.

Let $X(i)$ be the set of zero-weight cells hosted by the compound scan chain i. Furthermore, for a given c-th cell of all compound scan chains, let $E_c$ and $X_c$ represent the sum of weights over these cells and the number of cells that have weight zero, respectively. Coefficient $S_i$ can then be given by exemplary equation 1:

$$S_i = \sum_c w_{i,c} 2^{-X_c} - \sum_{c \in X(i)} E_c / X_c \qquad (1)$$

where $w_{i,c}$ is the weight of cell c in the compound scan chain i. $S_i$ in equation 1 is equal to the total weight over all cells occurring in a given compound scan chain and scaled by the probability that X states occurring in the corresponding time frames will be masked (it is assumed that a single scan chain is masked with probability 0.5). $S_i$ is affected in equation 1 by the weights $E_c$ associated with the same time frames as those of X states hosted by a given scan chain. $E_c$ is scaled by the number of corresponding X states, in order to avoid double counting. As can be seen, the second component can account for errors which can be X-masked if the scan chain itself is not masked.

As an example, the above quantities for the compound scan chains shown in FIG. 11 can be determined where i=1 (i.e., compound scan chain 1134). In this example, C=30 and $X(1)=\{0, 3\}$ (i.e., cells 0 and 3 of compound scan chain 1 have weights of 0). Also, $E_0=37$, $E_3=70$, $X_0=3$, $X_3=2$. Hence, $S_1$ is computed as:

$$S_1 = 62 \times 0.5 + 33 \times 0.5 + 4 \times 0.5 + 4 \times 0.25 - 37/3 - 70/2 = 3.2 \qquad (2)$$

In some embodiments, the quantity $M_i$ can be determined as:

$$M_i = \sum_{c \in X(i)} E_c 2^{-(X_c - 1)} - \sum_c w_{i,c} (X_c + 1)^{-1} \qquad (3)$$

In this exemplary equation, the first term is equal to the sum over weights $E_c$ corresponding to the same time frames as those of X states (now masked) hosted by a given scan chain, assuming that they are not masked by other unknown states from the same shift cycles. The second term reduces the first by weights of cells occurring in the masked scan chain, calibrated by X's from other scan chains, and including the masked chain itself. In various embodiments, either $S_i$ or $M_i$ can be negative, thus indicating a possible coverage drop when either selecting or gating a given scan chain.

Returning to FIG. 10, in method act 1040, a decision whether to mask a given chain can be made based at least in part on the coefficients (for example, the values of $S_i$ and/or $M_i$ for the chain).

Figure 12:
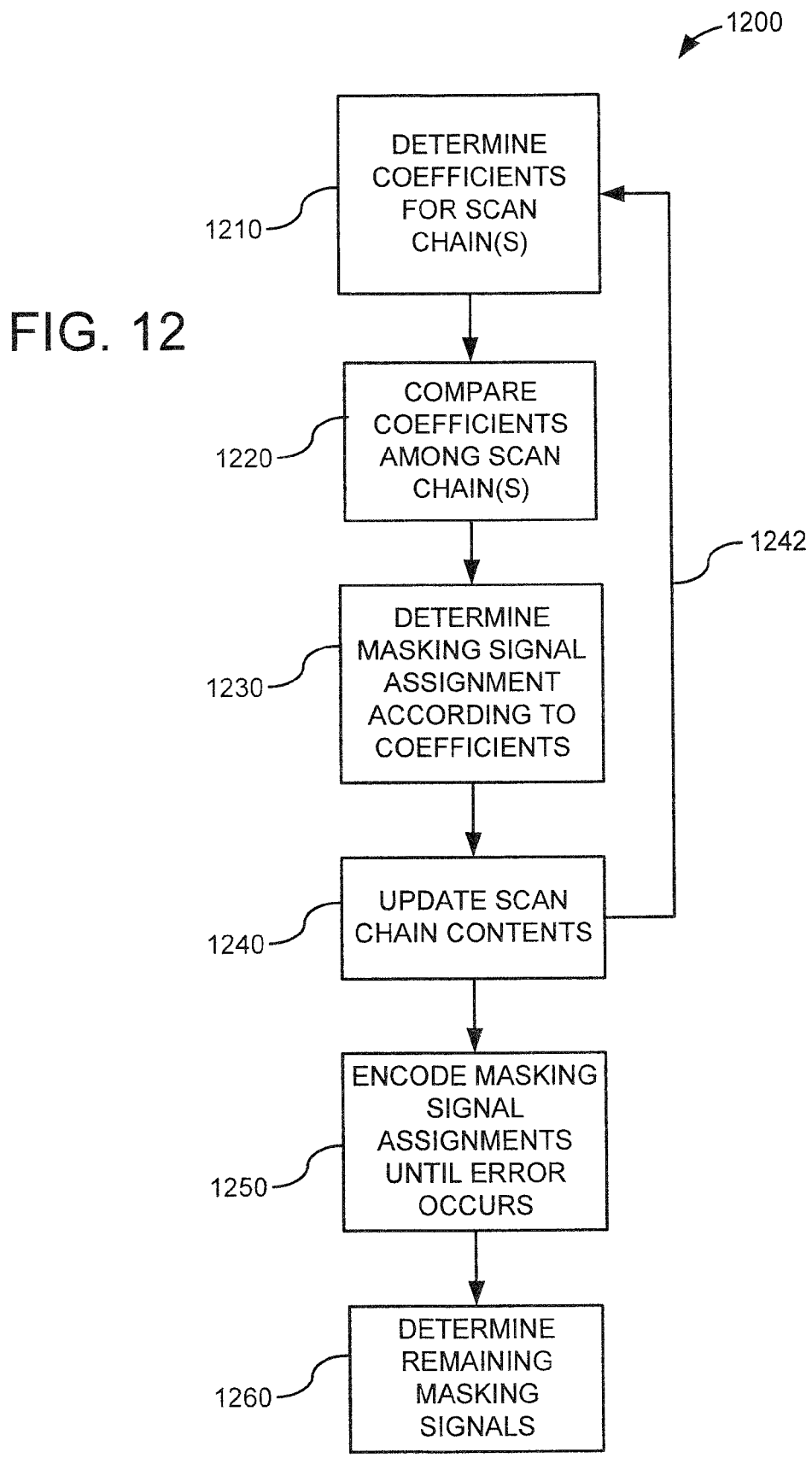
FIG. 12 shows a block diagram of one embodiment of a method for selecting scan chains to mask.

FIG. 12 shows one embodiment of a method 1200 for selecting scan chains to mask, given a test pattern, one or more detected faults, and corresponding locations of failing scan cells and unknown states. Method 1200 can be integrated with the general method 1000 introduced above.

In method act 1210, coefficients (for example, $S_i$ and/or $M_i$) for one or more scan chains are determined. In method act 1220, coefficients for two or more scan chains are compared. In method act 1230, one or more chains can be chosen for selection or masking based at least in part on the coefficients. For example, in some embodiments a scan chain having a large or the largest value of $S_i$ can be assigned a masking bit value of 1, indicating that values from that chain should be passed to a compactor. A scan chain having a large or the largest value of $M_i$ can be assigned a masking bit value of 0, indicating that values from the scan chain should be masked.

In method act 1240, a representation of the contents of the scan chains can be updated based on decisions (which can be preliminary) in method act 1230. For example, in the representation (such as representation 1100), errors and/or X states can be deleted from scan chains that have been assigned a masking value of 0. One or more of the foregoing method acts can be repeated, as indicated by arrow 1242, such that masking bit values can be iteratively assigned to one or more other scan chains.

In method act 1250, the mask bit assignments are encoded. For example, in certain embodiments, this procedure involves assigning the masking signals to the scan chains of the circuit-under-test and determining the necessary mask bits to be input into the selection circuit to achieve the desired masking. In particular embodiments, the masking signals are assigned according to values of $S_i$ or $M_i$ and are considered sequentially in the order in which the scan chains were considered in the above method acts. In certain embodiments, this confirmation procedure involves solving linear equations to determine whether and how the desired masking signals are to be generated in the selection circuit. In the illustrated embodiment, the process proceeds until the first encoding error occurs (for example, the first scan chain is considered that cannot have the masking signals preliminarily assigned to it). Furthermore, in one particular embodiment, regardless of the order determined by coefficients $S_i$ and $M_i$, the encoding process starts with a scan chain whose mask signal is 1. This modification can be implemented to prevent all masking bits from being set to 0 by encoding, at the very beginning of the procedure, masking signals for a large group of scan chains that should be masked. Such an approach would potentially make all scan chains unobservable.

In method act 1260, the remaining unencoded masking signals that were not the subject of encoding are evaluated and encoded, if possible, in view of the selector architecture.

In additional embodiments, the selection method described above can be applied to the second stage of compaction as well. In such embodiments, masking signals can be determined with respect to values in compressed cycles, such as the compressed cycles 302, 304, 306 of FIG. 3. Weights can be assigned to the values in the compressed cycles. A weight can be related to, for example, an error count indicating how many of the scan cells (in unmasked chains) from which the compressed value was produced are fault propagation sites. In some embodiments, if a given scan cell captures an X and the cell's scan chain is not masked, a certain weight (for example, 0) can be assigned to a compressed value produced from the cell.

Exemplary Experimental Compaction Results

An exemplary embodiment of the test circuit compactor architecture illustrated in FIG. 1 was tested on several industrial designs. In the reported experiments the mask register was loaded once per pattern. Such an approach contributed a relatively small amount of data to the total volume of test data and consequently did not compromise the overall compression ratio. Generally, the presence of X states and the use of selection logic can cause several test escapes when applying original test patterns. Therefore, top-up patterns were used to restore the complete fault coverage. The corresponding increase in pattern count and the effective compression can be used as basic figures of merit to assess the performance of the compaction scheme.

Figure 13:
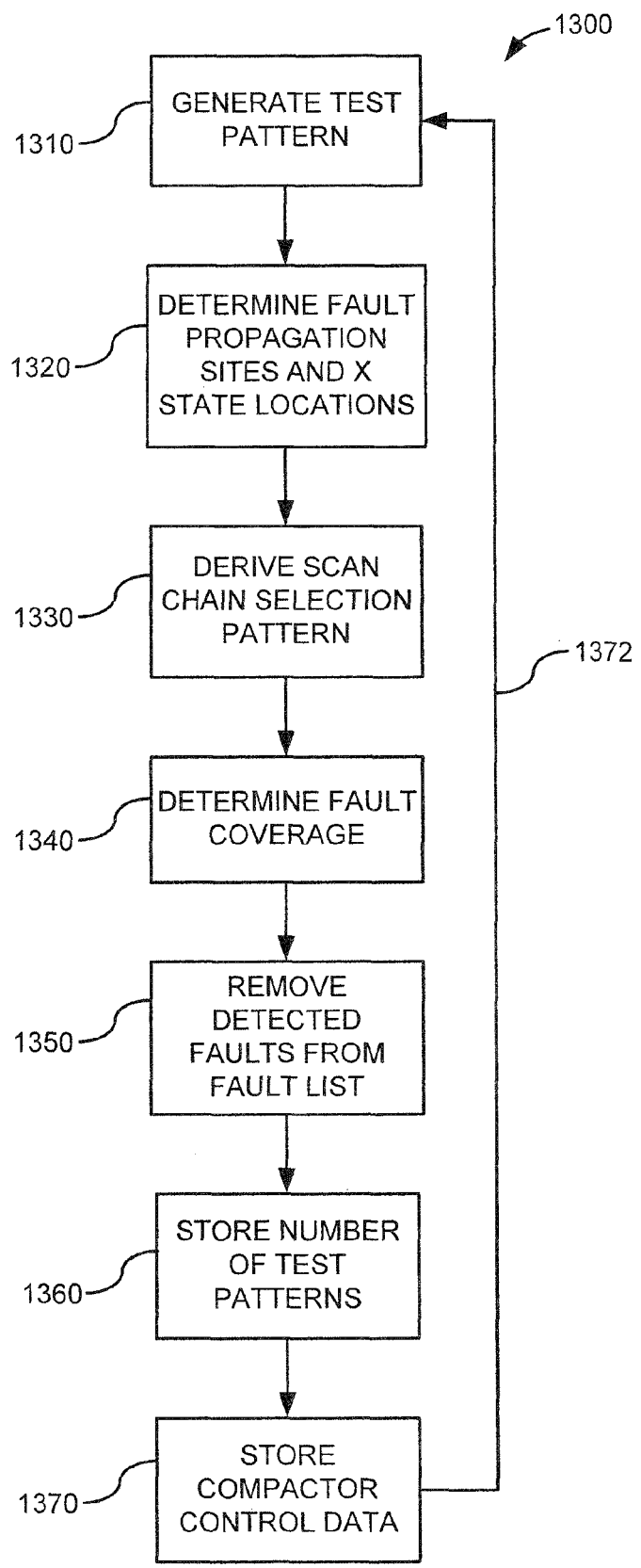
FIG. 13 show a block diagram of one embodiment of a method for using test patterns in the presence of a selective compactor.

FIG. 13 shows a block diagram of a method 1300 for using test patterns with a selective compactor (for example, the compactor architecture 100 of FIG. 1). The method 1300 was used for obtaining experimental results described below. Starting with an original fault list, in method act 1310 a test pattern was generated, and in method act 1320 fault propagation sites and X state locations were determined for one or more scan chains in the test circuit architecture. For example, the application of the test pattern to the circuit-under-test and the circuit-under-test's response to the test pattern (the test response) can be simulated. In method act 1330 values for masking or selecting scan chains and/or overdrive register values were determined (using method 1200 described above). In method act 1340, fault coverage was examined in view of the determined masking values. In method act 1350, detected faults were removed from the original fault list. In method act 1360, the number of test patterns used to arrive at a given level of fault coverage was recorded, and in method act 1370 the mask bits for controlling the compactor were also stored. The method 1300 was repeated until the faults on the original fault list were detected, as indicated by arrow 1372.

The results of the experiments are summarized in Table 1 (appearing in FIG. 14) and in Table 2 (appearing in FIG. 15). For each circuit the following information is provided: name, scan architecture, and the total number of faults; the total number of error bits (the number of scan cells that capture erroneous signals); the number of test patterns which contribute to the fault coverage ("FC") assuming that there is no compaction; the sequential depth of deployed test patterns; the X-fill rate computed as a ratio of the total number of captured X states to the number of scan cells multiplied by the number of test patterns; the size m of the mask register; the size v of the overdrive register; the total number of patterns and the corresponding increase in pattern count represented as absolute values (in the columns labeled "IPC"), and as a percentage of the original number of tests (in the columns labeled "%"); and the effective compaction ratio C. In Tables 1 and 2, $C=AsL/T (L/v+c)$, where A is the number of original patterns, T is the total number of test patterns, s is the number of scan chains, L is the size of the longest scan chain, and $c=m+v$ is the amount of X-Press compactor control data (for example, the number of mask bits).

The experiments were run using four values of m, starting from the smallest one required by a given scan chain configuration, eight values of the overdrive factor v, and a single-output compactor. Circuits reported in Tables 1 and 2 feature a wide range of X-fill rates starting from about 0.001% (C6) up to about 2.6% (C7). Consequently, the resultant increase in a pattern count significantly varies from less than 1% for circuits with a low X-fill rate (for example, C6) up to as much as 111%, if a design sees a high percentages of X's (for example, C7). Furthermore, it appears that the sites at which unknown states are captured as well as frequency of their occurrence may play a role in this variation. For example, it has been observed that X states populate the majority of scan chains in designs C2, C7, and C8 in a uniform manner across all test patterns. On the other hand, there are only a few scan chains with high concentration of X states in design C5. In this case, the majority of scans had low X-fill rates or did not feature unknown states at all. As a result, design C5 with X's confined to a small fraction of scan cells (1.41%) required 3% to 16% more patterns to recover the full coverage. Though designs C2 and C8 featured three times fewer X's, the corresponding increase in pattern count ranged between 40% and 80%.

Design C7 illustrates a "worst case" scenario where many unknown states (the highest percentage among the reported circuits) formed hard-to-handle clusters. In this particular case, the pattern count increase remained below 111%. The impact of X states can be more pronounced if one compares the highest (highlighted) achieved compaction ratios C against quantity s·v, (the ideal compaction in the absence of X's and in the absence of control data). Table 3 reports such a compaction efficiency as 100C/sv (in the first column). As can be seen, the compaction efficiency decreases with the increasing value of the overdrive factor (and compaction), which indicates that the control data becomes a component to consider once the high compaction ratios are concerned.

TABLE 3

Compression efficiency of circuits used for obtaining experimental results.

| | | Overdrive | | | | | | | |
|---|---|---|---|---|---|---|---|---|---|
| X's (%) | Design | 1 | 2 | 3 | 6 | 6 | 8 | 12 | 16 |
| 0.001 | C6 | 98 | 97 | 95 | 93 | 89 | 84 | 76 | 67 |
| 0.003 | C3 | 96 | 92 | 89 | 85 | 78 | 72 | 60 | 49 |
| 0.04 | C4 | 80 | 69 | 64 | 61 | 52 | 47 | 37 | 30 |
| 0.04 | C1 | 81 | 69 | 59 | 58 | 48 | 43 | 32 | 25 |
| 0.44 | C8 | 70 | 67 | 64 | 62 | 57 | 53 | 46 | 39 |
| 0.44 | C2 | 62 | 58 | 54 | 52 | 47 | 42 | 35 | 28 |
| 0.83 | C9 | 87 | 84 | 81 | 80 | 77 | 74 | 72 | 69 |
| 1.41 | C5 | 81 | 73 | 66 | 59 | 48 | 40 | 28 | 20 |
| 2.62 | C7 | 56 | 51 | 46 | 43 | 38 | 33 | 31 | 24 |

The experimental results also show another trade-off. In at least some cases, relatively large mask registers are needed to gain the maximum compaction for small overdrive factors, especially if the X-fill rate is high (C7, C8). As the compaction increases with the increasing value of v, however, the amount of control data becomes a factor for consideration. Thus, to achieve a high degree of compaction, smaller registers can be used even though the pattern count may not be as low as it would otherwise.

Exemplary Embodiments of Selector Circuitry and Selector Circuitry Synthesis

In this section, additional exemplary embodiments of scan chain selection logic and methods for creating such scan chain selection logic are described. The disclosed apparatus and methods can be used with either or both of the stages in the multi-stage compactor embodiments described above. The described methods and apparatus can also be used in connection with a single-stage compactor (for example, a single XOR or XNOR tree) or other space compactor. For instance, the following discussion generally describes the exemplary apparatus and methods in connection with a single-stage compactor, though the disclosed principles are readily applicable to multi-stage architectures.

Some embodiments of the disclosed technology can act as flexible X state control logic for test response compactors. Embodiments of the disclosed technology can provide good observability of scan errors, even for test responses having a large percentage of X states. Embodiments of the disclosed selection logic can also be efficient in terms of silicon area and the amount of information required to control them. Embodiments of the disclosed circuitry can also be employed to selectively gate scan chains for diagnostic purposes.

As noted above, FIG. 1 shows an exemplary embodiment of the selector circuit 140 comprising selection logic 146 and a mask register 148. The selection logic 146 can be a linear logic circuit configured to provide inputs to at least some of the first and second groups of logic gates 142, 144. In some embodiments, one or more of the logic gates are AND gates, and in further embodiments one or more other types of logic gates can also be used (for example, OR, NOR, NAND, as well as other types). The inputs provided to the logic gates can be as follows: a "0" can be provided to block values from a scan chain or a compressed output in an overdrive register (for example, to suppress unknown states or to disable scan chains for other reasons such as fault diagnosis and silicon debugging); a "1" can be provided to pass uncompressed test response bits from a scan chain or compressed test response bits from an overdrive register (for example, to pass the values into a compactor, as they may carry test response bits containing errors captured in scan cells of the scan chains); and a "don't-care" value can be provided to indicate that scan chains or overdrive register locations have content that is not regarded as critical (for example, the logic gates can receive either a 1 or a 0 as gating signals).

In some embodiments, a mask bit or masking instruction bit for each or substantially each logic gate in a selector circuit (for example, for one or two stages of compactors) is provided to the selector circuit. This can provide total or near-total control over which test response bits are masked. However, in some embodiments, particularly those with a relatively large number of logic gates, this approach can be impractical and can significantly increase the test circuit architecture overhead. Additionally, the amount of control data can significantly lower the compression ratio of the architecture.

Figure 16:
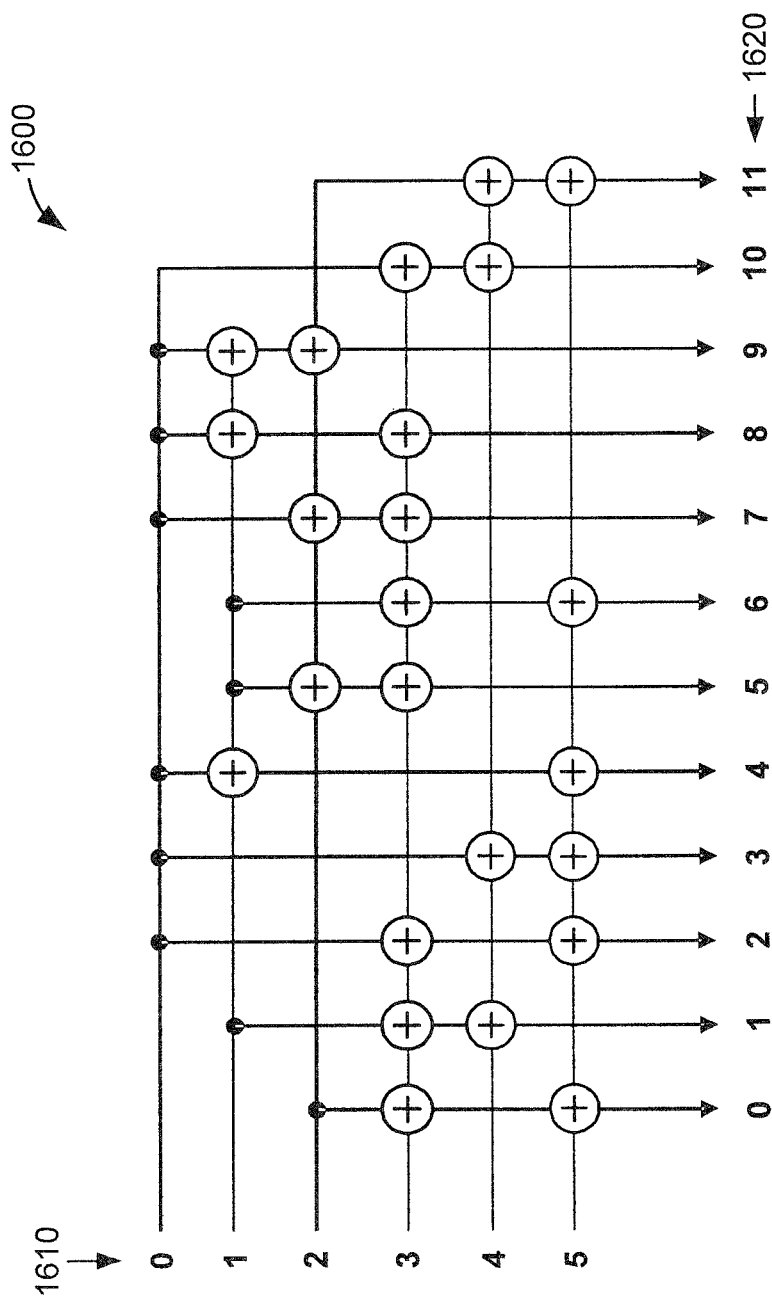
FIG. 16 shows one embodiment of a selection logic circuit.

In particular embodiments, the selection logic 146 comprises a combinational circuit configured to provide masking signals to one or more of the logic gates according to a set of mask bits. The combinational circuit can be defined at least in part in terms of selector polynomials indicating how particular mask bits (stored, in some embodiments in the mask register 148, which can comprise one or more stages) are connected to the outputs of the selection logic 146. In certain desirable embodiments, the selection logic 146 can be designed as an m-input, n-output linear mapping circuit, where m is the number of mask bits, n is the number of scan chains (or the number of cells in the overdrive register 150), and m<<n. An output can then be obtained by XOR-ing a given number F of inputs. One embodiment of such a circuit 1600 is shown in FIG. 16 for m=6, n=12, and F=3. The inputs 1610 appear on the left-hand side of the figure, while the outputs 1620 appear along the bottom of the figure. In further embodiments, the circuit 1400 can comprise two portions, for example, m-input, n-output and r-input, v-output linear mapping circuits, respectively, where m+r is the total number of mask bits, n is again the number of scan chains, and v is the size of the overdrive register.

In some embodiments, v is small relative to the number n of scan chains. This can allow for use of a small number of mask bits controlling the second stage, thereby reducing that portion of the selection logic to a v-bit register which only stores the masking signals. In such cases, there is ordinarily no need to implement separate encoding logic.

Embodiments of exemplary methods for synthesizing a circuit such as the circuit 1600 are described below. In some of the disclosed embodiments, synthesis of the selection logic can be primarily aimed at achieving high encoding efficiency, which is defined as a ratio of successfully encoded pre-specified gating signals to the number m of mask bits. This objective can be important, as a failure to encode a single gating signal may result in a significant coverage drop by having an entire scan chain be unobservable. (However, in some embodiments adequate results can still be obtained even if a system does not provide absolute control over which test results are masked.) This is in contrast to test pattern compression, where missing one specified bit typically does not jeopardize the quality of a test to any great extent. Since encoding efficiency is directly related to the probability of linear dependency among selector polynomials, the task of designing a desirable selector can be guided by data indicating the probability that some of a first set of polynomials and some possible "candidate" polynomials will form one or more linearly dependent sets. Using this information, and according to one exemplary embodiment, synthesis can be carried out n times by means of a selection procedure as described below.

Figure 17:
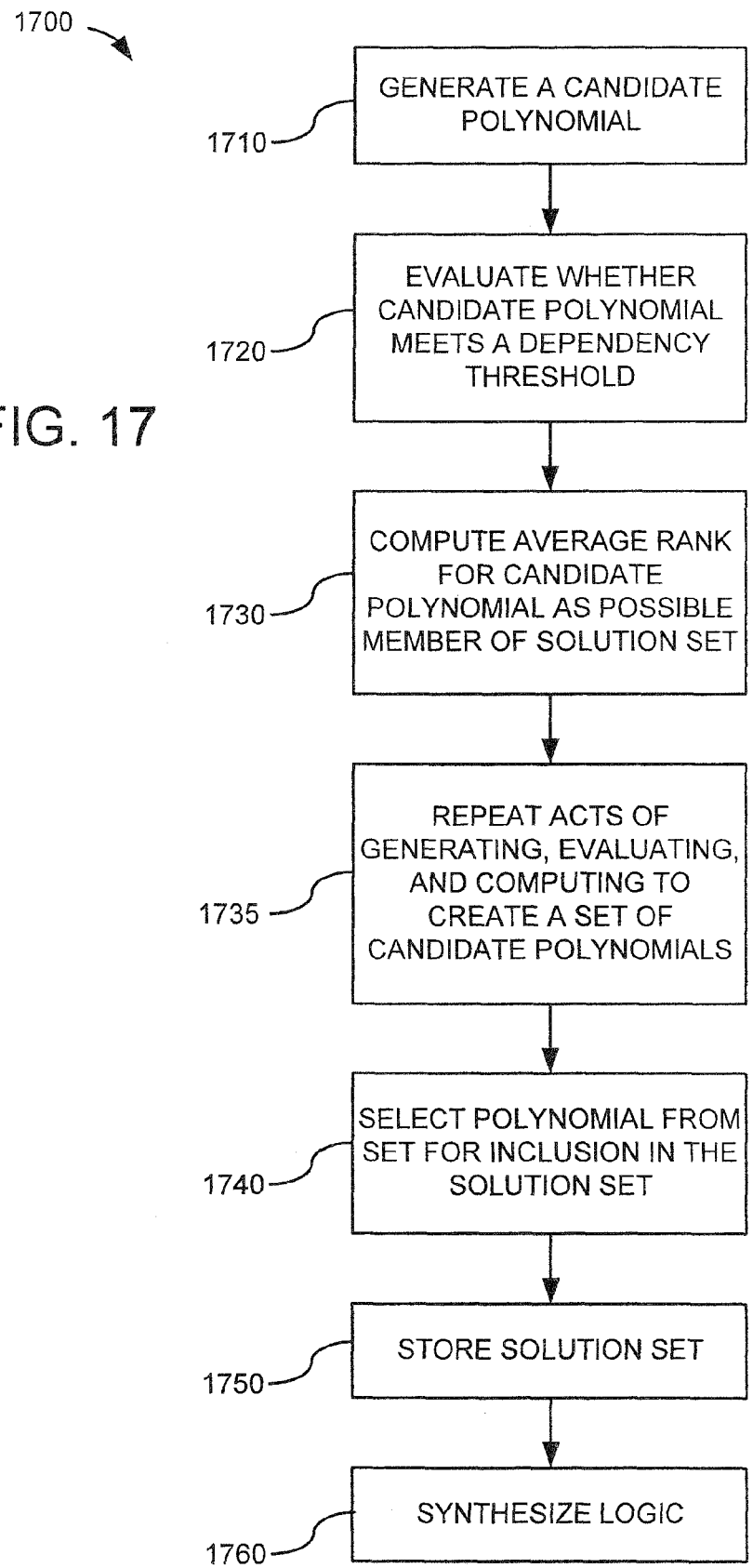
FIG. 17 shows a block diagram of one embodiment of a method for generating control logic for a selection circuit.

FIG. 17 shows one embodiment of a method 1700 for generating control logic for a selection circuit. In method act 1710 a first candidate polynomial is generated. In some embodiments, the first polynomial is generated randomly, but in further embodiments alternative methods can be used.

In method act 1720, the generated polynomial is evaluated to determine whether it meets a dependency threshold relative to polynomials in a solution set. In some embodiments, the solution set can initially be generated randomly, while in further embodiments it can be generated in a lexicographic order. For example, the candidate can be examined to verify that it shares no more than a given or fixed number of mask bits with some or all polynomials in the solution set. If the candidate polynomial shares more than the given number (for example, a predetermined number, which can be user-selectable), then the candidate polynomial is discarded and a new polynomial generated. This can be useful for reducing linear dependency among polynomials of the solution set.

In method act 1730, the candidate polynomial is grouped into an m-element set with accepted polynomials from the solution set (this set is sometimes referred to as the "test set"). The solution set polynomials for this method act can be chosen randomly from the solution set. The rank of this m-element set can be determined (for example, using Gaussian elimination to determine the reduced row-echelon form of the m-element set). This can be repeated with the candidate polynomial grouped into a plurality of different m-element sets using different solution set polynomials. In particular embodiments, an average rank can be computed for the candidate polynomial.

In method act 1735, the above method acts are repeated for multiple additional candidate polynomials to create a set of candidate polynomials (for example, each an average rank). The number of candidate polynomials in the set can be any number.

In method act 1740 one or more polynomials from the set of candidate polynomials are selected for inclusion in the solution set. In some embodiments, a candidate polynomial having a high or the highest average ranks is selected. In some embodiments, method acts 1710, 1720 and 1730 can be performed with multiple polynomials at a time, rather than with a single polynomial.

In method act 1750, a description of the solution set is stored in one or more computer-readable media or displayed (for example, on a computer screen). In some embodiments, and at method act 1760, a selection logic circuit is synthesized according to the solution set. Method 1700 can be used to generate control circuitry for applications besides those disclosed herein (for example, it can be used to generate control circuitry in general).

Data (in some embodiments, compressed data) used to control a selector circuit can be delivered to the circuit in a number of ways. In some embodiments, if the selector circuit is integrated with an embedded deterministic test environment, for example, the data can be uploaded through a test data decompressor. For instance, the data can be regarded as additional specified bits and become the subject of an encoding process in a manner similar to that of actual test cubes. This approach, however, can create a feedback loop in the test pattern generation process. For instance, once generated, a test cube can be subsequently compressed and decompressed to obtain a random fill used by a fault simulator to help identify detected faults. At this point, mask bits can be uniquely determined. If they are to become part of the compressed stimuli, however, then the whole process of compression, decompression, and fault simulation typically has to be repeated. As a result, the random fill changes, and the masking signals already assigned can be less effective than previously determined. Furthermore, adding new specified bits to the stimuli may cause the encoding process to fail. A typical ATPG engine produces test patterns incrementally by gradually adding new target faults. In this scheme, one usually has to decide whether to perform compression, decompression, and fault simulation after adding every fault to the pattern or to work with the final test pattern and remove some faults if mask bits cause the pattern to fail compression. The latter approach could also result in multiple computationally intensive compressions, decompressions, and fault simulations for each pattern.

In some embodiments mask bits can also be specified at some point of the ATPG process before the final test pattern is generated. Even then, however, the sites of X states are typically unknown until random fill is performed. Assigning mask bits can again result in decompression and fault simulation, and the issue of mutual dependency between test stimuli and mask bits would remain.

In other embodiments, one or more extra channels (or input paths) can be used to drive the selector register directly. This can allow for specification of mask bits independently of the stimuli loaded into the scan chains. The stimuli in this approach do not necessarily depend on the selector mask bits. This approach can be used, for example, when the size of the longest scan chain does not significantly exceed the total size of the selector register for the one or more extra channels. In such a case, input taps for the selector registers are desirably inserted between channel input pin(s) and the decompressor. Additional shift cycles can then be used rather than extra input pins to deliver the masking data. The use of a single input channel decompressor is also possible.

In some embodiments, test pattern data is provided to a circuit (for example, a decompressor) on one or more channels during a first interval, and masking instructions are provided to a selector logic circuit on one or more of the selector channels during a second interval. This can allow a circuit to "share" one or more channels among test pattern data and masking instructions. Such a configuration can be implemented using, for example, components 160, 162 of FIG. 1. In particular embodiments, the first interval precedes the second interval, while in further embodiments the second interval precedes the first interval. In additional embodiments, the first and second intervals can be comprised of sub-intervals at least partially interspersed among one another.

Exemplary experimental results of method 1700 are presented in Table 4 below. Table 4 gives the probability of linear independence for two exemplary selection logic circuits (m=32 or m=34, F=3) driving logic gates for n=128 scan chains. The number of specified gating signals ranges from 16 to 32. For comparison, also included are the results reported in I. Bayraktaroglu and A. Orailoglu, "Test volume and application time reduction through scan chain concealment," *Proc. DAC*, pp. 151-155, 2001 ("Ref. 1"), for purely random linear stimuli decompressors. The improvement, with respect to probability of linear dependence, realized by the approach of method 1700 over the scheme used in Ref. 1 is shown in the table. For instance, given a likelihood of linear independence, embodiments of selection logic circuits created according to method 1700 are capable of encoding approximately four more specified bits than the circuitry of Ref. 1 for the same values of m and n. Also, with the increasing number of specified bits, the probability of linear independence remains much higher once the number of specified bits becomes close to the number of mask bits.

TABLE 4

Probability of linear independence (%).

| Spec. bits | Mask register size (m) | | | |
|---|---|---|---|---|
| | 32 | 34 | 32 (Ref. 1) | 34 (Ref. 1) |
| 16 | 99.74 | 99.85 | 98.87 | 99.50 |
| 18 | 99.53 | 99.77 | 97.80 | 98.68 |
| 20 | 98.82 | 99.51 | 96.17 | 97.42 |
| 22 | 97.75 | 98.85 | 91.39 | 94.05 |
| 24 | 95.34 | 97.46 | 77.99 | 84.79 |
| 26 | 89.37 | 94.77 | 54.69 | 67.22 |
| 28 | 75.47 | 88.32 | 26.71 | 40.24 |
| 30 | 46.70 | 73.73 | 7.09 | 16.48 |
| 32 | 9.34 | 45.10 | 0.68 | 4.48 |

Below are results of experiments measuring the encoding efficiency of embodiments of selection logic circuits created according to methods described above. Given values of m, n and F, each experiment was executed according to a method comprised of a number of successive stages. In a stage k, it was determined (by solving the corresponding linear equations) whether k specified bits (masking signals) could be encoded in the logic circuit. The specified bits subjected to encoding in act k were obtained by adding a new specified bit to those bits that had already been used in stage k−1. As these experiments were characterization experiments, the new specified bit was set randomly in terms of an output selected in a logic circuit and the value requested from the circuit. The process continued until the first failure. In such a case, the number of bits that were encoded (those used in the previous method act) was recorded by incrementing a corresponding entry of a histogram. Subsequently, a new combination of gating bits became the subject of encoding.

Table 5 shows results for F=3 and 5. Data in Table 5 assume a form $E_s$, where s indicates in each case how many stages of the mask register are shared (at most) by any pair of the selector polynomials. Each entry of the table corresponds to the average number of scan chains whose gating signals can be encoded. As an example, consider a 64-output selector using trinomials (F=3) and a 32-bit mask register. The resultant encoding efficiency is equal to 98.23%. In other words, this logic is able to encode, on the average, 32×0.9823=31.43 gating signals (scan chains). The ability to control such a large fraction of outputs can be advantageous given the fact that only a small percentage of scan chains usually contain a vast majority of unknown (X) states. Although the encoding efficiency slightly decreases with the increasing number of scan chains, in all examined cases it remained well above a 90% threshold. At the same time, the encoding efficiency increased with the increasing value of F. This indicates a trade-off between the hardware cost of the selector and its performance.

TABLE 5

The average encoding efficiency (%).

| | Number of outputs | | | |
|---|---|---|---|---|
| | 64 | 128 | 192 | 256 |
| F = 3 | | | | |
| m | | | | |
| 12 | $99.27_2$ | $98.85_2$ | $98.31_2$ | — |
| 16 | $98.05_2$ | $96.69_2$ | $95.99_2$ | $96.28_2$ |
| 24 | $97.70_1$ | $95.50_2$ | $94.61_2$ | $94.42_2$ |
| 32 | $98.23_1$ | $95.97_1$ | $94.17_1$ | $94.17$ |
| 40 | $98.59_1$ | $96.02_1$ | $95.22_1$ | $93.96_2$ |
| 48 | $99.21_1$ | $96.54_1$ | $95.38_1$ | $94.84_1$ |
| 56 | $99.41_1$ | $96.90_1$ | $95.42_1$ | $94.92_1$ |
| F = 5 | | | | |
| m | | | | |
| 12 | $100.68_4$ | $100.68_4$ | $100.50_4$ | $100.17_4$ |
| 16 | $100.30_3$ | $100.11_3$ | $99.64_3$ | $99.89_4$ |
| 24 | $99.91_2$ | $99.88_3$ | $99.58_3$ | $99.52_3$ |
| 32 | $99.90_2$ | $99.67_2$ | $99.62_2$ | $99.65_2$ |
| 40 | $100.02_2$ | $99.65_2$ | $99.61_2$ | $99.66_2$ |
| 48 | $99.99_1$ | $99.88_2$ | $99.59_3$ | $99.65_2$ |
| 56 | $100.05_1$ | $99.71_2$ | $99.56_2$ | $99.59_2$ |

Figure 18:
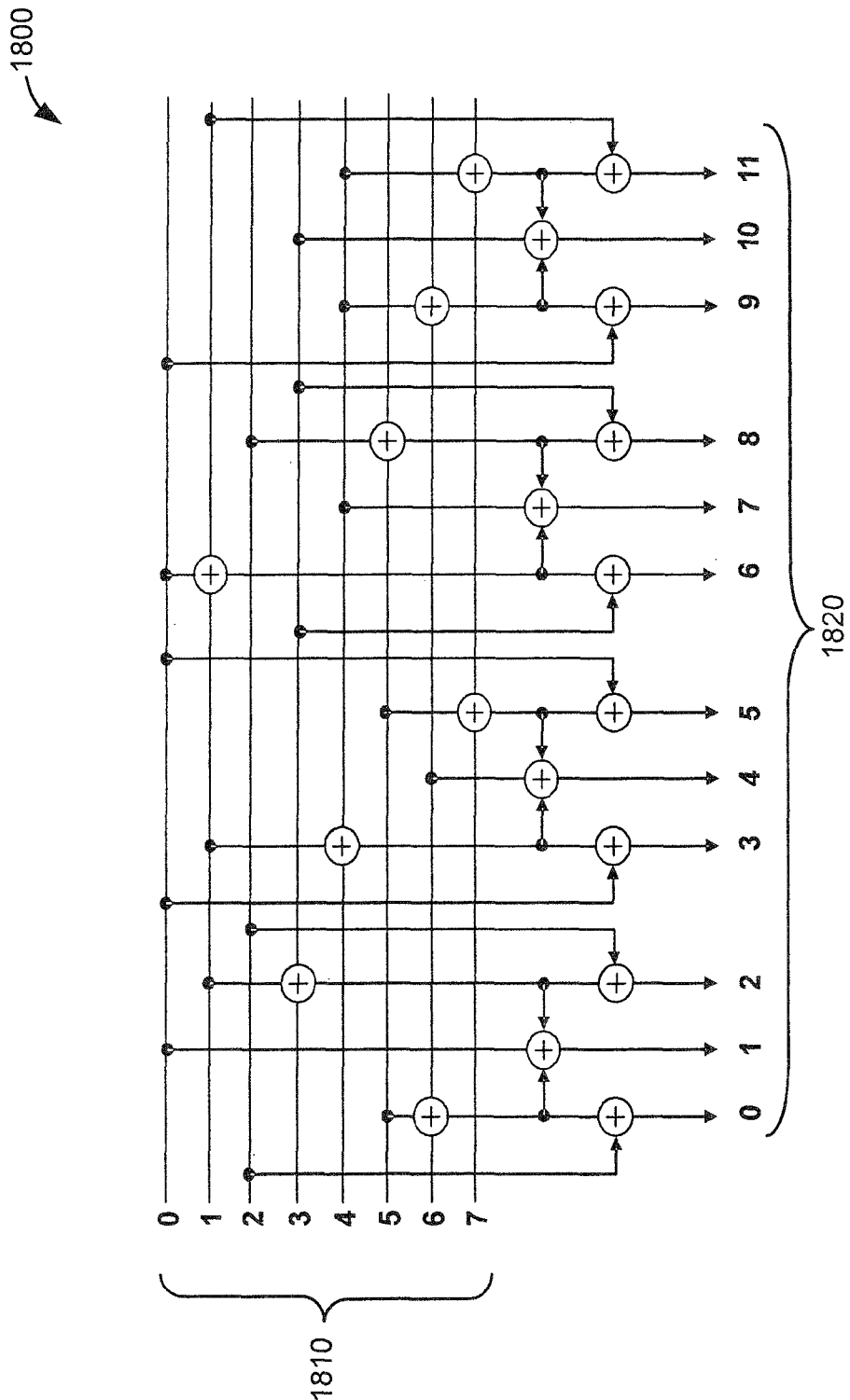
FIG. 18 shows one embodiment of a selection logic circuit.

This observation can be used to design a selection logic circuit with further enhanced performance, while the hardware cost remains the same as that of circuits with F=3. An exemplary embodiment of such a design is shown in FIG. 18 as a circuit 1800 with inputs 1810 and outputs 1820. In the exemplary architecture, certain trinomials were replaced with their 5-term counterparts (pentanomials) in such a way that the latter items are formed by re-using, in each case, two 2-input XOR gates (say a⊕b and c⊕d) already used to implement some trinomials. In some embodiments, a pentanomial can then be formed by using only two 2-input XOR gates as follows: (a⊕b)⊕(c⊕d)⊕e, where e is the fifth term of a newly created polynomial. For example, in circuit 1800 outputs 1, 4, 7 and 10 are outputs implementing pentanomials.

In certain embodiments, synthesis of a selection logic circuit can include Stinson's hill climbing procedure to refine a circuit obtained using method 1700. When the exemplary method 1700 is completed, in some embodiments an associated average rank can be determined for one or more selector trinomials. One or more trinomials having lower or the lowest ranks can be replaced with one or more pentanomials created based on trinomials with higher ranks. In further embodiments, several candidate pentanomials can be formed, and the ones with the highest ranks can be added to the solution set. Generally, the number of pentanomials added to the solution set cannot exceed n/3.

Table 7 illustrates one set of experimental results examining performance of a selection logic circuit where F is equal to 3 for some polynomials and equal to 5 for others. Other parameters are the same as those used to generate the results of Table 5. Table 6 uses the same notation as Table 5.

TABLE 6

The average encoding efficiency for F = 3 and 5.

| | Number of outputs | | | |
|---|---|---|---|---|
| m | 64 | 128 | 192 | 256 |
| 12 | $100.62_2$ | $100.04_2$ | $99.95_2$ | — |
| 16 | $99.49_2$ | $98.39_2$ | $98.34_2$ | $98.19_2$ |
| 24 | $99.09_1$ | $98.06_2$ | $97.60_2$ | $97.69_2$ |
| 32 | $99.42_1$ | $98.30_1$ | $97.59_2$ | $97.38_2$ |

TABLE 6-continued

The average encoding efficiency for F = 3 and 5.

| m | Number of outputs | | | |
|---|---|---|---|---|
|  | 64 | 128 | 192 | 256 |
| 40 | 99.59$_1$ | 98.36$_1$ | 97.90$_1$ | 97.57$_2$ |
| 48 | 99.89$_1$ | 98.68$_1$ | 98.06$_1$ | 97.78$_1$ |
| 56 | 100.25$_1$ | 98.73$_1$ | 98.07$_1$ | 97.77$_1$ |

Exemplary embodiments of applying the scan chain selection logic in a single-stage compaction scheme were further tested on several industrial designs. For each tested design, only a single scan cell was chosen as a primary fault propagation site. Hence, application of method 1700 was able to better enable a uniform handling of faults, especially those with a small number of propagation sites which might otherwise be blocked. Indeed, as shown below, embodiments of the exemplary selection algorithm can often handle such masking decisions, as faults with a large number of observation points would play a dominant role. In the test circuit architecture used for generating the following experimental results, a single-output XOR tree was used as a combinational test response compactor. A mask register in a selector circuit was loaded once per pattern. Such an approach required providing a negligible amount of additional data for masking signals, and thus it did not significantly compromise the compression ratio. It also prevented timing closure violations. With this masking scenario, X states can hinder observability of certain errors in a twofold manner. If a given X state is not suppressed, then it can be difficult to observe errors captured at the same scan-out cycle and arriving from scan chains the X state is XOR-ed with. On the other hand, blocking an X state typically hides all errors occurring in the same scan chain.

In the results below, an increase-in-pattern-count figure was employed as a figure of merit to assess performance of the scheme. Indeed, when original test patterns are applied, several test escapes can be observed due to X states and the use of selection logic. Hence, one typically should apply a number of top-up patterns until complete fault coverage is restored.

Figure 19:
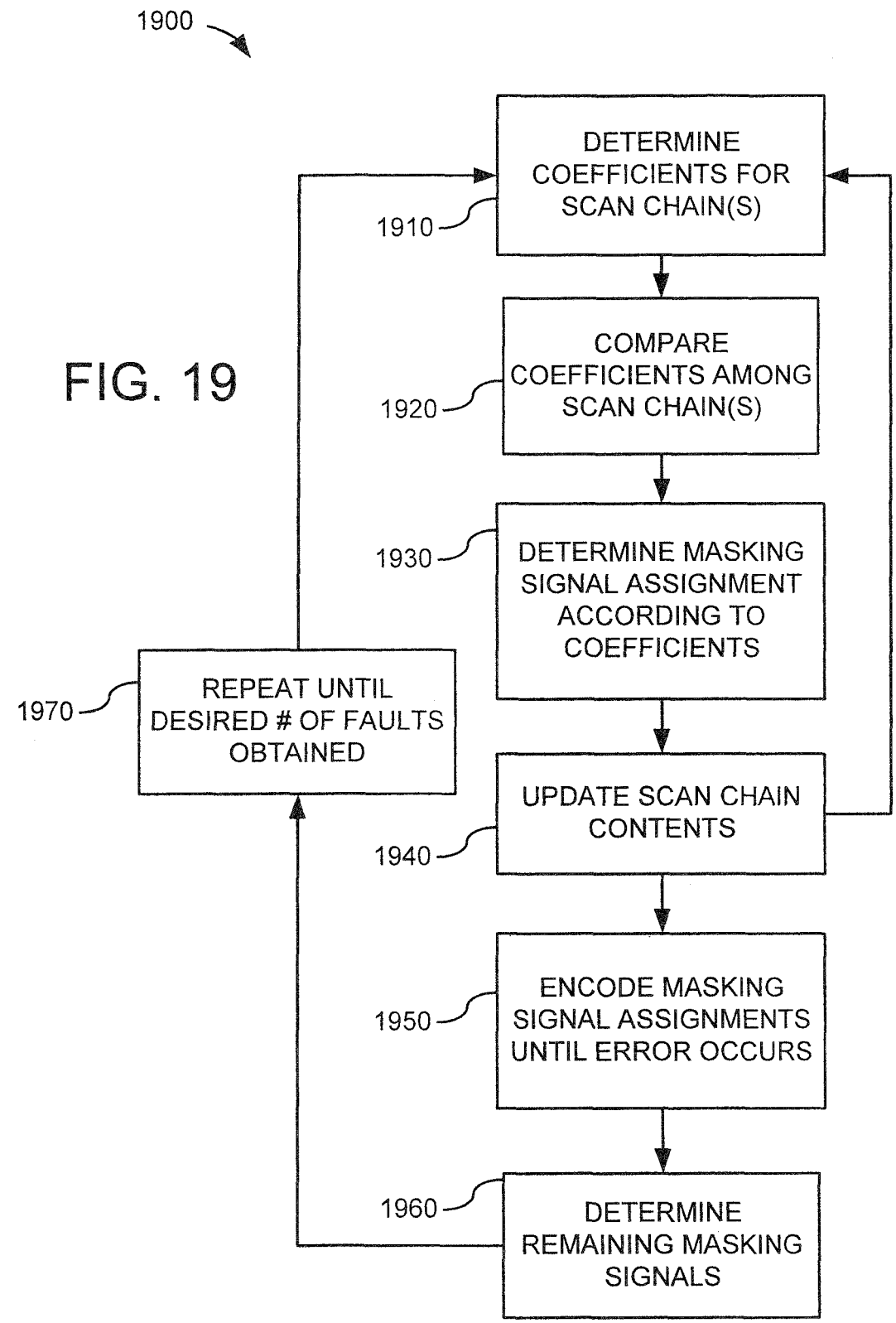
FIG. 19 shows a block diagram of one embodiment of a method of finding top-up stimuli for a test response compactor architecture.

The experimental results reported below were produced using the exemplary method 1900 illustrated in FIG. 19. Method 1900 is substantially similar to the method shown in FIG. 12, except that the act of transforming scan chains into compound scan chains can be omitted when considering single-stage compaction schemes. Method 1900 can be used with both single- and multi-stage compactor architectures. The exemplary method 1900 assumes that the locations of failing scan cells and one or more unknown states for each test pattern are given.

In method act 1910, for each scan chain, two coefficients $S_i$ and $M_i$ are determined, where $S_i$ represents the estimated number of errors that will be preserved provided scan chain i is selected, while $M_i$ is a similar number for scan chain i if it were masked. E(i) and X(i) represent the sets of scan cells in scan chain i that capture errors and unknown states, respectively. $E_c$ and $X_c$ represent the number of errors and X states, respectively, captured by scan cells belonging to scan-out cycle c. Coefficients $S_i$ and $M_i$ are given in equations 4 and 5, respectively:

$$S_i = \sum_{c \in E(i)} 2^{-X_c} - \sum_{c \in X(i)} E_c / X_c \qquad (4)$$

$$M_i = \sum_{c \in X(i)} E_c 2^{-(X_c-1)} - \sum_{c \in E(i)} (X_c + 1)^{-1} \qquad (5)$$

In this exemplary approach, $S_i$ is calculated as a difference between the number of errors occurring in a given scan chain and the number of errors occurring in the same time frames as those of X states hosted by a given scan chain. In the depicted embodiment, the first term of equation 4 is calibrated, for example, by the probability that X states occurring in the same time frames will all be masked (it is assumed that a single scan chain is masked with a probability 0.5). The second term of equation 4 is calibrated by the number of corresponding X states to avoid double counting. In this exemplary approach, $M_i$ is equal to the number of errors occurring in the same time frames as those of X states (now suppressed) hosted by a given scan chain. This assumes, however, that they are not masked by other unknown states from the same shift cycles. This number can be reduced by errors occurring in the masked scan chain (calibrated, for example, by X's from other scan chains, and including the masked chain itself).

In method act 1920, the coefficients $S_i$ and $M_i$ for scan chain i are compared, and, at method act 1930, scan chain i is marked with a masking signal value of 1 (select) or 0 (mask) depending on whether $S_i$ or $M_i$ was chosen. In some embodiments, this is not a final masking, as these signals still need to be encoded for a particular selection circuit.

In method act 1940, based on the results of method act 1930, the contents of one or more scan chains (in some embodiments, all scan chains) are updated by either deleting errors and X states in a scan chain which is supposed to be masked, or by deleting errors and X states in time frames where a selected scan chain features an unknown state. In the illustrated embodiment, masking signals are iteratively assigned to one or more other scan chains by repeating the above method acts, as indicated by arrow 1932.

In method act 1950, linear equations are solved (for example, in the order determined in method act 1920) to confirm that the masking signals can be encoded in the selection logic for successive scan chains. These linear equations describe relationships between inputs and outputs of the selection logic. In some embodiments, this process continues until the first encoding failure occurs In method act 1960, the values of all masking signals that were not the subject of encoding are determined (for example, by examining the selection logic), and the resultant fault coverage is determined. Detected faults can be dropped, and the number of test patterns can be stored that were effectively used to achieve determined fault coverage.

As indicated by method act 1970, method 1900 is repeated for purposes of these experiments until the desired number of target faults is detected.

Experimental results appear in Tables 7 and 8. For each tested circuit the following information is provided: the name (where label -dk indicates the use of depth-k sequential patterns in conjunction with the circuit); the scan architecture and the total number of faults; the total number of error bits (the number of scan cells that capture erroneous signals); the X-fill rate computed as a ratio of the total number of captured X states to the number of scan cells multiplied by the number of test patterns; the number of patterns which contribute to the fault coverage (FC), assuming there is no compaction; the size m of the mask register; top-up patterns, reported here as an absolute and relative IPC; and the effective compaction ratio C(x). Since a single-output compactor was used in the experiments, the compaction ratio is given as the number of scan chains, normalized by the ratio of original test patterns to the total number of patterns effectively applied (including top-up vectors and selector mask bits).

example, C6) up to as much as about 300% for designs that saw a high percentage of X's (for example, C1 and C4). Furthermore, it appears that sites at which unknown states are captured, as well as frequency of their occurrence, can be of increased interest. It has been observed, for instance, that X states populate the majority of scan chains in design C1-d3 in a uniform manner across all test patterns. Contrary to this

TABLE 7

Experimental results-1.

| | | m | IPC | IPC (%) | C (x) | | | m | IPC | IPC (%) | C (x) |
|---|---|---|---|---|---|---|---|---|---|---|---|
| Circuit | C1-d0 | 8 | 922 | 163 | 18.62 | Circuit | C2-d3 | 7 | 98 | 12.8 | 13.46 |
| Scan | 50 × 373 | 12 | 806 | 142 | 19.98 | Scan | 16 × 112 | 8 | 82 | 10.7 | 13.49 |
| Faults | 471362 | 16 | 699 | 123 | 21.45 | Faults | 81540 | 12 | 79 | 10.3 | 13.10 |
| Errors | 272472 | 24 | 596 | 105 | 22.88 | Errors | 27634 | 14 | 75 | 9.8 | 12.95 |
| X's (%) | 1.56 | 32 | 568 | 100 | 22.98 | X's (%) | 2.60 | 16 | 71 | 9.3 | 12.81 |
| Tests | 566 | 50 | 578 | 102 | 21.81 | Tests | 765 | 18 | 68 | 8.9 | 12.66 |
| FC (%) | 98.10 | | | | | FC (%) | 87.42 | | | | |
| Circuit | C1-d2 | 8 | 892 | 252 | 13.91 | Circuit | C3.1-d2 | 12 | 516 | 24 | 99.61 |
| Scan | 50 × 373 | 12 | 654 | 185 | 17.01 | Scan | 128 × 353 | 16 | 440 | 21 | 101.45 |
| Faults | 471362 | 16 | 542 | 153 | 18.94 | Faults | 1147100 | 24 | 341 | 16 | 103.29 |
| Errors | 276906 | 24 | 425 | 120 | 21.35 | Errors | 1458974 | 32 | 294 | 14 | 103.10 |
| X's (%) | 2.62 | 32 | 397 | 112 | 21.71 | X's (%) | 0.04 | 64 | 275 | 13 | 95.94 |
| Tests | 354 | 50 | 378 | 107 | 21.32 | Tests | 2126 | 128 | 275 | 13 | 83.18 |
| FC (%) | 98.93 | | | | | FC (%) | 98.83 | | | | |
| Circuit | C1-d3 | 8 | 909 | 311 | 11.90 | Circuit | C3.2-d2 | 13 | 535 | 25 | 122.25 |
| Scan | 50 × 373 | 12 | 645 | 221 | 15.10 | Scan | 160 ×283 | 16 | 425 | 20 | 126.24 |
| Faults | 471362 | 16 | 512 | 175 | 17.41 | Faults | 1147164 | 24 | 296 | 14 | 129.49 |
| Errors | 313775 | 24 | 405 | 139 | 19.68 | Errors | 1499807 | 32 | 256 | 12 | 128.32 |
| X's (%) | 3.45 | 32 | 355 | 122 | 20.78 | X's (%) | 0.04 | 80 | 226 | 11 | 112.77 |
| Tests | 292 | 50 | 338 | 116 | 20.44 | Tests | 2129 | 160 | 211 | 10 | 93.00 |
| FC (%) | 98.98 | | | | | FC (%) | 98.83 | | | | |

TABLE 8

Experimental results-2.

| | | m | IPC | IPC (%) | C (x) | | | m | IPC | IPC (%) | C (x) |
|---|---|---|---|---|---|---|---|---|---|---|---|
| Circuit | C4-d0 | 11 | 2623 | 133 | 33.34 | Circuit | C6.2-d0 | 13 | 112 | 1.19 | 153.87 |
| Scan | 80 × 357 | 12 | 2575 | 130 | 33.60 | Scan | 160 × 470 | 16 | 111 | 1.18 | 152.93 |
| Faults | 677010 | 16 | 2161 | 109 | 36.56 | Faults | 1836691 | 24 | 111 | 1.18 | 150.46 |
| Errors | 476949 | 24 | 1240 | 63 | 46.05 | Errors | 476949 | 32 | 65 | 0.69 | 148.78 |
| X's (%) | 4.94 | 32 | 994 | 50 | 48.84 | X's (%) | 0.001 | 80 | 40 | 0.42 | 136.15 |
| Tests | 1975 | 48 | 972 | 49 | 47.26 | Tests | 9435 | 160 | 39 | 0.41 | 118.87 |
| FC (%) | 88.75 | 80 | 907 | 46 | 44.79 | FC (%) | 96.51 | | | | |
| Circuit | C5.1-d2 | 11 | 811 | 63 | 48.68 | Circuit | C7-d0 | 12 | 90 | 8.4 | 99.29 |
| Scan | 80 × 1081 | 12 | 750 | 58 | 50.09 | Scan | 122 × 138 | 16 | 60 | 5.6 | 99.74 |
| Faults | 2558220 | 16 | 727 | 56 | 50.48 | Faults | 279175 | 24 | 26 | 2.4 | 99.21 |
| Errors | 2381823 | 24 | 657 | 51 | 51.91 | Errors | 227449 | 32 | 12 | 1.1 | 96.37 |
| X's (%) | 0.44 | 32 | 639 | 49 | 52.01 | X's (%) | 0.60 | 64 | 7 | 0.7 | 82.71 |
| Tests | 1294 | 48 | 591 | 46 | 52.58 | Tests | 1076 | 122 | 11 | 1.0 | 64.47 |
| FC (%) | 98.91 | 80 | 640 | 49 | 49.84 | FC (%) | 98.86 | | | | |
| Circuit | C5.2-d2 | 13 | 1260 | 96 | 79.58 | Circuit | C7-d2 | 12 | 118 | 13.0 | 99.29 |
| Scan | 160 × 541 | 16 | 1061 | 81 | 85.80 | Scan | 122 × 138 | 16 | 87 | 9.6 | 99.74 |
| Faults | 2558380 | 24 | 865 | 66 | 92.22 | Faults | 279175 | 24 | 43 | 4.8 | 99.21 |
| Errors | 2432380 | 32 | 805 | 62 | 93.51 | Errors | 305343 | 32 | 25 | 2.8 | 96.37 |
| X's (%) | 0.44 | 40 | 748 | 57 | 94.78 | X's (%) | 1.05 | 64 | 7 | 0.77 | 82.71 |
| Tests | 1308 | 80 | 744 | 57 | 88.85 | Tests | 905 | 122 | 4 | 0.44 | 64.47 |
| FC (%) | 98.91 | 160 | 691 | 53 | 80.80 | FC (%) | 98.85 | | | | |
| Circuit | C6.1-d0 | 11 | 21 | 0.22 | 78.90 | | | | | | |
| Scan | 80 × 940 | 12 | 22 | 0.23 | 78.81 | | | | | | |
| Faults | 1836531 | 16 | 16 | 0.17 | 78.53 | | | | | | |
| Errors | 1681671 | 24 | 15 | 0.16 | 77.88 | | | | | | |
| X's (%) | 0.001 | 32 | 17 | 0.18 | 77.23 | | | | | | |
| Tests | 9436 | 48 | 17 | 0.18 | 75.98 | | | | | | |
| FC (%) | 96.51 | 80 | 15 | 0.16 | 73.61 | | | | | | |

Circuits reported in Tables 7 and 8 featured a wide range of X-fill rates, from 0.001% (C6) to approximately 5% (C4). Consequently, the resultant increase in a pattern count varied from less than about 1% for circuits with a low X-fill rate (for phenomenon, there are only a few patterns with high concentrations of X states in design C4-d0. In this case, the majority of patterns had low X-fill rates or did not feature unknown states. As a result, design C1-d3 with depth-3 sequential patterns and an 8-bit selector (which gives, on the average, full controllability of 16% of scan chains) used four times more test patterns than if a similar circuit had been used in a no-compaction mode. On the other hand, circuit C4-d0 used 1.3 times more test patterns, despite a higher X-fill rate than that of design C1-d3. (In the case of circuit C4-d0, as 12-bit selector circuit provided similar scan chain controllability.)

The experiments that produced the results of Tables 7 and 8 were run using several values of m, starting from the smallest value for a given scan chain configuration. For all circuits, the best observed compaction was achieved for m being roughly 10-20% of the number of scan chains. Possible gains due to larger registers were diminished because of the mask bits. Circuits with low X-fill rates (C6.1-d0, C6.2-d0) achieved the best observed results for the smallest register determined by the scan chain configuration.

Exemplary Embodiments of on-Chip Comparators and Response Collectors

In some embodiments of scan-based manufacturing tests, the test responses of a circuit-under-test (CUT) are sent to an external tester (for example, ATE) for comparison with the known good responses to isolate a fault in the CUT. Usually, each bit of a test response maps to 2 bits on the ATE to accommodate three logic values: 0, 1, and X. Although this has been a standard approach for manufacturing testing and for gathering failure information, it can have limitations. For example, when scan data is being unloaded and compared on the ATE and a mismatch occurs, the entire test cycle (for example, the entire scan chain slice) is often captured and stored in the tester memory. The memory limitations in a tester usually provide storage (a "fail log") for a maximum of only 256 failing cycles. Therefore, the fail logs are often truncated and many failing test patterns are not logged. Also, the unloading of data from the CUT to the ATE and comparing the response to determine if a failure occurred can take considerable amounts of time. This can increase the test application time, thereby reducing the throughput on the test floor. To improve test throughput, multi-site testing has gained popularity in the industry. This usually involves testing multiple devices (in some cases as many as 64 or 128) concurrently on a tester. With current ATE technology, this creates a bottleneck for at least two reasons: the number of chains devoted for observation per device becomes limited, and the amount of data stored per device is further limited as the ATE memory is shared across multiple devices.

To address at least some of these issues, embodiments of an on-chip comparison and response collection scheme as described below can be used. Instead of performing a comparison on the ATE, for example, additional hardware can be incorporated on-chip to facilitate comparison of expected and actual test responses. Furthermore, by utilizing some existing memory on-chip, it is possible to store a larger amount of failing data that could help facilitate diagnosis. In some embodiments, the known good responses are still stored in the ATE memory.

Figure 20:
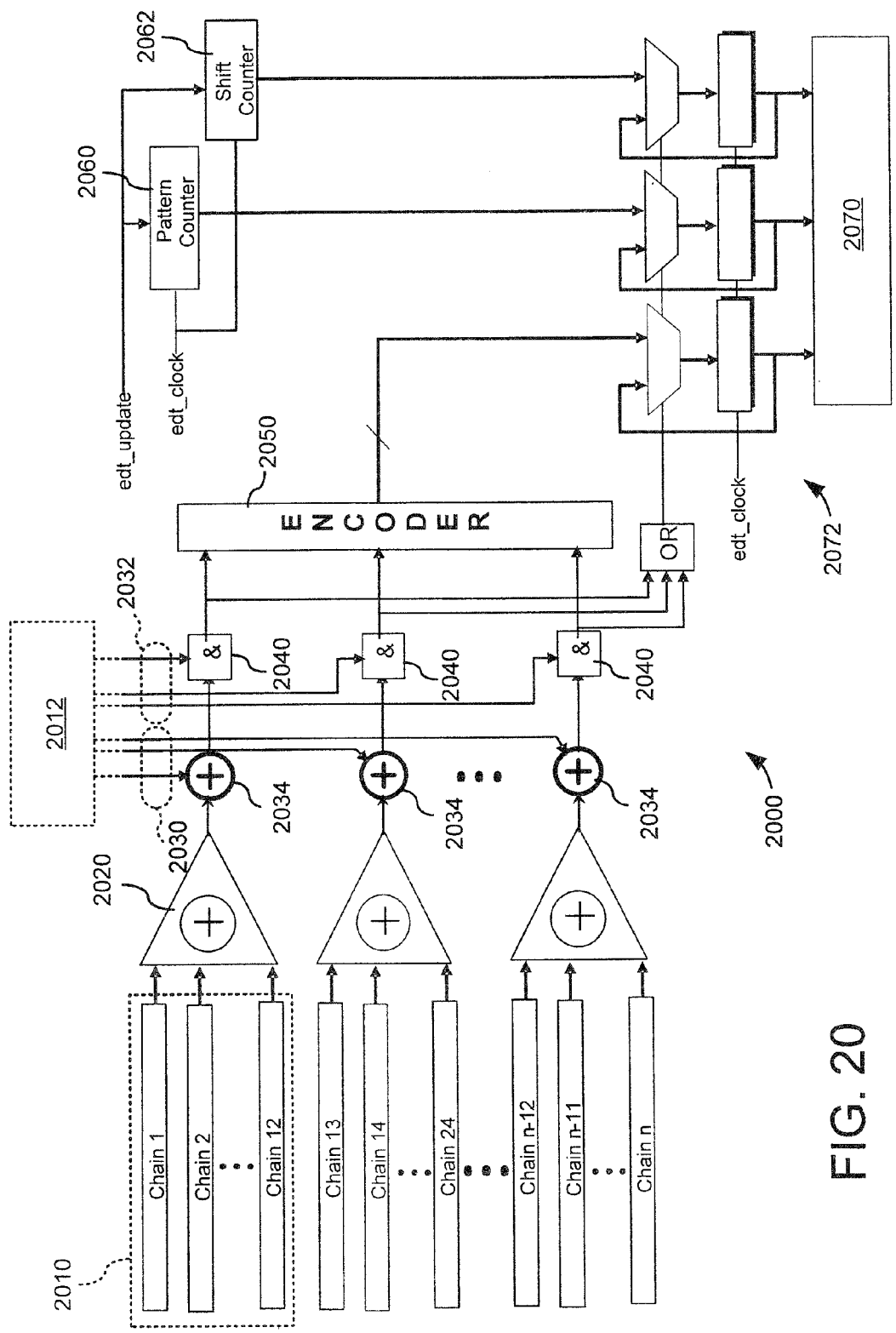
FIG. 20 shows a block diagram of one embodiment of an exemplary on-chip testing architecture.

FIG. 20 shows a block diagram of one embodiment of an exemplary on-chip testing circuit compactor architecture 2000. The depicted embodiment comprises a plurality of scan chain groups, such as group 2010 (consisting of scan chains 1-12), coupled to compactors such as compactor 2020. In the illustrated architecture, a component 2012 can provide to the architecture 2000 one or more bits of information per channel (for example, per compactor). In some embodiments, the component 2012 can be one or more of, for example, an ATE, an on-chip memory or an on-chip decompressor. These bits can be provided on input paths 2030, 2032. For example, the first set of bits provided on input paths 2030 can be the actual test response bits expected from the device provided for comparison with the output of the compactors. The first set of bits is provided to comparators 2034 which, in the embodiment of FIG. 20, comprise XOR gates.

In some embodiments, a second set of bits (also termed the "mask signals") can be provided on input paths 2032 and used to indicate whether the output of the comparator 2034 should be masked (for example, using AND gates 2040 or other suitable logic gates). The mask bit for a given compactor can be set to mask the comparator output when the expected response is an X state, and therefore, the result of the comparator ignored.

In certain embodiments, the expected test response bits provided on input paths 2030 are input simultaneously with the mask signals provided on the input paths 2032. As used in the description and the claims, the term "simultaneously" allows for some minor deviation so long as the intended operation of the circuit is not compromised. For example, in some embodiments, deviations up to almost one clock cycle can be tolerated.

In further embodiments, an error vector can be determined for every cycle of the test response. The error vector (assuming n channels) can be directly fed as input to a priority encoder 2050, which can encode it into a $\log_2$ n-bit vector. In additional embodiments, the priority encoder 2050 can comprise logic to indicate if an error is observed at more than one channel output in a cycle, and set a bit on an output (not shown) accordingly. In additional embodiments the architecture 2000 comprises a pattern counter 2060 and a shift counter 2062 to track the pattern and the cycle numbers at which errors have been observed. A memory 2070 can record data from other components (for example, the priority encoder 2050, the pattern counter 2060, and/or the shift counter 2062). Additional logic 2072 can be used to manage inputs to the memory 2070. Components such as the pattern counter 2060, the shift counter 2062 and the additional logic 2072 can operate in response to clock and control signals, as shown in FIG. 20.

Figure 21:
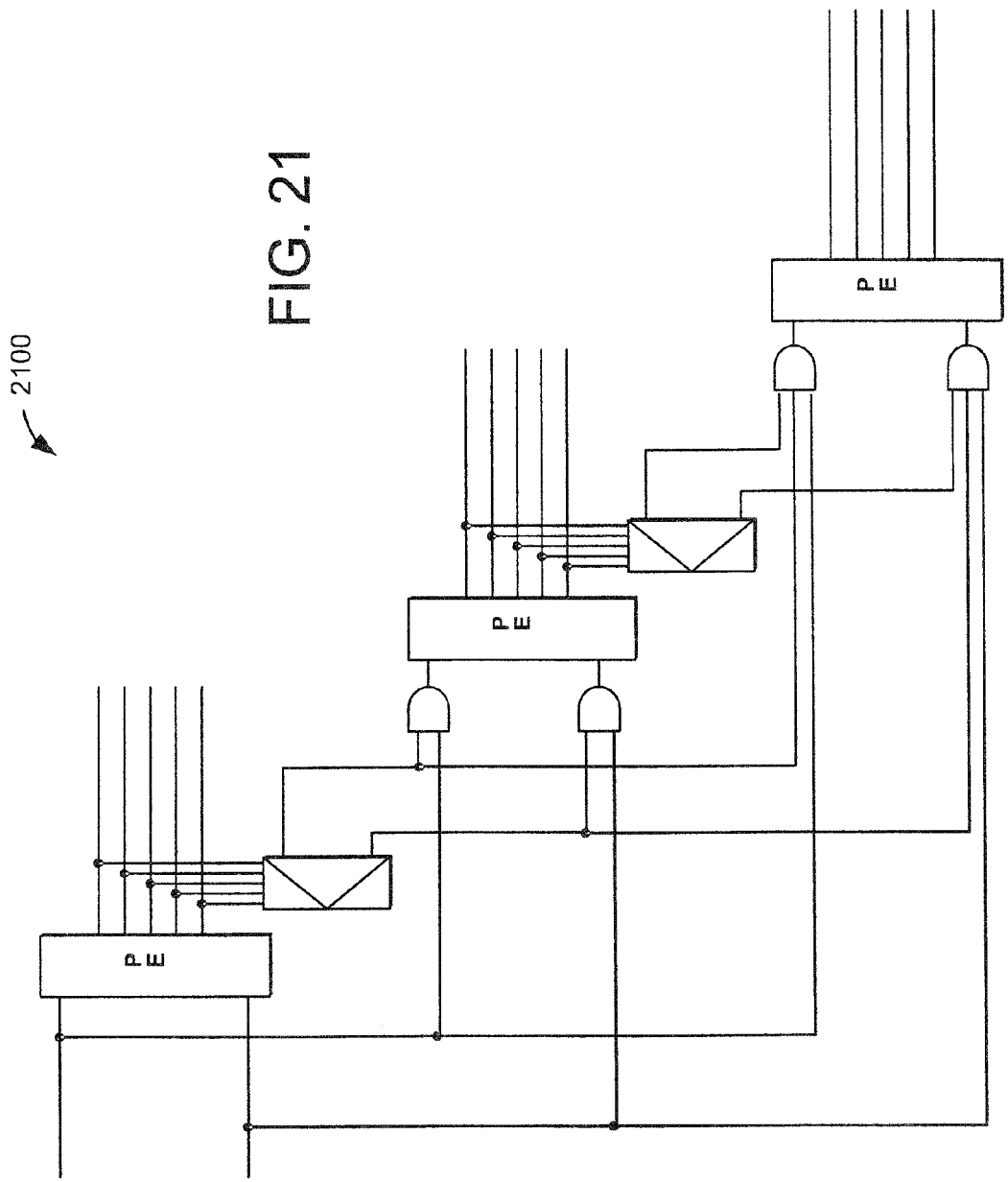
FIG. 21 shows a block diagram of one embodiment of a priority encoder.

FIG. 21 shows a block diagram of one embodiment of a priority encoder 2100 that can be used with the testing circuit architecture 2000

Assuming m patterns are applied during a test, and assuming the maximum length of a scan chain is l bits, the total number of bits (T) that are recorded per failing cycle according to one exemplary implementation of the disclosed technology is:

$$T = \log_2 n + \log_2 m + \log_2 l + 1 \qquad (6)$$

The final term in equation 6 (representing an additional output cycle) corresponds to the output bit which can indicate whether there is more than a single error at the input of the priority encoder 2050. Considering, for example, a design with 64 channels, 10,000 patterns, the longest scan chain having a length of 400 bits, a total of 30 bits can be recorded according to this implementation. If the memory 2070 is a 1K×32 memory, for example, it can store up to 1024 failing cycles, assuming a single error across all channels. If there are a maximum of 2 errors across all channels in a single cycle, up to 512 failing cycles can be stored in the worst case. The storage memory can either be added and configured to function as a collector of failing pattern information or an existing memory in the device can be re-used for storing the failure information. Depending on the memory size and how many error bits are recorded per cycle, diagnostic resolution can vary.

Figure 22:
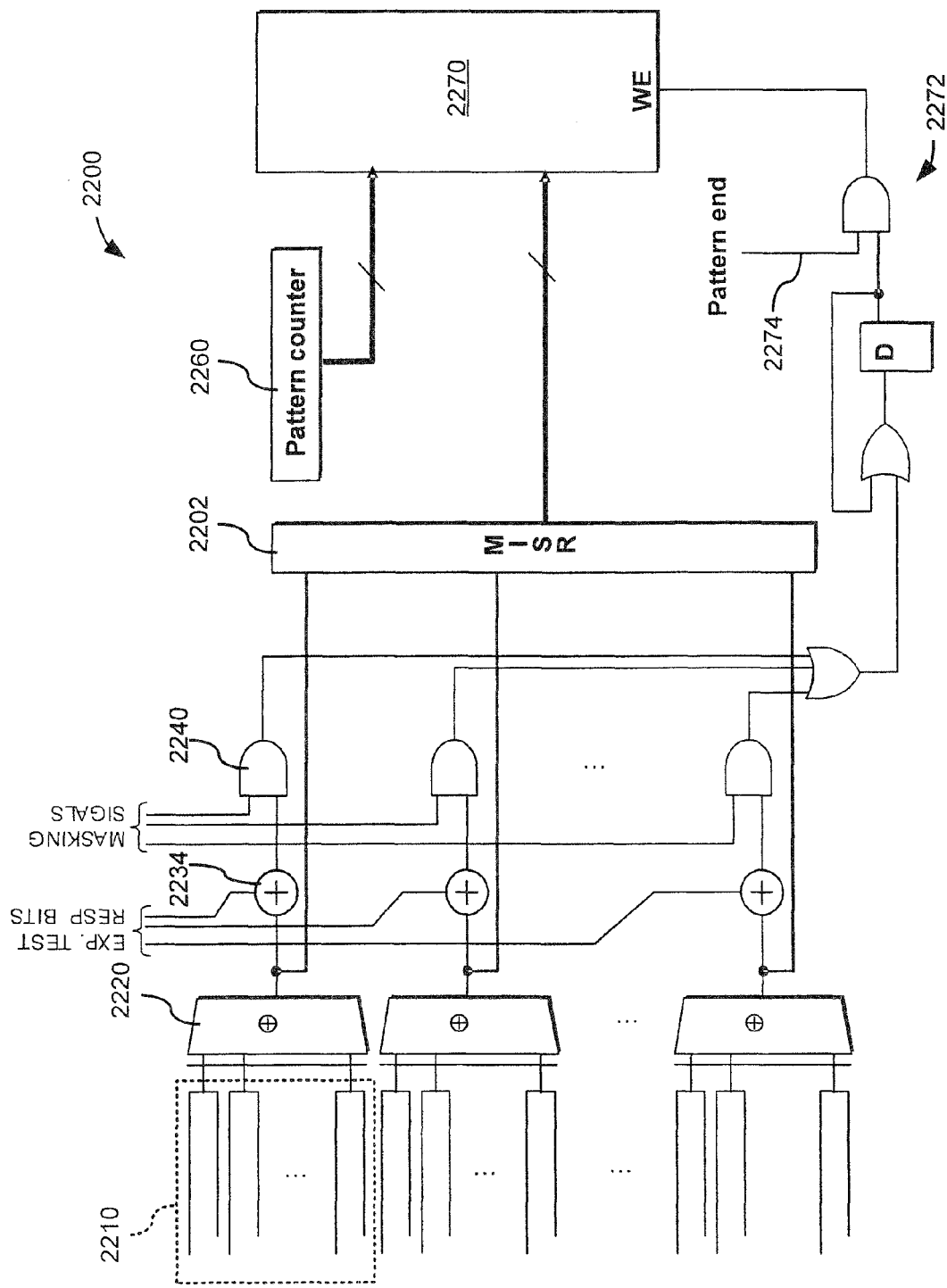
FIG. 22 shows a block diagram of a further embodiment of an exemplary on-chip testing architecture.

FIG. 22 shows a block diagram of a further embodiment of an exemplary on-chip comparison and response collection architecture 2200. In this embodiment, a multiple-input signature register (MISR) 2202 can also be used to collect circuit responses from one or more compactors (such as compactor 2220) that compact outputs from scan chain groups, such as group 2210. The MISR 2202 can generate a MISR signature that can be stored in a memory 2270 for one or more failing patterns, along with the content of a pattern counter 2260. The architecture 2200 can comprise comparators and AND gates (such as comparator 2234 and AND gate 2240), which can be controlled by inputs from an ATE, similar to the architecture 2100. In additional embodiments, a write-enable circuit 2272 can be configured to coordinate writes to the memory 2270 with one or more signals from the AND gates and a "pattern end" signal 2274 from the ATE.

Figure 23:
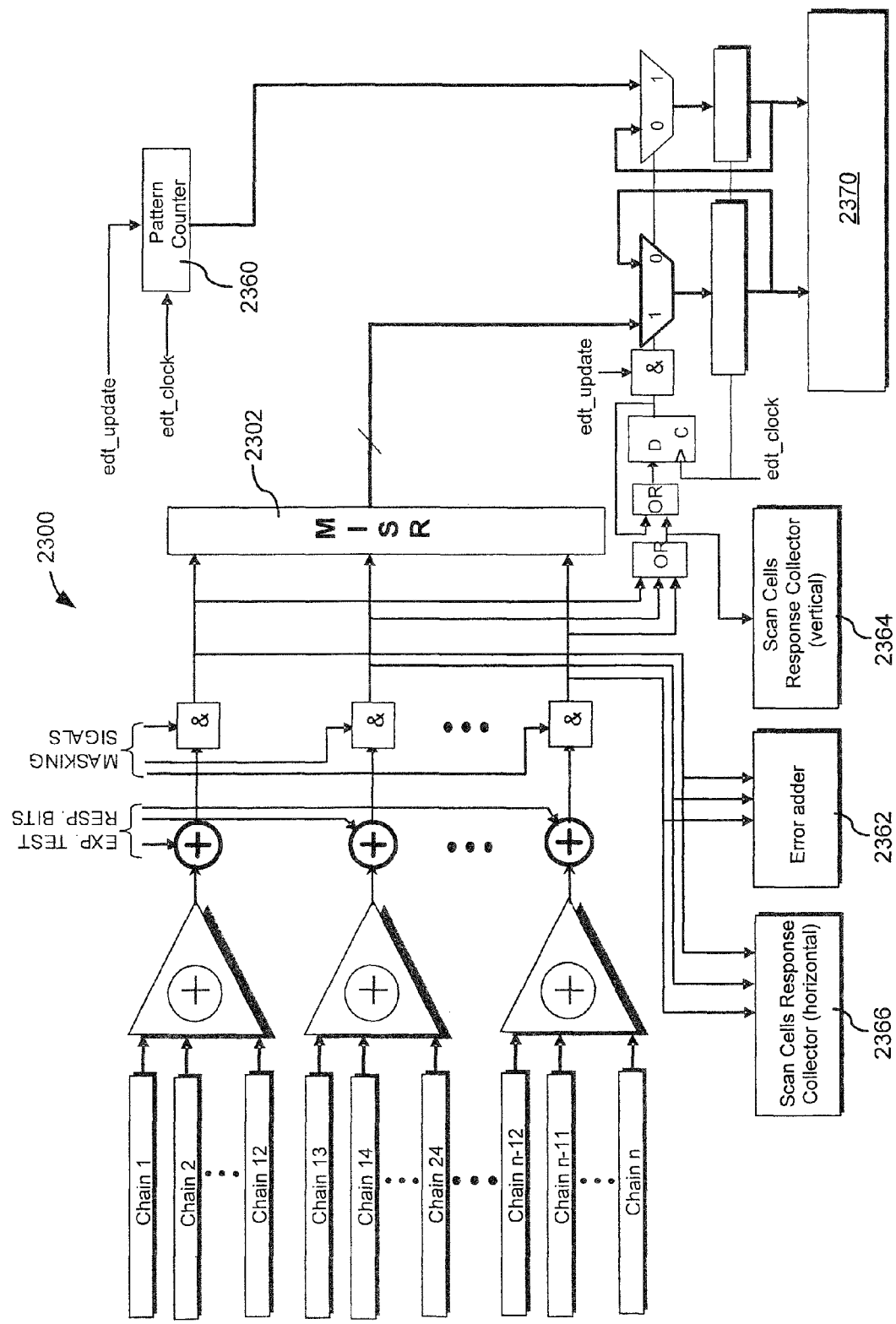
FIG. 23 shows a block diagram of an additional embodiment of an exemplary on-chip testing architecture.
Figure 24:
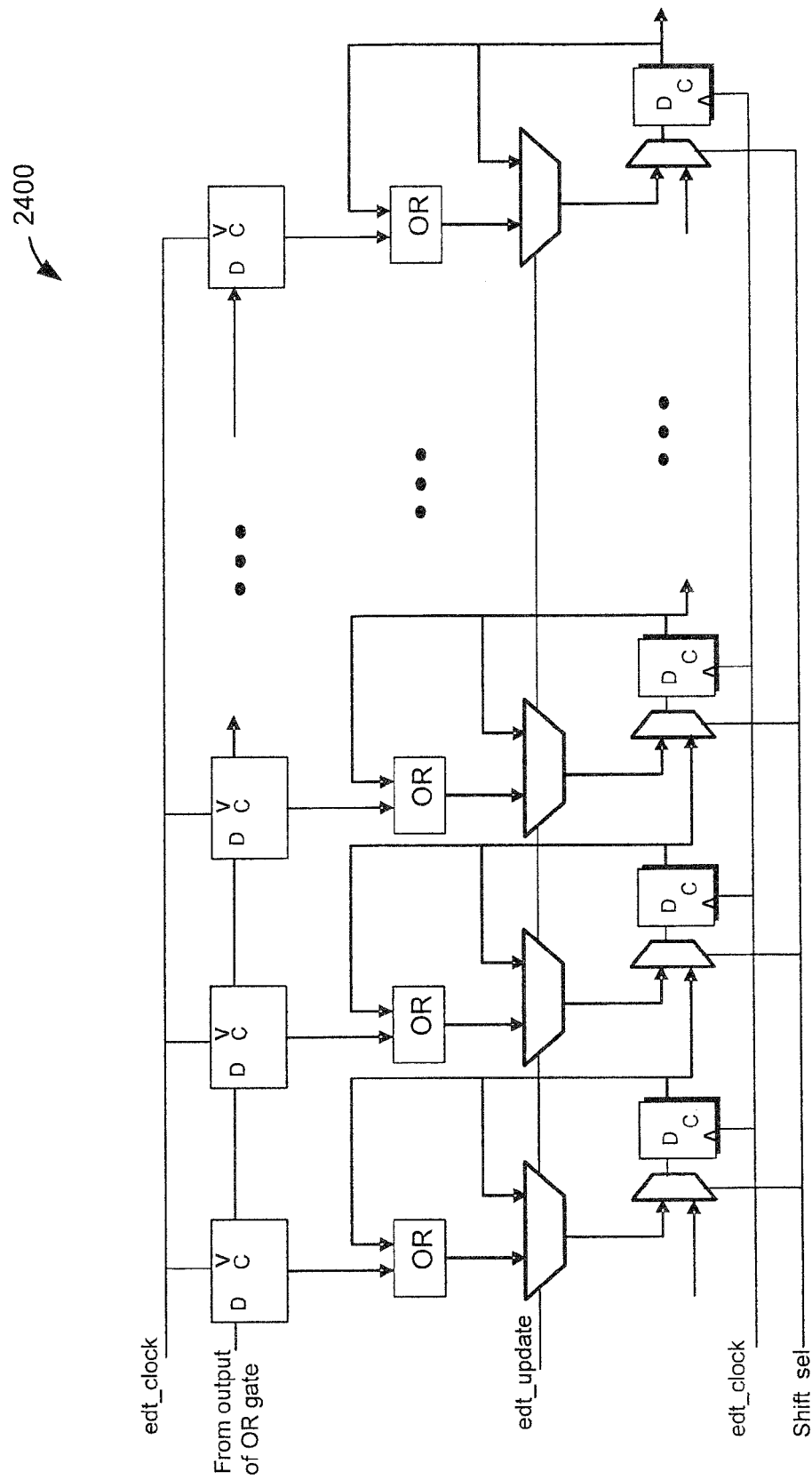
FIG. 24 shows a block diagram of one embodiment of a vertical collector circuit for use with the on-chip testing architecture of FIG. 23.
Figure 25:
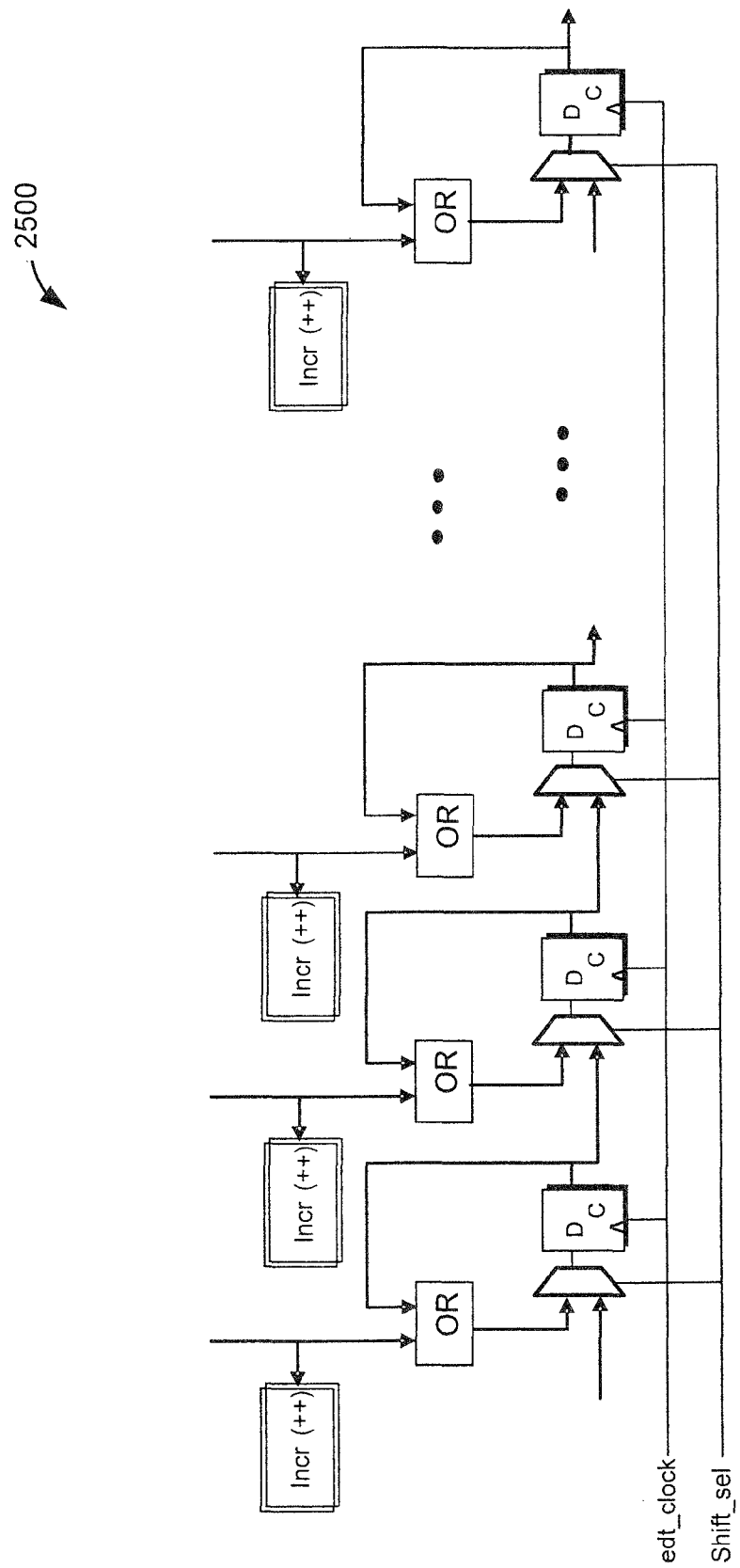
FIG. 25 shows a block diagram of one embodiment of a horizontal collector circuit for use with the on-chip testing circuit compactor architecture of FIG. 23.

FIG. 23 shows a block diagram of an additional embodiment of an exemplary comparison and response collection architecture 2300. In this embodiment, an error signature (produced by a MISR 2302) is stored in a memory 2370 for most failing patterns or every failing pattern. Additionally, the content of a pattern counter 2360 and the number of failing bits (determined, for example, by an error adder 2362) can also be stored for one or more test patterns producing an error. In further embodiments, two additional sets of data can be available after the test set is applied: failing cycles and failing scan chains (or groups of scan chains) gathered by a vertical collector 2364 and a horizontal collector 2366, respectively. FIG. 24 shows a block diagram of one embodiment of a vertical collector circuit 2364, while FIG. 25 shows a block diagram of one embodiment of a horizontal collector circuit 2366.

The on-chip testing architectures described above can be used in combination with any other technologies described herein (for example, X-Press compactors, control circuit synthesis).

In experiments, the on-chip testing architecture 2100 was used with two industrial circuits (namely, designs A and B) across 26,000 and 10,000 real fail logs, respectively, from the manufacturing floor. The diagnostic resolution of embodiments of the compactor described herein was similar to the selective compactor described in, for example, U.S. Pat. Nos. 6,557,129 and 6,829,740. Generally, so long as storing the failing cycles on chip does not result in a substantial loss of information, the diagnostic resolution can be preserved.

In the experiments, design A was configured with 32 scan chains, a single channel for external data output, with a maximum scan chain length of 4000 bits. An overdrive register of 8 bits was selected to target an effective compression of 256x. It was observed that for 88% of the fail logs (out of a total of 26,000), the diagnostic resolution remained the same, with the testing architecture 1900 recording a single error per fail cycle. Across all 26,000 fail logs, there were only 2.7% of the failing patterns with a few errors masked, although many of those may not affect diagnostic resolution. Design B was configured with 32 chains, single channel, with a maximum scan chain length of 14000. Overdrive registers of 8, 16 and 32 bits were selected, targeting effective compressions of 256x, 512x, and 1024x respectively. An analysis of 10,000 fail logs showed that for 87.5% (256x), 87% (512x), and 86.4% (1024x) of the cases, the diagnostic resolution remained the same by recording a single error bit in a fail cycle across all patterns. Similarly, based on the size of the overdrive register, only 1.6%, 2.4%, and 3.1% of the failing patterns had a few errors masked.

Impacts on Fault Diagnosis

Generally, to enable high-volume monitoring of a diagnosis flow, a diagnostic tool desirably supports analysis in a compression mode. A fault diagnosis technique that can be employed for various test response compactors is described in U.S. Patent Application Publication 2005/0222816, which is incorporated herein by reference. When this technique is applied to data produced by exemplary embodiments of the X-Press compactor disclosed herein, a bit $P_i$ of a compacted response can be expressed as a function of a set of values that are captured into scan cells before compaction. This so-called "transformation function," denoted $\Phi_i$, is such that $P_i = \Phi_i(C_i)$, where $C_i$ are the values of the set of scan cells that are compacted together to obtain $P_i$. Since both $\Phi_i$ and $C_i$ can be determined by a compactor architecture and a masking condition of each pattern, $\Phi_i$ can be defined as addition modulo 2, while $C_i$ can be defined as the set of scan cells that are located in the same shift-out cycle in the group of compound scan chains (see FIG. 3) connected through selection logic to a scan output channel. In this section, scan cells in a compound scan chain are referred to as "compound scan cells." Recall that the value of each compound scan cell is obtained by XOR-ing v compressed scan cells (for example, from a first stage of compaction). Furthermore, masked scan cells have values of 0.

According to one exemplary embodiment of X-Press-compactor-based diagnosis, observed faulty responses are expressed in terms of one or more candidate logic cones (LC). To obtain such a relation, a conceptual circuit transformation can be performed to convert the original design into a circuit containing pseudo-scan chains, the number of which is equal to the number of X-Press outputs. The number of cells in each of the pseudo-scan chains is the number of shift cycles in the original circuit divided by v. The pseudo-scan cells are driven by a union of logic cones that imply their values.

Figure 26:
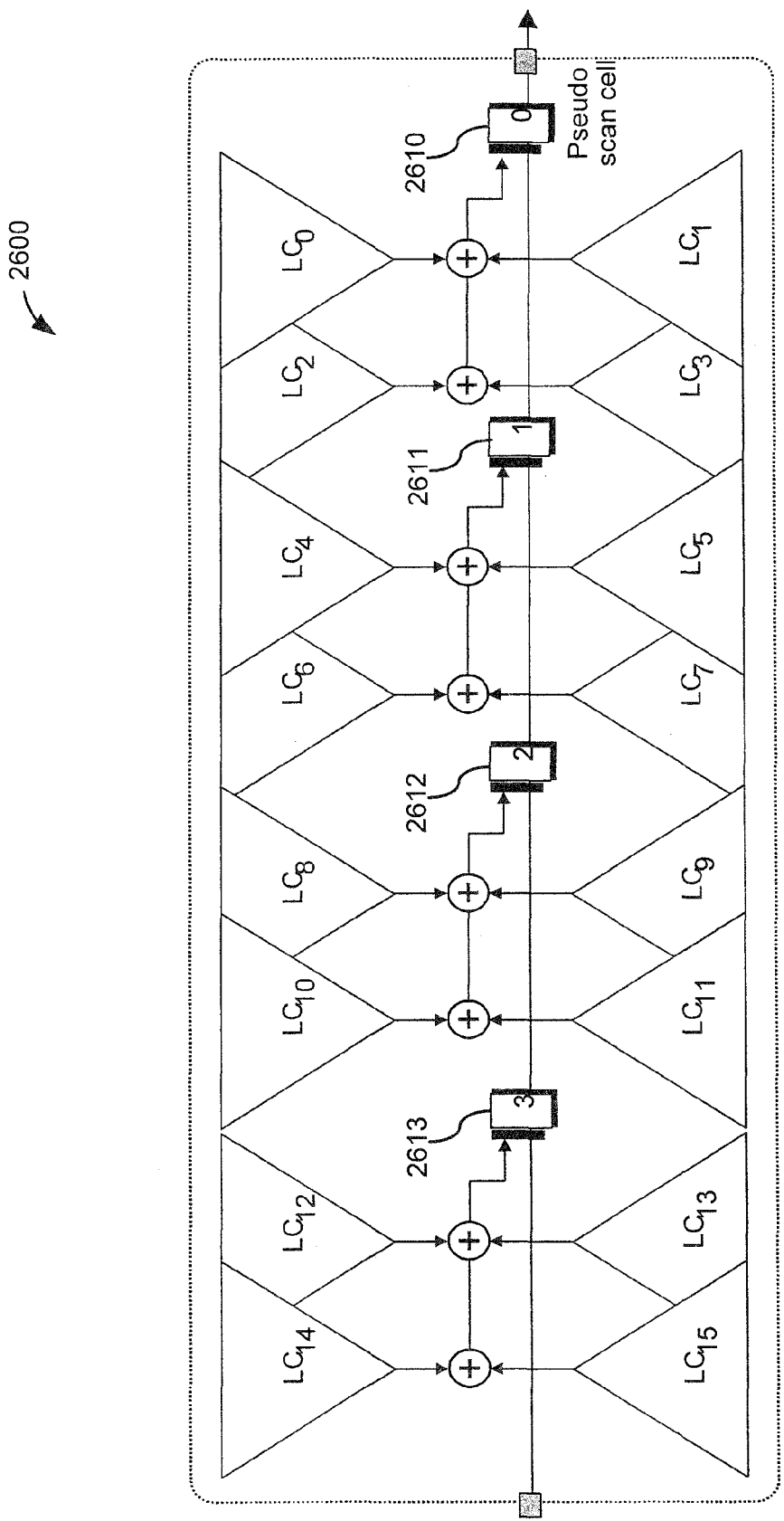
FIG. 26 illustrates a block diagram of a transformed circuit for diagnosis.

FIG. 26 illustrates a block diagram of a transformed circuit 2600 corresponding to an original circuit design with 16 scan cells (and 16 logic cones that drive them), two scan chains, and using an exemplary single-output X-Press compactor having a 2-bit overdrive register. The transformed circuit comprises logic cones $LC_0 \ldots LC_{15}$ and pseudo-scan cells 2610, 2611, 2612, 2613. Sums $LC_0 \oplus LC_1$, $LC_2 \oplus LC_3$, $LC_4 \oplus LC_5, \ldots, LC_{14} \oplus LC_{15}$ correspond to the space compaction performed by the first stage of the X-Press compactor, while the pseudo-scan cells 2610, 2611, 2612, 2613 are driven by modulo 2 sums representing space compactors fed by the overdrive registers. In this embodiment, the outputs of any masked logic cones are excluded from further processing. Four bits are observed for each test pattern after compaction.

Suppose failures are observed at the pseudo-scan cells 2610 and 2612. Based on the transformed circuit in FIG. 26 and the single-location-per-pattern assumption, faulty logic can be determined to be located in the intersection between the union of logic cones $LC_0$ and $LC_3$ and the union of logic cones $LC_8$ and $LC_{11}$. This reduces the search space of possible fault suspects.

Next, fault simulation can be applied to the transformed circuit illustrated in FIG. 26. Fault suspect candidates are injected in the transformed circuit and simulated. The simulation results are compared with data recorded by a tester. A fault can be regarded as a real suspect if the simulation results match the tester observed failures.

Figure 27:
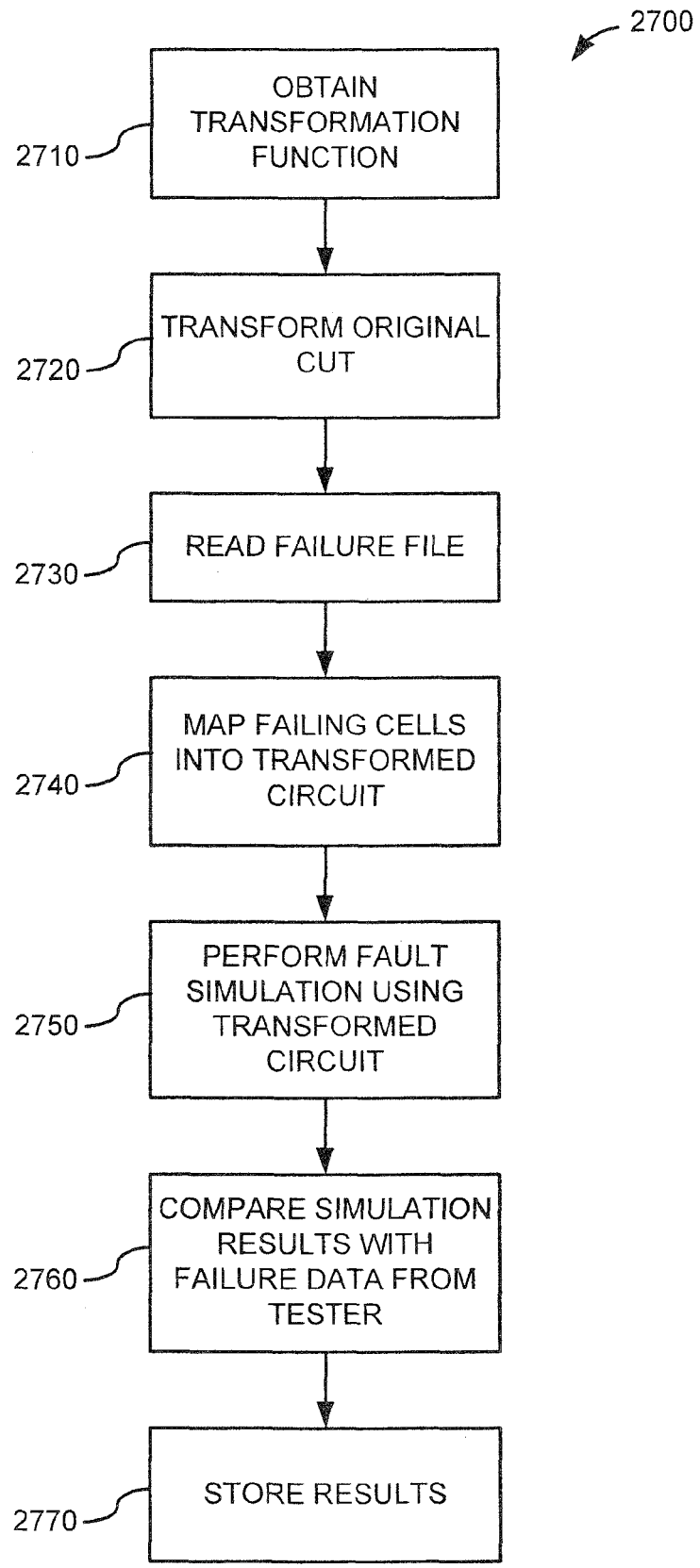
FIG. 27 shows a block diagram of one exemplary method of performing fault diagnosis of a tested circuit.

FIG. 27 shows a block diagram of one exemplary method 2700 of performing fault diagnosis of a tested CUT. In method act 2710, a transformation function for one or more responses of the X-Press compactor is determined. In some embodiments, this comprises determining the transformation function for each bit produced as a response by the compactor. In method act 2720, the original CUT is transformed into a circuit representation (a "transformed circuit") containing one or more pseudo-scan chains. In method act 2730, a failure file generated by ATE is read (generally under the assumption that one or more of the pseudo-scan cells capture test failures). Connections from one or more failing cells can be mapped into the transformed circuit to locate one or more logic cones that constitute an initial suspect fault list (method act 2740). Using the transformed circuit, fault simulation can be performed for one or more suspect faults (method act 2750). In method act 2760, one or more simulation results can be compared with failure data from the ATE. Simulation and/or comparison results can be stored in one or more computer-readable media (method act 2770).

In further embodiments, a cause-effect analysis can be used such that stuck-at, bridge, open, and/or transition defects can be identified. Certain embodiments of the method 2700 can also handle cases with multiple faulty scan cells in a single shift cycle. Further, certain embodiments of the disclosed technologies can permit diagnosis of production test failures, as it is not necessary to bypass the compactor and apply a different test set for the purpose of diagnosis.

Below are results of experiments performed on CUTs the diagnostic technology described above. For each CUT design, 1000 randomly selected, single stuck-at faults were injected to create 1000 fail logs for versions of the design, with and without embodiments of the X-Press compactor. X-Press compactor designs (for example, embodiment 100 of FIG. 1) with relatively high X-fill rates (for example, if X-fills are a characteristic of the design), masking registers of size m=12 or 13, and an overdrive factor of v=8 were chosen. Although embodiments of the X-Press compactor typically used some top-up patterns to maintain the same coverage, in these experiments the original test patterns were used to carry out the comparison. Generally, identification of different defect behaviors can be based mainly on values recorded at fault sites, regardless of compactor type. Therefore, stuck-at faults were used to simplify the comparison. Diagnostic resolution was used as a figure of merit and is defined here as a reciprocal of the number of fault suspects. For example, if the result (the call out) of the diagnostic procedure produces only one suspect, the resolution is 100%. If the result is two suspects, the resolution drops to 50%. Table 9 below shows average diagnostic resolutions for some circuit designs used to produce experimental results described elsewhere in this application. In Table 9, the second column lists the average diagnostic resolution without compression, while the next column lists the same resolution using an exemplary embodiment of the X-Press compactor. The last two columns indicate a difference between two former statistics and the ratio of failing pattern counts with and without the exemplary X-Press compactor.

TABLE 9

Average diagnostic resolution

| Design | No comp. (%) | X-Press (%) | Difference | Fail. pat. ratio |
|---|---|---|---|---|
| C1 | 96.74 | 95.60 | 1.14 | 1.5145 |
| C2 | 96.04 | 89.32 | 6.72 | 1.9693 |
| C4 | 96.87 | 95.20 | 1.67 | 1.5288 |
| C5 | 94.75 | 92.88 | 1.87 | 1.4360 |
| C7 | 98.92 | 96.86 | 2.06 | 1.1583 |
| C8 | 96.11 | 91.67 | 4.44 | 1.7437 |

As can be seen in Table 9, the use of an exemplary X-Press compactor can impact diagnostic resolution. However, in many cases this impact can be negligible even for compression ratios higher than 1000x. In some embodiments, the loss of diagnostic resolution can actually be alleviated by using more test patterns for designs with the X-Press, as shown in Tables 1 and 2. For example, when top-up patterns are used, the resolution difference of C2 decreases from 6.72 to 2.23 and the failing pattern ratio from 1.9693 to 1.1701. With compacted failing data, the exemplary X-Press compactor has an advantage for most ATEs with limited failing data buffers. The exemplary X-Press compactor can report about 30%-50% fewer failing patterns to the ATE, which can decrease the probability of truncated fail logs. Further, even with compression higher than 1000x, the diagnosis run time only approximately doubled, indicating that diagnostics using embodiments of the X-Press compactor can be scaleable and suitable for high-volume production applications.

Exemplary Network Environments

Figure 28:
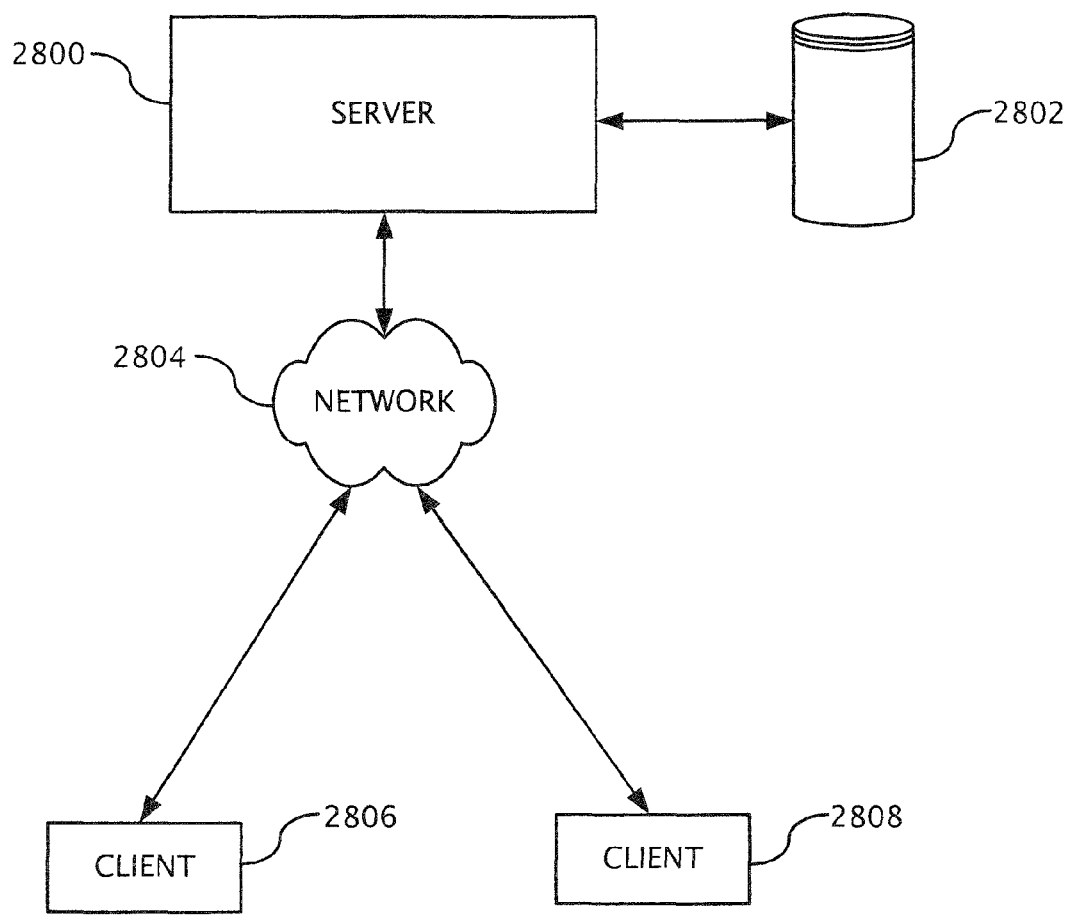
FIG. 28 is a schematic block diagram of a network as may be used to perform any of the disclosed methods or to generate any of the disclosed compactor embodiments.

Any of the aspects of the technology described above may be performed using a distributed computer network. FIG. 28 shows one suitable exemplary network. A server computer 2800 can have an associated storage device 2802 (internal or external to the server computer). For example, the server computer 2800 can be configured to generate any of the disclosed modular compactor embodiments for a given circuit-under-test (for example, as part of an EDA software tool, such as a test pattern generation tool) or to perform diagnostics for signatures produced by any of the disclosed embodiments (for example, as part of a diagnostic software tool). The server computer 2800 can be coupled to a network, shown generally at 2804, which can comprise, for example, a wide-area network, a local-area network, a client-server network, the Internet, or other suitable network. One or more client computers, such as those shown at 2806, 2808, may be coupled to the network 2804 using a network protocol. The work may also be performed on a single, dedicated workstation, which has its own memory and one or more CPUs.

Figure 29:
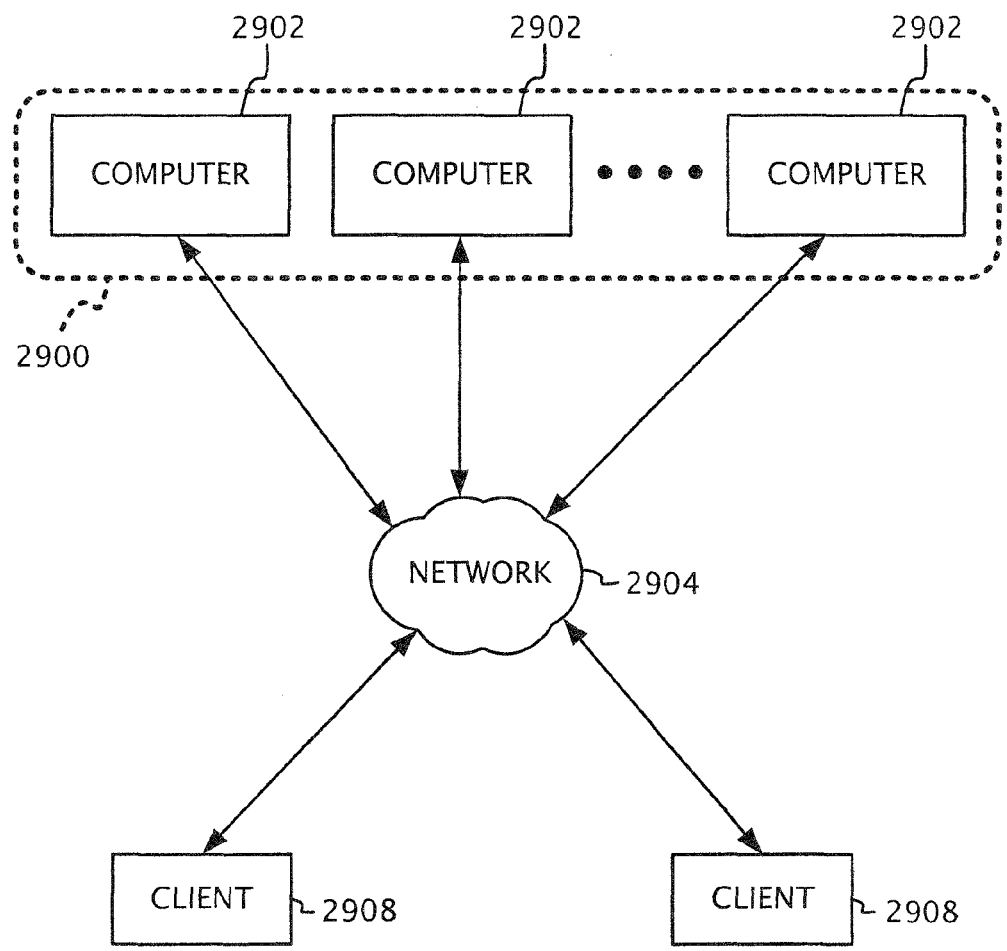
FIG. 29 is a schematic block diagram of a distributed computing network as may be used to perform any of the disclosed methods or to generate any of the disclosed compactor embodiments.

FIG. 29 shows another exemplary network. One or more computers 2902 communicate via a network 2904 and form a computing environment 2900 (for example, a distributed computing environment). Each of the computers 2902 in the computing environment 2900 can be used to perform at least a portion of the compactor generation process or diagnostic process. The network 2904 in the illustrated embodiment is also coupled to one or more client computers 2908.

Figure 30:
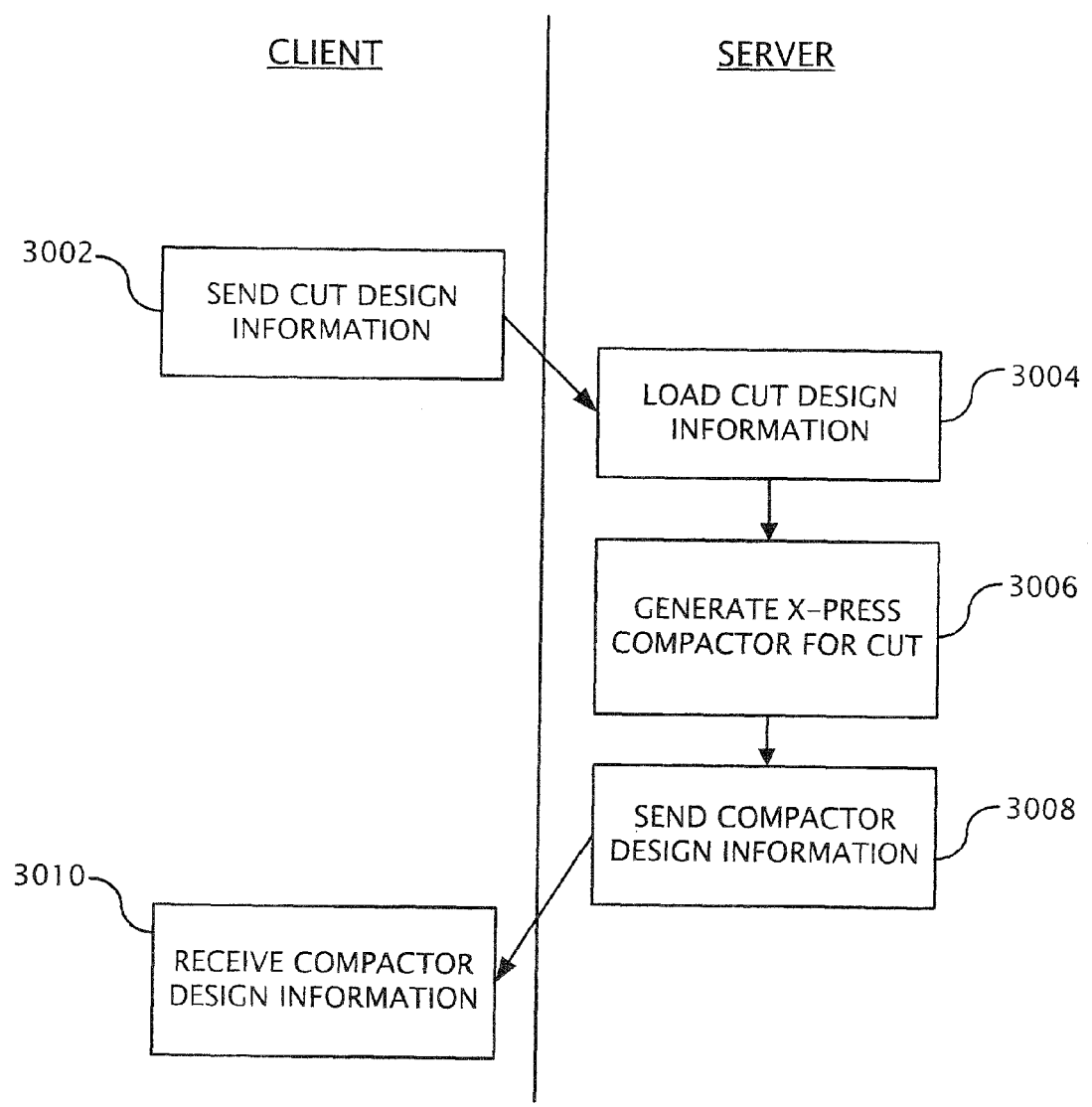
FIG. 30 is a flowchart illustrating how an embodiment of the disclosed compactor can be generated in the network of FIG. 28 or FIG. 29.

FIG. 30 shows that design information for a circuit-under-test (for example, an HDL file, netlist, GDSII file, Oasis file, or other suitable design file representing the circuit-under-test together with its scan chains) can be analyzed using a remote server computer (such as the server computer 2800 shown in FIG. 28) or a remote computing environment (such as the computing environment 2900 shown in FIG. 29) in order to generate a suitable multi-stage compactor, selection circuit, and/or on-chip comparison and response collection circuit according to the disclosed technology. At process block 3002, for example, the client computer sends the CUT design information to the remote server or computing environment. In process block 3004, the CUT design information is received and loaded by the remote server or by respective components of the remote computing environment. In process block 3006, compactor, selection circuit, or on-chip test hardware generation is performed to produce design information for any of the disclosed embodiments. At process block 3008, the remote server or computing environment sends the resulting design information (for example, an HDL file, netlist, GDSII file, Oasis file, or other suitable design file representing the compactor either alone or together with the circuit-under-test and scan chains) to the client computer, which receives the data at process block 3010.

It should be apparent to those skilled in the art that the example shown in FIG. 30 is not the only way to generate any of the disclosed hardware embodiments using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the hardware design procedures. Similar procedures using a remote server or computing environment can be performed to diagnose signatures produced by embodiments of the disclosed compactor architecture.

Having illustrated and described the principles of the disclosed technology, it will be apparent to those skilled in the art that the disclosed embodiments can be modified in arrangement and detail without departing from such principles. For example, although several of the embodiments include two compactors used to perform multi-stage compaction, a single compactor can be used. For instance, the outputs of the overdrive register could be coupled to the inputs of the first compactor through a feedback network comprises multiplexers. The overdrive register, scan chains, and multiplexer could then be controlled by a control circuit (for example, a finite state machine) to operate the first compactor as a second compactor every v scan shift cycles. In view of the many possible embodiments, it will be recognized that the illustrated embodiments include only examples and should not be taken as a limitation on the scope of the invention. Rather, the invention is defined by the following claims and their equivalents. We therefore claim as the invention all such embodiments and equivalents that come within the scope of these claims.

We claim:

1. An apparatus, comprising:
   a plurality of scan chain groups, each scan chain group comprising one or more scan chains and one or more corresponding scan chain group outputs;
   a plurality of comparator circuits, each comparator circuit comprising a comparator input and a comparator output;
   a multiple-input shift register (MISR) comprising MISR inputs and a MISR output; and
   a plurality of compactors, each compactor comprising one or more compactor inputs coupled to the one or more scan chain group outputs of a respective one of the plurality of scan chain groups and further comprising a compactor output coupled directly to a respective one of the MISR inputs and also coupled to the comparator input of a respective comparator.

2. The apparatus of claim 1, further comprising a memory, the memory comprising a first input coupled to the MISR output and a second input coupled to a pattern counter.

3. The apparatus of claim 1, further comprising a plurality of masking gates, each masking gate being coupled between the compactor output of a respective one of the comparators and a respective input of the MISR.

4. A circuit, comprising:
   a plurality of scan chain groups, each scan chain group comprising one or more scan chains and one or more corresponding scan chain group outputs;
   a plurality of comparator circuits, each comparator circuit comprising a comparator input and a comparator output, the comparator inputs being coupled to respective scan chain group outputs;
   a multiple-input shift register (MISR) comprising MISR inputs coupled to the comparator outputs of respective comparators and a MISR output; and
   a first collector circuit coupled to one or more of the comparator outputs, the first collector circuit being configured to record which of the one or more scan chain group outputs produces one or more error outputs during testing.

5. The circuit of claim 4, further comprising a plurality of compactors, each compactor comprising one or more compactor inputs coupled to the scan chain group outputs of a respective one of the plurality of scan chain groups and further comprising a compactor output coupled to the comparator input of a respective comparator, wherein the first collector circuit is configured to record which one or more of the plurality of compactors produces one or more error outputs during testing.

6. The circuit of claim 5, further comprising a second collector circuit coupled to one or more of the comparator outputs, the second collector circuit being configured to record one or more time indicators for the one or more error outputs.

7. The circuit of claim 4, further comprising a second collector circuit coupled to one or more of the comparator outputs, the second collector circuit being configured to record one or more time indicators for the one or more error outputs.

8. The circuit of claim 7, wherein the second collector circuit is coupled to two or more of the comparator outputs through an OR gate.

9. The circuit of claim 4, further comprising a memory having an input coupled to the MISR output.

10. The circuit of claim 4, further comprising a plurality of masking circuits, each masking circuit having a masking circuit input coupled to the comparator output of a respective comparator and a masking circuit output coupled to a respective MISR input of the MISR.

11. One or more non-transitory computer-readable media storing circuit design information for defining a circuit comprising:
   a plurality of scan chain groups, each scan chain group comprising one or more scan chains and one or more corresponding scan chain group outputs;
   a plurality of comparator circuits, each comparator circuit comprising a comparator input and a comparator output;
   a multiple-input shift register (MISR) comprising MISR inputs and a MISR output; and
   a plurality of compactors, each compactor comprising one or more compactor inputs coupled to the one or more scan chain group outputs of a respective one of the plurality of scan chain groups and further comprising a compactor output coupled directly to a respective one of the MISR inputs and also coupled to the comparator input of a respective comparator.

12. One or more non-transitory computer-readable media storing circuit design information for defining a circuit comprising:
   a plurality of scan chain groups, each scan chain group comprising one or more scan chains and one or more corresponding scan chain group outputs;
   a plurality of comparator circuits, each comparator circuit comprising a comparator input and a comparator output, the comparator inputs being coupled to respective scan chain group outputs;
   a multiple-input shift register (MISR) comprising MISR inputs coupled to the comparator outputs of respective comparators and a MISR output; and
   a first collector circuit coupled to one or more of the comparator outputs, the first collector circuit being configured to record which of the one or more scan chain group outputs produces one or more error outputs during testing.

* * * * *